(12) United States Patent
Goodson et al.

(10) Patent No.: US 6,942,018 B2
(45) Date of Patent: Sep. 13, 2005

(54) ELECTROOSMOTIC MICROCHANNEL COOLING SYSTEM

(75) Inventors: Kenneth E. Goodson, Belmont, CA (US); Chuan-Hua Chen, Stanford, CA (US); David E. Huber, Mountain View, CA (US); Linan Jiang, Menlo Park, CA (US); Thomas W. Kenny, San Carlos, CA (US); Jae-Mo Koo, Stanford, CA (US); Daniel J. Laser, San Francisco, CA (US); James C. Mikkelsen, Los Altos, CA (US); Juan G. Santiago, Fremont, CA (US); Evelyn Ning-Yi Wang, Stanford, CA (US); Shulin Zeng, Sunnyvale, CA (US); Lian Zhang, Sunnyvale, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 455 days.

(21) Appl. No.: 10/053,859

(22) Filed: Jan. 19, 2002

(65) Prior Publication Data

US 2003/0062149 A1 Apr. 3, 2003

Related U.S. Application Data

(60) Provisional application No. 60/326,151, filed on Sep. 28, 2001.

(51) Int. Cl.$^7$ .................................................. F28F 7/00
(52) U.S. Cl. .............................. 165/80.4; 165/104.21; 165/104.33; 165/185; 361/700; 361/699; 174/15.1; 174/15.2; 257/714
(58) Field of Search ........................... 165/80.4, 104.21, 165/104.33, 185; 361/699, 700; 257/714–716; 174/15.2

(56) References Cited

U.S. PATENT DOCUMENTS

| | | | |
|---|---|---|---|
| 3,923,426 A | 12/1975 | THeeuwes | ..................... 417/48 |
| 4,009,423 A | 2/1977 | Wilson | ........................ 361/385 |
| 4,067,237 A | 1/1978 | Arcella | ........................... 73/204 |
| 4,120,019 A | 10/1978 | Arii et al. | .................... 361/385 |
| 4,151,548 A | 4/1979 | Klein et al. | .................... 357/82 |

(Continued)

FOREIGN PATENT DOCUMENTS

CN          97212126.9         7/1998       ........... B01D/61/42

OTHER PUBLICATIONS

"Micro–heat exchangers", Weisberg, et al., American Society of Mechanical Engineers, Dynamic Systems and Control Division, DSC, 1990, v. 19, p. 159–17.

(Continued)

Primary Examiner—Terrell L. Mckinnon
(74) Attorney, Agent, or Firm—Womble Carlyle, Sandridge & Rice, PLLC

(57) ABSTRACT

Apparatus and methods according to the present invention preferably utilize electroosmotic pumps that are capable of generating high pressure and flow without moving mechanical parts and the associated generation of unacceptable electrical and acoustic noise, as well as the associated reduction in reliability. These electroosmotic pumps are preferably fabricated with materials and structures that improve performance, efficiency, and reduce weight and manufacturing cost relative to presently available micropumps. These electroosmotic pumps also preferably allow for recapture of evolved gases and deposited materials, which may provide for long-term closed-loop operation. Apparatus and methods according to the present invention also allow active regulation of the temperature of the device through electrical control of the flow through the pump and can utilize multiple cooling loops to allow independent regulation of the special and temporal characteristics of the device temperature profiles. Novel microchannel structures are also described.

89 Claims, 30 Drawing Sheets

U.S. PATENT DOCUMENTS

| | | | |
|---|---|---|---|
| 4,312,012 A | 1/1982 | Frieser et al. | 357/82 |
| 4,392,362 A * | 7/1983 | Little | 62/51.1 |
| 4,450,472 A | 5/1984 | Tuckerman et al. | 357/82 |
| 4,516,632 A | 5/1985 | Swift et al. | 165/167 |
| 4,561,632 A | 12/1985 | Eastman et al. | 361/385 |
| 4,567,505 A | 1/1986 | Pease et al. | 357/81 |
| 4,573,067 A | 2/1986 | Tuckerman et al. | 357/82 |
| 4,638,854 A | 1/1987 | Noren | 165/76 |
| 4,675,783 A | 6/1987 | Murase et al. | 361/385 |
| 4,697,427 A | 10/1987 | Niggemann et al. | 62/119 |
| 4,758,926 A | 7/1988 | Herrell et al. | 361/385 |
| 4,829,432 A | 5/1989 | Hershberger et al. | 361/424 |
| 4,858,093 A | 8/1989 | Sturgeon | 363/20 |
| 4,868,712 A | 9/1989 | Woodman | 361/388 |
| 4,894,709 A | 1/1990 | Phillips et al. | 357/82 |
| 4,908,112 A | 3/1990 | Pace | 204/299 |
| 4,938,280 A | 7/1990 | Clark | 165/80.4 |
| 4,951,740 A | 8/1990 | Peterson et al. | 165/32 |
| 4,975,825 A | 12/1990 | Huss et al. | 363/141 |
| 5,010,292 A | 4/1991 | Lyle, Jr. | 323/274 |
| 5,016,138 A | 5/1991 | Woodman | 361/381 |
| 5,057,908 A | 10/1991 | Weber | 357/81 |
| 5,070,040 A | 12/1991 | Pankove | 437/209 |
| 5,083,194 A | 1/1992 | Bartilson | 357/81 |
| 5,096,388 A | 3/1992 | Weinberg | 417/322 |
| 5,099,311 A | 3/1992 | Bonde et al. | 357/82 |
| 5,099,910 A * | 3/1992 | Walpole et al. | 165/80.4 |
| 5,125,451 A | 6/1992 | Matthews | 165/80.4 |
| 5,131,233 A | 7/1992 | Cray et al. | 62/64 |
| 5,131,859 A | 7/1992 | Bowen et al. | 439/194 |
| 5,144,531 A | 9/1992 | Go et al. | 361/382 |
| 5,162,974 A | 11/1992 | Currie | 361/385 |
| 5,199,165 A | 4/1993 | Crawford et al. | 29/846 |
| 5,203,401 A | 4/1993 | Hamburgen et al. | 165/80.4 |
| 5,216,580 A | 6/1993 | Davidson et al. | 361/385 |
| 5,218,515 A | 6/1993 | Bernhardt | 361/385 |
| 5,219,278 A | 6/1993 | van Lintel | 417/413 |
| 5,229,915 A | 7/1993 | Ishibashi et al. | 361/385 |
| 5,230,564 A | 7/1993 | Bartilson et al. | 374/178 |
| 5,232,047 A | 8/1993 | Matthews | 165/168 |
| 5,239,200 A | 8/1993 | Messina et al. | 257/714 |
| 5,263,251 A | 11/1993 | Matthews | 29/840.036 |
| 5,274,920 A | 1/1994 | Matthews | 29/890.039 |
| 5,281,026 A | 1/1994 | Bartilson et al. | 374/143 |
| 5,309,319 A | 5/1994 | Messina | 361/699 |
| 5,311,397 A | 5/1994 | Harshberger et al. | 361/683 |
| 5,313,099 A | 5/1994 | Tata et al. | 287/717 |
| 5,317,805 A | 6/1994 | Hoopman et al. | 29/890.03 |
| 5,325,265 A | 6/1994 | Turlik et al. | 361/702 |
| 5,336,062 A | 8/1994 | Richter | 417/413 |
| 5,339,214 A | 8/1994 | Nelson | 361/695 |
| 5,365,749 A | 11/1994 | Porter | 62/259.2 |
| 5,383,340 A | 1/1995 | Larson et al. | 62/259.2 |
| 5,427,174 A | 6/1995 | Lomolino, Sr. et al. | 165/1 |
| 5,436,793 A | 7/1995 | Sanwo et al. | 361/689 |
| 5,459,099 A | 10/1995 | Hsu | 437/180 |
| 5,461,541 A | 10/1995 | Wentland, Jr. et al. | 361/707 |
| 5,471,850 A | 12/1995 | Cowans | 62/223 |
| 5,504,650 A | 4/1996 | Katsui et al. | 361/697 |
| 5,504,924 A | 4/1996 | Ohashi et al. | 375/800 |
| 5,508,234 A | 4/1996 | Dusablon, Sr. et al. | 437/228 |
| 5,508,908 A | 4/1996 | Kazama et al. | 363/141 |
| 5,513,070 A | 4/1996 | Xie et al. | 361/700 |
| 5,514,832 A | 5/1996 | Dusablon, Sr. et al. | 174/15.1 |
| 5,514,906 A | 5/1996 | Love et al. | 257/712 |
| 5,544,412 A | 8/1996 | Romero et al. | 29/832 |
| 5,560,423 A | 10/1996 | Larson et al. | 165/104.26 |
| 5,565,705 A | 10/1996 | Romero et al. | 257/718 |
| 5,575,929 A | 11/1996 | Yu et al. | 216/10 |
| 5,579,827 A | 12/1996 | Chung | 165/80.3 |
| 5,598,320 A | 1/1997 | Toedtman et al. | 361/687 |
| 5,608,262 A | 3/1997 | Degani et al. | 257/723 |
| 5,621,635 A | 4/1997 | Takiar | 363/141 |
| 5,641,400 A | 6/1997 | Kaltenbach et al. | 210/198.2 |
| 5,646,828 A | 7/1997 | Degani et al. | 361/715 |
| 5,692,558 A | 12/1997 | Hamilton et al. | 165/80.4 |
| 5,696,405 A | 12/1997 | Weld | 257/714 |
| 5,703,536 A | 12/1997 | Davis et al. | 330/289 |
| 5,704,416 A | 1/1998 | Larson et al. | 165/104.33 |
| 5,727,618 A * | 3/1998 | Mundinger et al. | 165/80.4 |
| 5,759,014 A | 6/1998 | Van Lintel | 417/413.3 |
| 5,763,951 A | 6/1998 | Hamilton et al. | 257/714 |
| 5,774,779 A | 6/1998 | Tuchinskiy | 419/2 |
| 5,801,442 A | 9/1998 | Hamilton et al. | 257/714 |
| 5,835,345 A | 11/1998 | Staskus et al. | 361/699 |
| 5,836,750 A | 11/1998 | Cabuz | 417/322 |
| 5,858,188 A | 1/1999 | Soane et al. | 204/454 |
| 5,863,708 A | 1/1999 | Zanzucchi et al. | 430/320 |
| 5,869,894 A | 2/1999 | Degani et al. | 257/723 |
| 5,870,823 A | 2/1999 | Bezama et al. | 29/848 |
| 5,880,071 A | 3/1999 | Parce et al. | 204/453 |
| 5,880,524 A | 3/1999 | Xie | 257/704 |
| 5,901,037 A * | 5/1999 | Hamilton et al. | 361/699 |
| 5,901,040 A | 5/1999 | Cromwell et al. | 361/704 |
| 5,940,240 A | 8/1999 | Kupferman | 361/699 |
| 5,942,093 A | 8/1999 | Rakestraw et al. | 204/450 |
| 5,965,001 A | 10/1999 | Chow et al. | 204/600 |
| 5,965,813 A | 10/1999 | Wan et al. | 73/204.26 |
| 5,978,220 A | 11/1999 | Frey et al. | 361/699 |
| 5,997,713 A | 12/1999 | Beetz, Jr. et al. | 205/124 |
| 5,998,240 A * | 12/1999 | Hamilton et al. | 438/122 |
| 6,007,309 A | 12/1999 | Hartley | 417/322 |
| 6,010,316 A | 1/2000 | Haller et al. | 417/322 |
| 6,013,164 A | 1/2000 | Paul et al. | 204/450 |
| 6,019,165 A * | 2/2000 | Batchelder | 165/80.3 |
| 6,019,882 A | 2/2000 | Paul et al. | 204/450 |
| 6,025,208 A | 2/2000 | Chui et al. | 438/50 |
| 6,034,425 A | 3/2000 | Chiang et al. | 257/697 |
| 6,034,872 A * | 3/2000 | Chrysler et al. | 361/699 |
| 6,052,287 A | 4/2000 | Palmer et al. | 361/767 |
| 6,054,034 A | 4/2000 | Soane et al. | 204/601 |
| 6,068,752 A | 5/2000 | Dubrow et al. | 204/604 |
| 6,090,251 A | 7/2000 | Sundberg et al. | 204/453 |
| 6,096,656 A | 8/2000 | Matzke et al. | 438/702 |
| 6,100,541 A | 8/2000 | Nagle et al. | 250/573 |
| 6,101,715 A | 8/2000 | Fuesser et al. | 29/890.03 |
| 6,121,682 A | 9/2000 | Kim | 257/723 |
| 6,127,726 A | 10/2000 | Bright et al. | 257/691 |
| 6,129,145 A | 10/2000 | Yamamoto et al. | 165/168 |
| 6,133,631 A | 10/2000 | Belady | 257/714 |
| 6,137,693 A | 10/2000 | Schwiebert et al. | 361/803 |
| 6,146,103 A | 11/2000 | Lee et al. | 417/50 |
| 6,154,363 A | 11/2000 | Chang | 361/699 |
| 6,154,370 A | 11/2000 | Degani et al. | 361/761 |
| 6,171,067 B1 | 1/2001 | Parce | 417/48 |
| 6,174,675 B1 | 1/2001 | Chow et al. | 435/6 |
| 6,176,962 B1 | 1/2001 | Soane et al. | 156/292 |
| 6,186,660 B1 | 2/2001 | Kopf-Still et al. | 366/340 |
| 6,191,945 B1 | 2/2001 | Belady et al. | 361/704 |
| 6,201,302 B1 | 3/2001 | Tzu | 257/724 |
| 6,204,562 B1 | 3/2001 | Ho et al. | 257/777 |
| 6,210,986 B1 | 4/2001 | Arnold et al. | 438/42 |
| 6,215,193 B1 | 4/2001 | Tao et al. | 257/777 |
| 6,216,343 B1 | 4/2001 | Leland et al. | 29/890.032 |
| 6,221,226 B1 | 4/2001 | Kopf-Sill | 204/602 |
| 6,227,809 B1 | 5/2001 | Forster et al. | 417/53 |
| 6,234,240 B1 | 5/2001 | Cheon | 165/80.3 |
| 6,238,538 B1 | 5/2001 | Parce et al. | 204/600 |
| 6,268,660 B1 | 7/2001 | Dhong et al. | 257/774 |
| 6,277,257 B1 | 8/2001 | Paul et al. | 204/450 |
| 6,278,190 B1 | 8/2001 | Tomita | 257/777 |

| | | | |
|---|---|---|---|
| 6,285,550 B1 | | 9/2001 | Belady ........................ 361/704 |
| 6,287,440 B1 | | 9/2001 | Arnold et al. ............... 204/450 |
| 6,297,551 B1 | | 10/2001 | Dudderar et al. ........... 257/723 |
| 6,301,109 B1 | * | 10/2001 | Chu et al. .................... 361/690 |
| 6,313,992 B1 | | 11/2001 | Hildebrandt ................ 361/700 |
| 6,321,791 B1 | | 11/2001 | Chow ......................... 137/833 |
| 6,322,753 B1 | | 11/2001 | Lindberg et al. ............. 422/192 |
| 6,324,058 B1 | | 11/2001 | Hsiao .......................... 361/699 |
| 6,335,566 B1 | | 1/2002 | Hirashima et al. ........... 257/686 |
| 6,337,794 B1 | | 1/2002 | Agonafer et al. ............ 361/690 |
| 6,344,682 B1 | | 2/2002 | Tomita ........................ 257/686 |
| 6,351,384 B1 | | 2/2002 | Daikoku et al. ............. 361/704 |
| 6,415,860 B1 | * | 7/2002 | Kelly et al. .................. 165/148 |
| 6,437,981 B1 | * | 8/2002 | Newton et al. .............. 361/700 |
| 6,457,515 B1 | * | 10/2002 | Vafai et al. ................. 165/80.4 |
| 6,572,830 B1 | * | 6/2003 | Burdon et al. .......... 422/186.29 |
| 6,631,077 B2 | * | 10/2003 | Zuo ............................ 361/699 |
| 2001/0016985 A1 | * | 8/2001 | Insley et al. ............ 29/890.039 |
| 2001/0017158 A1 | * | 8/2001 | Kamholz et al. ......... 137/251.1 |
| 2001/0024820 A1 | | 9/2001 | Mastromatteo et al. .. 435/287.2 |
| 2001/0044155 A1 | | 11/2001 | Paul et al. .................... 436/161 |
| 2001/0046703 A1 | | 11/2001 | Burns et al. ............. 435/303.1 |
| 2001/0055714 A1 | | 12/2001 | Cettour-Rose et al. ...... 429/122 |
| 2002/0011330 A1 | * | 1/2002 | Insley et al. ................. 165/133 |
| 2003/0027022 A1 | * | 2/2003 | Arana et al. ................... 429/17 |
| 2003/0175947 A1 | * | 9/2003 | Liu et al. .................. 435/288.5 |
| 2003/0190608 A1 | * | 10/2003 | Blackburn ..................... 435/5 |
| 2004/0120827 A1 | * | 6/2004 | Kim et al. ..................... 417/48 |

OTHER PUBLICATIONS

"Manufacturing and testing of compact micro heat exchangers with high volumetric heat transfer coefficients", Bier, et al.. American Society of Mechanical Engineers, Dynamic Systems and Control Division, DSC, 1990, v19, p. 189–197.

"Design and fabrication of a cross flow micro heat exchanger". Harris et al., Journal of Microelectromechanical Systems; Dec. 2000; v.9. No. 4, p. 502–508.

"Two–phase electronic cooling using mini–channel and micro–channel heat sinks: Part I design criteria and heat diffusion constraints", Bowers. et al., Transactions of the ASME. Dec. 1994, v.116. p. 290–297.

"Active control of electroosmotic flow in microchannels using light", Moorthy et al., Sensors and Actuators, B: Chemical; May 15, 2001; v.75, No. 3, p. 223–229.

"Irrotationality of uniform electroosmosis", Cummings et al., Proceedings of SPIE—International Society for Optical Engineering; 1999; v.3877, p. 180–189.

Bibliography of liquid cooled heat sinks for thermal enhancement of electronic packages, Shaukatul I ah, IEEE Semiconductor Thermal Measurement and Management Symposium, 1999, p. 231–245.

"Transient temperature performance of an integrated micro-thermal system", Jiang, et al., Journal of Micromechanics and Microengineering, Sep. 2000, v.10, p. 466–476.

"Phase change in microchannel heat sinks with integrated temperature sensors", .Jiang. et al., Journal of Microelectromechanical Systems, 1999, v.8. No. 4, p. 358–365.

"Electroosmotic pumping and electrophoretic separations for miniaturized chemical analysis systems", Manz. et al., j. Micromech.. Microeng., 1994, p. 257–265.

"Micro Channel Heat Exchanger for Cooling Electrical Equipment," Kawano, et al., American Society of Mechanical Engineers, Heat Transfer Division, (Publication) HTD; 1998; v. 361–3, p. 173–180.

"Experimental Study on an Enhanced Microchannel Heat Sink for Microelectronics Applications,", Keska, et al., American Society of Mechanical Engineers, EEP; 1999, v. 26(2), p. 1235–1259.

"High Performance Forced Air Cooling Scheme Employing Microchannel Heat Exchangers," Kleiner, et al., IEEE Transactions on Components, Packaging, and Manufacturing Tech., Part A, Dec. 1995; v. 18, No. 4, p. 795–804.

"Optimal Thermal Design of Air Cooled Forced Convection Finned Heat Sinks, Experimental Verification," Knight, et al., Conference: Intersociety Conference on Thermal Phenomena in Electronic Systems—I–Therm '92, 2/5—8/92, Austin, TX.

"Convection Cooling of Microelectronic Chips," Konecni, et al., Conference: Intersociety Conference on Thermal Phenomena in Electronic Systems—I–Therm '92, 2/5—8/92, Austin, Texas.

"Heat Transfer of Microstructures for Integrated Circuits," Koh, et al. International Communications in Heat and Mass Transfer; Jan.–Feb. 1986; vol. 13, No. 1, p. 89–98.

"Convection Cooling of Microelectronic Chips," Konecni, et al., Conference: Intersociety Conference on Thermal Phenomena in Electronic Systems—I–Therm '92, 2/5—8/92, Austin, Texas.

"Modeling of Two–Phase Microchanel Heat Sinks for VLSI Chips," Koo, et al., Proceedings of the IEEE Micro Electro Mechanical Systems (MEMS); 2001; p. 422–426.

"Simulation of Micro–Channel Heat Sinks for Optoelectronic Microsystems," Kreutz, et al., Microelectronics Journal; Oct. 2000; vol. 31, No. 9, p. 787–790.

"Fabrication of Very Smooth Walls and Bottoms of Silicon Microchannels for Heat Dissipation of Semiconductor Devices," Dwivedi, et al., Microelectronics Journal; 2000; vol. 31, No. 6, p. 405–410.

"Silicon Micromachining and Micromachines," Esashi, Wear; Sep. 1, 1993; vol. 168 No. 1–2, p. 181–187.

"Silicon Micromachining for Integrated Microsystems," Esashi, Vacuum; Jun.–Aug. 1996, vol. 47, No. 6–8 pp. 469–474.

"Experimental evaluation of micro heat exchangers fabricated in silicon", Kuan, American Society of Mechanical Engineers, Heat Transfer Division, (Publication) HTD; 1996; vol. 331, p. 131–136.

"Flow characteristics of water through a microchannel between two parallel plates with electrokinetic effects", Mala et al., International Journal of Heat and Fluid Flow; Oct. 1997; vol. 18, No. 5, p. 489–496.

"Integrated electroosmotic pumps and flow manifolds for total chemical analysis systems", Manz et al., Conference: 1991 International Conference on Solid–State Sensors and Actuators, Jun. 24–28, 1991, San Francisco, CA, USA.

"Heat transfer and fluid flow in microchannels", Mala et al., International Journal of Heat and Mass Transfer; Sep. 1997; v.40, No. 13, p. 3079–3088.

"Enhancement of Multichip Modules (MCMs) cooling by incorporating microheatpipes and other high thermal conductivity materials into microchannel heat sinks", Marongiu et al., Proceedings—Electronic Components and Technology Conference; 1998; p. 45–50.

"Integrated electroosmotic pump and flow manifolds for total chemical analysis system", Manz et al., Conference: 1991 International Conference on Solid–State Sensors and Actuators, Jun. 24–28, 1991, San Francisco, CA, USA.

"Electroosmotically induced hydraulic pumping with integrated electrodes on microfluidic devices", McKnight et al., Analytical Chemistry; Aug. 15, 2001; vol. 73, No. 16, p. 4045–4049.

"Partial electroosmotic pumping in complex capillary systems. Part 1: Principles and general theoretical approach", Morf et al., Sensors and Actuators, B: Chemical; Feb. 2001; vol. 72, No. 3, p. 266–272.

"High average power 2–D laser diode arrays on silicon microchannel collers", Mundinger et al., Conference: Conference on Lasers and Electro–Optics, Apr. 24–28, 1989, Baltimore, MD, USA.

"Parametric optimization of multichanneled heat sinks for VLSI chip cooling", Murakami et al., IEEE Transactions on Components and Packaging Technologies; Mar. 2001; vol. 24, No. 1, p. 2–9.

"Experimental investigation of heat transfer in flat plates with rectangular microchannels", Peng et al., International Journal of Heat and Mass Transfer; Jan. 1995; vol. 38, No. 1, p. 127–137.

"Forced convection and flow boiling heat transfer for liquid flowing through microchannels", Peng et al., International Journal of Heat and Mass Transfer; Sep. 1993; vol. 36, No. 14, p. 3421–3427.

"Enhancing the critical heat flux using microchanneled surfaces", Peng et al., Journal of Enhanced Heat Transfer; 1998; vol. 5, No. 3, p. 165–176.

"Cooling characteristics with microchannled structures", Peng et al., Journal of Enhanced Heat Transfer; 1994; vol. 1, No. 4, p. 315–326.

"Convective heat transfer and flow friction for water flow in microchannel structures", Peng et al., International Journal of Heat and Mass Transfer; Aug. 1996; vol. 39, No. 12, p. 2599–2608.

"Heat transfer characteristics of water flowing through microchannels", Peng et al., Experimental Heat Transfer; Oct.–Dec. 1994; vol. 7, No. 4, p. 265–283.

"Microchannel integrated heat sinks in silicon technology", Perret et al., Conference Record—IAS Annual Meeting (IEEE Industry Applications Society); 1998; vol. 2, p. 1051–1055.

"Performance of a MEMS based micro capillary pumped loop for chip–level temperature control", Pettigrew et al., Proceedings of the IEEE Micro Electro Mechanical Systems (MEMS); 2001; p. 427–430.

"Liquid transport in micron and submicron channels", Pfahler et al., Sensors and Actuators, A: Physical; 3 Pt3 1990; vol. 22, No. 1–3, p. 431–434.

"Experimental measurements of flow and heat transfer in microchannel cooling passages in a chip substrate", Rahman et al., American Society of Mechanical Engineers, EEP; 1993 vol. 4–2,p. 685–692.

"Flow rate measurement via conductivity monitoring in micro–fluidic devices", Rainey et al., Proceedings of SPIE—The International Society for Optical Engineering; 2000; vol. 4177, p. 185–193.

"Fabrication techniques to realize CMOS–compatible microfluidic microchannels", Rasmussen et al., Journal of Microelectromechanical Systems; Jun. 2001; vol. 10, No. 2, p. 286–297.

"Impact of channel geometry on two–phase flow heat transfer characteristics of refrigerants in microchannel heat exchangers", Ravigururajan, Journal of Heat Transfer, Transactions ASME; May 1998; vol. 120, No. 2, p. 485–491.

"Microchannel heat sinks for two–dimensional high–power–density diode laser arrays", Missaggia et al., IEEE Journal of Quantum Electronics; Sep. 1989; vol. 25, No. 9, p. 1988–1992.

"Liquid flow characteristics in a diamond–pattern micro–heat–exchanger", Ravigururajan et al., American Society of Mechanical Engineers, Dynamic Systems and Control Division (Publication) DSC; 1996; vol. 59, p. 159–166.

"Single–phase flow thermal performance characteristics of a parallel micro–channel heat exchanger", Ravigururajan et al., American Society of Mechanical Engineers, Heat Transfer Division, (Publication) HTD; 1996; vol. 329, No. 7, p. 157–166.

"Effect of heat flux on two–phase flow characteristics of refrigerant flows in a micro–channel heat exchanger", Ravigururajan et al., American Society of Mechanical Engineers, Heat Transfer Division, (Publication) HTD; 1996; vol. 329, No. 7, p. 167–178.

"Acousto–and electroosmotic microfluidic controllers", Rife et al., Proceedings of SPIE—The International Society for Optical Engineering; 1998; vol. 3515, p. 125–135.

"Liquid flow and heat transfer in microchannels: A review", Rostami et al., Heat and Technology; 2000; vol. 18, No. 2, p. 59–68.

"Very high heat flux microchannel heat exchanger for cooling of semiconductor laser diode arrays", Roy et al., IEEE Transactions on Components, Packaging, and Manufacturing Technology Part B: Advanced Packaging; May 1996; vol. 19, No. 2, p. 444–451.

"Convective heat transfer in microchannels", Samalam, Journal of Electronic Materials, vol. 18, pp. 611–617, 1989.

"Optimal structure for microgrooved cooling fin for high–power LSI devices", Sasaki, S.; Kishimoto, Electronics Letters; Dec. 4, 1986; vol. 22, No. 25, p. 1332–1334.

"Electroosmotic pumping and valveless control of fluid flow within a manifold of capillaries on a glass chip", Seiler, et al., Analytical Chemistry; Oct. 15, 1994; vol. 66, No. 20, p. 3485–3491.

"Micro heat spreader enhanced heat transfer in MCMs", Shen et al., Proceedings of the IEEE Multi–Chip Module Conference; Jan. 31, 1995; p. 189–194.

"Microflow devices and systems", Shoji et al., Journal of Micromechanics and Microengineering; Dec. 1994; vol. 4, No. 4, p. 157–171.

"Overview of fabrication methods and fluid flow and heat transfer characteristics of micro channels", Sunden et al., Conference: Second Baltic Heat Transfer Conference, Aug. 21–23, 1995, Jurmala, Latvia.

"Electrokinetic dewatering and thickening. I. Introduction and historical review of electrokinetic applications", Sunderland, J Appi Electrochem; Sep. 1987; vol. 17, No. 5, p. 889–898.

"High–performance heat sinking for VLSI", Tuckerman et al., IEEE Electron Device Left; May 1981; vol. EDL–2, No. 5, p. 126–129.

"Analysis of two–layered micro–channel heat sink concept in electronic cooling", Vafal et al., International Journal of Heat and Mass Transfer; Jun. 1999; vol. 42, No. 12, p. 2287–2297.

"Two–phase flow in microchannels", Stanley, et al., Microelectromechanical Systems (MEMS), DSC–vol. 62/HTD–vol. 254, p. 143–152.

"Experimental investigation on liquid forced–convection heat transfer through microchannels", Wang et al., International Journal of Heat and Mass Transfer; Mar. 1994; vol. 37, No. Suppl. 1, p. 73–82.

"Analysis of microchannels for integrated cooling", Weisberg et al., International Journal of Heat and Mass Transfer; Oct. 1992; vol. 35, No. 10, p. 2465–2474.

"Micro fluidic system of micro channels with on–site sensors by silicon bulk micromachining", Yang et al., Proceedings of SPIE—The International Society for Optical Engineering; 1999; vol. 3877, p. 267–272.

"Modeling forced liquid convection in rectangular microchannels with electrokinetic effects", Yang et al., International Journal of Heat and Mass Transfer; Dec. 1998; vol. 41, No. 24, p. 4229–4249.

"Uniform channel micro heat exchangers", Yin et al, Journal of Electronic Packaging, Transactions of the ASME; Jun. 1997; vol. 119, No. 2, p. 89–93.

"Fabrication, Derivatization and Applications of Plastic Microfluidic Devices", Barker, et al., Proceedings of SPIE—The International Society for Optical Engineering, Nov. 2000, vol. 4205, p. 112–118.

"Experimental and theoretical investigation of fluid flow and heat transfer in microtubes", Yu et al., ASME/JSME Thermal Engineering Joint Conference—Proceedings; 1995; vol. 1, p. 523–530.

"Fabrication and characterization of electrokinetic micro pumps", Zeng et al., Thermomechanical Phenomena in Electronic Systems—Proceedings of the Intersociety Conference; 2000; vol. 2, p. 31–36.

"Experimental study on local heat transfer with liquid impingement flow in two–dimensional microchannels", Zhuang et al., International Journal of Heat and Mass Transfer, Oct. 1997, vol. 40, No. 17, p. 4055–4059.

"Heat out of small packages", Joshi, Mechanical Engineering, Dec. 2001, p. 56–58.

"Heat Exchange Element for Semiconductor Device Cooling", Edmonds, et al., IBM Technical Disclosure Bulletin, Aug. 1980, vol. 23, No. 3, p. 1057.

"Liquid Cooling of Integrated Circuit Chips", Anacker, IBM Technical Disclosure Bulletin, Feb. 1978, vol. 20, No. 9, p. 3742–3743.

"Heat transfer from silicon chips and wafers", Noth, IBM Technical Disclosure Bulletin, May 1975, vol. 17, No. 12, p. 3544.

"Forced boiling cooling system with jet enhancement for critical heat flux extension", IBM Technical Disclosure Bulletin, Oct. 1996, vol. 39, No. 10, p. 143.

"Miniature heat exchanger for corrosive media", IBM Technical Disclosure Bulletin, Jan. 1995, vol. 38, No. 01, p. 55–56.

"Self–contained active heat dissipation device", IBM Technical Disclosure Bulletin, Apr. 1996, vol. 39, No. 04, p. 115–116.

"Liquid jet cooling of integrated circuit chips", Sachar, IBM Technical Disclosure Bulletin, Feb. 1978, vol. 20, No. 9, p. 3727–3728.

"Centerless ceramic package with directly connected heat sink", Ronkese, IBM Technical Disclosure Bulletin, Feb. 1978, vol. 20, No. 9, p. 3577–3578.

"Jet cooling cup for cooling semiconductor devices", Keller, et al., IBM Technical Disclosure Bulletin, Feb. 1978, vol. 20, No. 9, p. 3575–3576.

"Device cooling", Johnson, IBM Technical Disclosure Bulletin, Mar. 1978, vol. 20, No. 10, p. 3919–3920.

"Integrated circuit module package cooling structure", Pascuzzo, et al., IBM Technical Disclosure Bulletin, Mar. 1978, vol. 20, No. 10, p. 3898–3899.

"Integrated module heat exchanger", Antonetti, et al., IBM Technical Disclosure Bulletin, Apr. 1978, vol. 20, No. 11A, p. 4498.

"Temperature triggerable fluid coupling system for cooling semiconductor dies", Dorler, et al., IBM Technical Disclosure Bulletin, Apr. 1978, vol. 20, No. 11A, p. 4386–4388.

"Flexible thermal conductor for electronic module", Durand, et al., IBM Technical Disclosure Bulletin, Apr. 1978, vol. 20, No. 1 1A, p. 4343.

"Liquid cooling of a multichip module package", Balderes, et al., IBM Technical Disclosure Bulletin, Apr. 1978, vol. 20, No. 11A, p. 4336–4337.

"Conduction cooling module", Hwang, et al. IBM Technical Disclosure Bulletin, Apr. 1978, vol. 20, No. 1 1A, p. 4334–4335.

"Electronic packaging structure", Arnold, et al., IBM Technical Disclosure Bulletin, Apr. 1978, vol. 20, No. 11B, p. 4820–4822.

"High performance package for memory", Doo, et al., IBM Technical Disclosure Bulletin, Jul. 1978, vol. 21, No. 2, p. 585–586.

"Multi–chip package with cooling by a spreader plate in contact with a chip having cylindrical holes mating with an inverse frame providing water flow within its pins", IBM Technical Disclosure Bulletin, Oct. 1988, vol. 31, No. 5, p. 141–142.

"Cooling system for semiconductor chips", Landrock, et al., IBM Technical Disclosure Bulletin, Sep. 1980, vol. 23, No. 4, p. 1483.

"Chip cooling", Krumm, IBM Technical Disclosure Bulletin, Dec. 1977, vol. 20, No. 7, p. 2728.

"Convection cooling apparatus", Damm, IBM Technical Bulletin, Dec. 1977, vol. 20, No. 7, p. 2755–2756.

"TCM–like circuit module with local heat sink resting on chip and chip separated from coolant by bellows with pins and deflector plate attached to local heat sink and extending above bellows into region_of coolant flow", IBM Technical Disclosure Bulletin, Apr. 1989, vol. 31, No. 11, p. 305–306.

"Circuit module cooling with multiple pistons contacting a heat spreader/electrical buffer plate in contact with chip", IBM Technical Disclosure Bulletin, May 1989, vol. 31, No. 12, p. 5–7.

"Circuit package with circulating boiling liquid and local heat exchanger to limit vapor in coolant outlet", IBM Technical Disclosure Bulletin, May 1989, vol. 31, No. 12, p. 34.

"Water–cooled circuit module with grooves forming water passages near heat–producing devices", IBM Technical Disclosure Bulletin, May 1989, vol. 31, No. 12, p. 49–50.

"Cold plate for thermal conduction module with only peripheral mounting bolts, large surface area fin inserts and reduced water flow and thermal resistances", IBM Technical Disclosure Bulletin, May 1989, vol. 31, No. 12, p. 59.

"Thermal control hardware for accelerated run–in testing of multi–chip modules", IBM Technical Disclosure Bulletin, Oct. 1989, vol. 32, No. 5A, p. 129–130.

"Means of removing more heat from a TCM (or other liquid–cooled logic package) by reducing the coolant temperature", IBM Technical Disclosure Bulletin, Oct. 1989, vol. 32, No. 5A, p. 153–154.

"Liquid cooled module with compliant membrane", Loeffel, et al., IBM Technical Disclosure Bulletin, Jul. 1977, vol. 20, No. 2, p. 673–574.

"Method of effective cooling of a high power silicon chip", Doo, et al., IBM Technical Disclosure Bulletin, Sep. 1977, vol. 20, No. 4, p. 1436–1437.

"Semiconductor chip cooling package", Doo, et al., IBM Technical Disclosure Bulletin, Sep. 1977, vol. 20, No. 4, p. 1440–1441.

"Pin fin array heat pipe apparatus", IBM Technical Disclosure Bulletin, Sep. 1994, vol. 37, No. 09, p. 171.

"Heat sink fabrication method", IBM Technical Disclosure Bulletin, Mar. 1985, vol. 27, No. 10A, p. 5656–5657.

"Thermal conduction module with liquid dielectric and pistons with surface treatment for enhanced nucleate boiling", IBM Technical Disclosure Bulletin, May 1985, vol. 27, No. 12, p. 6904.

"Etched silicon integrated circuit heat sink", Brady, et al., IBM Technical Disclosure Bulletin, Jun. 1984, vol. 27, No. IB, p. 627.

"Thermoelectrically cooled module", Skobern, IBM Technical Disclosure Bulletin, Jun. 1984, vol. 27, No. 1A, p. 30.

"Heat–pipe vapor cooling etched silicon structure", Eldridge, et al., IBM Technical Disclosure Bulletin, Jan. 1983, vol. 25, No. 8, p. 4118–4119.

"Silicon heat sink for semiconductor ship", Chu, et al., IBM Technical Disclosure Bulletin, Apr. 1982, vol. 24, No. 11A, p. 5743.

"Data processor cooling with connection to maintain flow through standby pump", Goodman, IBM Technical Disclosure Bulletin, Dec. 1983, vol. 26, No. 7A, p. 3325.

"Cooling system for data processor with flow restricter in secondary loop to limit bypass–cooling water flow", Gallagher, et al., IBM Technical Disclosure Bulletin, Oct. 1983, vol. 26, No. 5, p. 2658.

"Cold plate for thermal conduction module with improved flow pattern and flexible base", Hwang, et al., IBM Technical Disclosure Bulletin, Feb. 1983, vol. 25, No. 9, p. 4517.

"Structure for the removal of heat from an integrated circuit module", Arnold, IBM Technical Disclosure Bulletin, Nov. 1979, vol. 22, No. 6, p. 2294–2296.

"Heta sink design for cooling modules in a forced air environment", Arnold, et al., IBM Technical Disclosure Bulletin, Nov. 1979 vol. 22, No. 6, p. 2297–2298.

"Distributed power/thermal control", Chrisfield, et al, IBM Technical Disclosure Bulletin, Aug. 1979, vol. 22, No. 3, p. 1131–1132.

"Liquid–filled bellows heat sink", Kleinfelder, et al., IBM Technical Disclosure Bulletin, Mar. 1979, vol. 21, No. 10, p. 4125–4126.

"Cooling device for controlled rectifier", Bailey et al., IBM Technical Disclosure Bulletin, Apr. 1979, vol. 21, No. 11, p. 4609–4610.

"Silicon heat sink method to control integrated circuit chip operating temperatures", Ahearn, et al., IBM Technical Disclosure Bulletin, Jan. 1979, vol. 21, No. 8, p. 3378–3380.

"Chip cooling device", IBM Technical Disclosure Bulletin, Feb. 1988, vol. 30, No. 9, p. 435–436.

"Cooling system for chip carrier on card", IBM Technical Disclosure Bulletin, Sep. 1988, vol. 31, No. 4, p. 39–40.

"Piping system with valves controlled by processor for beating circuit modules in a selected temperature profile for sealing integrity test under temperature stress", IBM Technical Disclosure Bulletin, Oct. 1987, vol. 30, No. 5, p. 336.

"Circuit module cooling with coaxial bellows providing inlet, outlet and redundant connections to water–cooled element", IBM Technical Disclosure Bulletin, Oct. 1987, vol. 30, No. 5, p. 345–347.

"Cold plate for thermal conduction module with inlet for cooling water near highest power chips", IBM Technical Disclosure Bulletin, Oct. 1987, vol. 30, No. 5, p. 413.

"Heat exchanger modules for data processor with valves operated by pressure from cooling water pump", IBM Technical Disclosure Bulletin, Oct. 1987, vol. 30, No. 5, p. 419.

"Enhanced cooling of thermal conduction module", IBM Technical Disclosure Bulletin, Oct. 1987, vol. 30, No. 5, p. 426.

"Integrally grooved semiconductor chip and heat sink", IBM Technical Disclosure Bulletin, Oc.t 1971, vol. 14, No. 5, p. 1425.

"Structure for cooling by nucleate boiling", Riseman, IBM Technical Disclosure Bulletin, Apr. 1976, vol. 18, No. 11, p. 3700.

"Process for nucleate boiling enhancement", Chu, et al., IBM Technical Disclosure Bulletin, Dec. 1975, vol. 18, No. 7, p. 2227.

"Electroerosion micropump", IBM Technical Disclosure Bulletin, May 1990, vol. 32, No. 12, p. 342–343.

"Thin heat pipe for cooling components on printed circuit boards", IBM Technical Disclosure Bulletin, Dec. 1991, vol. 34, No. 7B, p. 321–322.

"A heat transfer enhancement method for forced convection bonded–fin heatsinks", Waldvogel, Motorola Technical Developments, Dec. 1997, p. 158–159.

"Aluminum silicon carbide phase change heat spreader", Waidvogel, Motorola Technical Developments, Jun. 1999, p. 226–230.

"An idea for maintaining a stable thermal environment for electronic devices", Slupe, et al., Research Disclosure, Aug. 2001, p. 13 12.

"Autonomous displacement of a solution in a microchannel by another solution", Research Disclosure, Jun. 2001, p. 1046.

"Thermal ink jet print head carriage with integral liquid cooling capabilities", Barner, et al., Xerox Disclosure Journal, Feb. 1996, vol. 21, No. 1, p. 33–34.

"Semiconductor laser body heat sink", Tramontana, Xerox Disclosure Journal, Dec. 1985, vol. 10, No. 6, p379–381.

"Heat generation and transport in sub–micron semiconductor devices", Fushinobu et al., American Society of Mechanical Engineers, Heat Transfer Division, (Publication) HTD; 1993; vol. 253, p. 21–28.

"Integrated micro heat sink for power multichip module", Gillot et al., IEEE Transactions on Industry Applications; Jan.–Feb. 2000; vol. 36, No. 1, p. 217–221.

"Integrated single and two–phase micro heat sinks under IGBT chips", Gillot et al., IEEE Transactions on Components and Packaging Technologies: 1999; vol. 22, No. 3, p. 384–389.

"Microchannel heat exchangers: a review", Goodling, Proceedings of SPIE—The International Society for Optical Engineering; 1993; vol. 1997, p. 66–82.

"Partial electroosmotic pumping in complex capillary systems. Part 2: Fabrication and application of a micro total analysis system suited for continuous volumetric nanotitrations", Guenat et al., Sensors and Actuators, B: Chemical; Feb. 2001; vol. 72, No. 3, p. 273–282.

"Micro–channel heat exchanger optimization", Harpole et al., Proceedings—IEEE Semiconductor Thermal and Temperature Measurement Symposium; Feb. 1991; p. 59–63.

"Design and fabrication of a cross flow micro heat exchanger", Harris et al., Journal of Microelectromechanical Systems; Dec. 2000; vol. 9, No. 4, p. 502–508.

"Electroosmotic pumping within a chemical sensor system integrated on silicon", Harrison et al., Conference: 1991 International Conference on Solid–State Sensors and Actuators, Jun. 24–28, 1991, San Francisco, CA, USA.

"Nonuniform temperature distribution in electronic devices cooled by flow in parallel microchannels", Hetsroni et al., IEEE Transactions on Components and Packaging Technologies; Mar. 2001; vol. 24, No. 1, p. 16–23.

"Fused quartz substrates for microchip electrophoresis", Jacobson et al., Analytical Chemistry; Jul. 1, 1995; vol. 67, No. 13, p. 2059–2063.

"Thermal–hydraulic performance of small scale microchannel and porous–media heat–exchangers", Jiang et al., International Journal of Heat and Mass Transfer; Mar. 2001; vol. 44, No. 5, p. 1039–1051.

"Fabrication and characterization of a microsystem for a micro–scale heat transfer study", Jiang et al., Journal of Micromechanics and Microengineering; Dec. 1999; vol. 9, No. 4, p. 422–428.

"Micro–channel heat sink with integrated temperature sensors for phase transition study", Jiang et al., Proceedings of the IEEE Micro Electro Mechanical Systems (MEMS); 1999; p. 159–164.

"Heat–transfer microstructures for integrated circuits", Tuckerman, Dissertation submitted to Dept. of Electrical Engineering, Stanford University, Feb. 1984.

"Micro heat exchangers fabricated by diamond machining", Friedrich, et al., Precision Engineering, vol. 16, No. 1, Jan. 1994, p. 56–59.

"Electroosniotic flow control in micro channels produced by scanning excimer laser ablation", Wagner et at, Proceedings of SPIE—The International Society for Optical Engineering; 2000; vol. 4088, p. 337–340.

"Thermal management in semiconductor device packaging", Mahalingam, Proceedings of the IEEE, vol. 73, No. 9, Sep. 1985, p. 1396–1404.

"Applicability of Traditional turbulent single–phase forced convection correlations to non–circular microchannels", Adams et al., International Journal of Heat and Mass Transfer, 1999; vol. 42, No. 23, p. 4411–4415.

"Experimental investigation of single–phase forced convection in microchannels", Adams et al., International Journal of Heat and Mass Transfer; Mar.–Apr. 1998; vol. 41, No. 6–7, p. 851–857.

"Liquid transport in rectangular microchannels by electroosmotic pumping", Arulanandam et al., Colloids and Surfaces A: Physicochemical and Engineering Aspects; 2000; vol. 161, No. 1, p. 89–102.

"Experimental results for low–temperature silicon micromachined micro heat pipe arrays using water and methanol as working fluids", Badran et al., Experimental Heat Transfer; Oct.–Dec. 1997; vol. 10, No. 4, p. 253–272.

"Optimization of conduits' shape in micro heat exchangers", Bau, International Journal of Heat and Mass Transfer; Sep. 1998; vol. 41 No. 18, p. 2717–2723.

"Modular microchannel coole heatsinks for high average power laser diode arrays", Beach et al., IEEE Journal of Quantum Electronics; Apr. 1992; vol. 28, No. 4, p. 966–976.

"Two–phase electronic cooling using mini–channel and micro–channel heat sinks: Part 2– flow rate and pressure drop constraints", Bowers et al., Journal of Electronic Packaging, Transactions of the ASME; Dec. 1994; vol. 116, No. 4, p. 298–305.

"High flux boiling in low flow rate, low pressure drop mini–channel and micro–channel heat sinks", Bowers et al., International Journal of Heat and Mass Transfer; Jan. 1994; vol. 37, No. 2, p321–332.

"Microflow devices for miniaturized chemical analysis systems", Buettgenbach et al., Proceedings of SPIE—The International Society for Optical Engineering; 1998; vol. 3539, p. 51–61.

"Fluid flow and heat transfer in microtubes", Choi et al., American Society of Mechanical Engineers, Dynamic Systems and Control Division (Publication) DSC; 1991; vol. 32, p. 123–134.

"Optimum design of microchannel heat sinks", Choquette et al., American Society of Mechanical Engineers, Dynamic Systems and Control Division (Publication) DSC; 1996; vol. 59, p. 115–126.

"Manifold microchannel heat sinks: Theory and experiment", Copeland et al., American Society of Mechanical Engineers, EEP; 1995; vol. 10–2, p. 829–835.

"Fabrication and testing of microchannel heat exchangers", Cuta et al, Proceedings of SPIE—The International Society for Optical Engineering; 1995; vol. 2640, p. 152–160.

"Forced convection heat transfer in parallel channel array microchannel heat exchanger", Cuta et al., American Society of Mechanical Engineers, Heat Transfer Division, (Publication) HTD; 1996; vol. 338, p. 17–23.

"Electroosmosis: A reliable fluid propulsion system for flow injection analysis", Dasgupta et al., Analytical Chemistry; Jun. 1, 1994; vol. 66, No. 11, p. 1792–1798.

"Micromachining of buried micro channels in silicon", de Boer et al., Journal of Microelectromechanical Systems; Mar. 2000; vol. 9, No. 1, p. 94–103.

"Forced convection boiling in a microchannel heat sink", Jiang et al., Journal of Microelectromechanical Systems; Mar. 2001; vol. 10, No. 1, p. 80–87.

"Laminar flow through microchannels used for microscale cooling systems", Jiang et al., Proceedings of the Electronic Technology Conference, EPTC; 1997; p. 119–122.

"Fabrication of monolithic microchanriels for IC chip cooling", Joo et al., Proceedings of the IEEE Micro Electro Mechanical Systems; 1995; p. 362–367.

"Performance test and analysis of silicon–based microchannel heat sink", Kang et al, Proceedings of SPIE—The International Society for Optical Engineering; 1999; vol. 3795, p. 259–270.

"Micro heat exchangers consisting of pin arrays", Yin, et al., Journal of Electronic Packaging, Mar. 1996, vol. 118, p. 51–57.

"Measurements of Heat Transfer in Microchannel Heat Sinks", Rahman, International Communications in Heat and Mass Transfer, May 2000, vol. 27, No. 4, p. 495–506.

"Enhancement of Critical Heat Flux From High Power Microelectronic Heat Sources in a Flow Channel", Mudawar, et al., Journal of Electronic Packaging, Sep. 1990, vol. 132, p. 241–248.

"Closed–Loop Electroosmotic Microchannel Cooling System for VLSI Circuits", Jiang, et al., printed in Journal of MEMS, Jan. 2002.

"Liquid Flows in Microchannels", Sharp et al., CRC Press, 2002, Chapter 6, p. 6-1 to 6–38.

"Fabrication and characterization of electrokinetic micro pump", Zeng, et al., 2000 Inter Society Conference on Thermal Phenomena, May 2000, p. 31–35.

"Thermal–hydraulic characteristic of micro heat exchangers", Wang, et al., American Society of Mechanical Engineers, Dynamic Systems and Control Division, DSC, 1991, vol. 32, p. 331–339.

"Electrokinetic Generation of High Pressures Using Porous Microstructures", Paul, et al., Micro–total analysis systems, 1998, Banff, Canada 1998, p. 49–52.

* cited by examiner (a)   (b)

ELECTROOSMOTIC MICROCHANNEL COOLING SYSTEM

This application is related to, claims priority of and expressly incorporates by reference herein U.S. application No. 60/326,151 filed Sep. 28, 2001. The inventions described herein were supported in part by DARPA/Air Force Contract F33615-99-C-1442.

FIELD OF THE INVENTION

This invention relates generally to removal of heat from heat generating devices. Specifically, this invention relates to removal of heat from integrated circuits, opto-electronic devices, power electronics, bioanalytical devices and any devices that dissipate or absorb sufficient heat so as to require specific means for heat removal.

BACKGROUND OF THE INVENTION

Electronic systems, including, for example, laptop, handheld and desktop computers as well as cell phones operate through the use of input electrical power. These have the characteristic that some of the input power is converted to heat, and the heat generated is typically concentrated in an identifiable area, such as an integrated circuit chip or a circuit board. Such devices and products incorporate heat sinks, fans, heat-pipes, refrigeration, and cooling water as needed to regulate their operating temperature within specific ranges.

It is predicted that electronic devices currently under development will generate heat at total rates and spatial densities exceeding the cooling capabilities of conventional heat sinking technology. For example, technology targets set by the semiconductor industry and summarized by the International Technology Roadmap for Semiconductors indicate the need to remove as much as 200W from the surface of a microprocessor before the year 2007. The trends towards higher total power and power density are similarly extreme in the optical telecommunications industry, the power electronics industry, and elsewhere. Conventional heat sinks are simply incapable of removing the targeted powers and power densities within a volume consistent with system design and market expectations.

This situation is exacerbated by targeted reductions of total system volume, which diminish the volume and surface area available for cooling devices. The interaction of these two trends (increasing head load and decreasing system volume) are recognized as a critical problem for the future of the semiconductor industry, and for other industries that rely on heat-generating or absorbing devices.

Conventional techniques for removing heat from devices include a number of well-established technologies.

Heat Sinks generally consist of metal plates with fins that transport heat from the device to the surrounding air by natural or forced convection. The heat sink fins serve to increase the area of contact between the device and the air, thereby increasing the efficiency of the heat transfer. Heat sinks of many materials, geometries, and constructions have been known for more than 50 years.

Fans consisting of rotating blades driven by electric motors can enhance the heat transfer between a heat sink and the surrounding air by causing the air to circulate around and through the heat sink with greater velocity than that which results from natural convection. Fans have been used for cooling systems for more than 30 years. Integration of fans with heat sinks for cooling of devices which generate large quantities of heat have been developed by many inventors, and are in wide use.

Heat pipes consist of a hollow tube which incorporates a wicking structure, and is partially filled with liquid. One end of the heat pipe is placed in contact with the heat-generating device. At this end of the heat pipe, the liquid evaporates, and vapor travels down the hollow center of the pipe to the other end. This end is placed into contact with a cold medium, or a heat sink, or is in contact with the surrounding air, and acts to cool the vapor in the center of the tube to the condensation temperature. This liquid, after condensation, is transported back to the hot end of the tube by capillary forces within the wicking structure. Heat pipes can offer significantly better heat conduction than solid metal rods of the same dimensions, and are widely used in many applications. Heat pipes are presently used for heat removal in electronic products, spacecraft, and a variety of other applications where heat generation in compact geometries is of interest. Heat pipes may be formed in many geometric structures, and may be integrated into the device package for efficient heat transport U.S. Pat. No. (5,216,580), or may be used to deliver heat some distance away through a flexible coupling U.S. Pat. No. (5,560,423). Vapor chambers closely resembles a heat pipe in operating principle and dimensions, but generally has a rectangular (rather than tubular) cross-sectional shape and can involve varying geometrical placements of the wicking structure. Both heat pipes and Vapor chambers are subject to the same basic physical limit for the peak power: The longer the separation between the heat source and the heat sink, and the smaller the cross sectional area, the smaller the total heat power that can be removed before these devices reach the capillary limit, or dry-out, condition.

Active cooling of a device via a vapor-compression cycle or by thermoelectric or other solid-state cooling devices is used in some high-performance thermal control applications, or where regulation at low temperatures is required. In these applications, the heat from the device is transported to the rejection surface, and significant excess heat is added due to the limited thermodynamic efficiency of the cooling mechanism. The rejection surface must generally be cooled by one of the other means described herein. Vapor-Compression refrigeration cycles have been used in many applications ranging from home air-conditioning and kitchen refrigeration to spacecraft and cryogenic systems for many years.

Cooling water is used in situations where large quantities of heat are generated, and the other methods described herein are unable to reject the heat to the surrounding air. In this case, a continuous supply of cool water is required, and this cool water is passed around or through the device or channels in an attached structure. Thereafter, the warmer water is returned to the waste water system.

In miniaturized applications employing cooling water techniques exist which address the problem of miniaturized microchannel cooling systems, miniaturized, closed-loop cooling systems, and systems which rely on active pumping of fluids to achieve cooling. Microchannel heat exchangers were originally explored by Tuckerman et al. (U.S. Pat. No. 4,450,472, U.S. Pat. No. 4,573,067) in the early 1980s. These devices contained straight, uniform-cross-section microfabricated channels within a silicon substrate, through which liquid coolant was passed. Subsequent patents followed the original work of Tuckerman and Pease (U.S. Pat. No. 4,450,472), including descriptions of microchannel fabrication methods, attachment methods, and specific materials and designs for specific applications.

Microchannel heat sink design to achieve higher heat transfer coefficients or improved temperature uniformity has also been explored. Phillips (U.S. Pat. No. 4,894,709) described liquid microchannel cooling with a guard header structure to improve temperature uniformity in the chip. Frieser (U.S. Pat. No. 4,312,012) described modifications of the surface of the microchannel to improve nucleate boiling and the heat transfer coefficient. Swift (U.S. Pat. No. 4,516,632) and Walpole (U.S. Pat. No. 5,099,910) described channels with alternating flow directions to improve temperature uniformity. Lomolino (U.S. Pat. No. 5,427,174) used a two-fluid mixture to control the effective heat capacity of the coolant and turbulence over a targeted temperature range.

Closed-loop cooling systems employing microchannels have also been an active area of research in recent years, including the description by Hamilton (U.S. Pat. No. 5,901,037) of a closed-loop cooling system in which fluids are passed through microchannels attached to the integrated circuit, and a magnetic pump generates the pressure. Further, Davis (U.S. Pat. No. 5,703,536) describes the use of a closed loop fluidic cooling system for cooling of high-power RF transmitters. .

There has been extensive research into the development of micropumps. These research efforts include pumps based on oscillating piezoelectric membranes, peristaltic pumps, electrohydrodynamic pumps, and others. These pumps, to date, appear to be incapable of generating the pressure and/or flow necessary for application to removal of high heat flux from high-power devices.

The phenomenon of electro-osmosis has been known since the work of F. F. Reuss in 1809. A simple description of this phenomenon is that liquid flow is induced on a region of net charge that develops at the liquid/wall interface. The magnitude of the force is proportional to the applied electric field, and the quantity of the charged species available in this region of net charge. Larger flow rates can be achieved for systems with large cross-sectional areas. Large pressure generation requires structures with very high surface-t0-volume ratio.

Miniature pumps based on the phenomenon of Electro-Osmosis (i.e., Electroosmotic pumps) were originally developed by Theeuwes (U.S. Pat. No. 3,923,426), in which a porous ceramic structure was used to provide a multitude of micron-sized pathways with charged surface layers. Theeuwes describes the importance of selecting pumping structures which feature high porosity, high electroosmotic mobility for a given working fluid, small diameter pores, and discusses the possibility of the use of quartz or glass ceramics, possibly comprised of beads, and porous polymer matrices. The working fluid in the Theeuwes pump was suggested to have a high dielectric constant, low viscosity, and low electrical conductivity. Example liquids that the Theeuwes pump used include deionized water, ethyl-alcohol and alcohol-water mixtures, and many organic solutions. With these materials and solutions, flow rates in excess of 1 mL/min and pressures exceeding 1 Atmosphere were reported.

Despite the many different and diverse cooling systems and techniques described above, there exists a need for an improved closed-loop, fluidic cooling systems and techniques for high power applications having the capability of being implemented in a miniaturized environment. In addition, there exists a need for an improved miniature fluidic cooling system having feedback-controlled temperature regulation of devices that facilitates, for example, hotspot cooling by way of, for example, active regulation of the temperature of the integrated circuit device through electrical control of the flow through the pump. Such miniature fluidic cooling system may utilize multiple cooling loops (in conjunction with multiple pumps) to allow independent regulation of the special and temporal characteristics of the device temperature profiles.

Moreover, there exists a need for a miniature pump that is capable of generating the high pressure (for example, pressure greater than 10 PSI) and/or high flow (for example, a flow rate greater than 5 ml/min) that are necessary for the removal of the predicted high heat flux (for example, power greater than 100W). Such a pump should overcome or address the shortcomings of the conventional pumps, for example a pump configuration for use in a closed-loop systems that addresses practical issues involving evolved gases (for example, by way of recapture) or deposited materials. These issues tend to be prominent in closed-loop fluidic cooling systems employing pumps.

SUMMARY OF THE INVENTION

In one aspect, the present invention advantageously provides for the removal of heat from heat generating devices and transporting to a heat rejection structure through the use of a fluidic loop with a pump. Some of the many specific advantages that are obtainable can be taken singularly or in various combinations.

The present invention has the capability of removing high heat fluxes and high total power from devices.

The present invention also may minimize the volume and weight of the elements of the cooling system that must be attached to the heat generating device, as well as the weight of the pumps and heat exchangers.

The present invention can also simulate the device temperature distribution resulting from the operation of the device together with the micro heat exchanger. The simulation determines the thermal resistance for heat transfer to a micro heat exchanger for a given flow rate and set of microchannel configurations.

The present invention also optimizes the shape and distribution of microchannels in the micro heat exchanger and minimize spatial and temporal temperature variations on the device, even considering large spatial and temporal changes in the heat flux due to variations in the operation of the device.

The present invention also has the capability of minimizing the temperature variations in the device, even in the presence of large nonuniformities in heat flux, which can have a strongly detrimental effect on its performance and reliability. This is achieved through the tailoring of placement, geometry, and internal features of the microchannel heat exchanger. Optimal microchannel design is achieved using simulation capability of the present invention, claimed below.

The present invention provides flexibility in the location of the heat rejection elements, in particular enabling a large separation from the location of the heat generating device. Also enabled is a large area for rejection, which reduces the thermal resistance of the rejection and of the system as a whole.

Apparatus and methods according to the present invention preferably utilize electroosmotic pumps that are capable of generating high pressure and flow without moving mechanical parts and the associated generation of unacceptable electrical and acoustic noise, as well as the associated reduction in reliability. These electroosmotic pumps are preferably fabricated with materials and structures that improve performance, efficiency, and reduce weight and manufacturing cost relative to presently available micropumps. These electroosmotic pumps also preferably allow for recapture of evolved gases and deposited materials, which may provide for long-term closed-loop operation.

Apparatus and methods according to the present invention also allow active regulation of the temperature of the device through electrical control of the flow through the pump and can utilize multiple cooling loops to allow independent regulation of the special and temporal characteristics of the device temperature profiles.

BRIEF DESCRIPTION OF THE DRAWINGS

These and other advantages and aspects of the present invention will become apparent and more readily appreciated from the following detailed description of the presently preferred exemplary embodiments of the invention taken in conjunction with the accompanying drawings, of which.

DETAILED DESCRIPTION OF THE PREFERRED EMBODIMENTS

Figure 1:
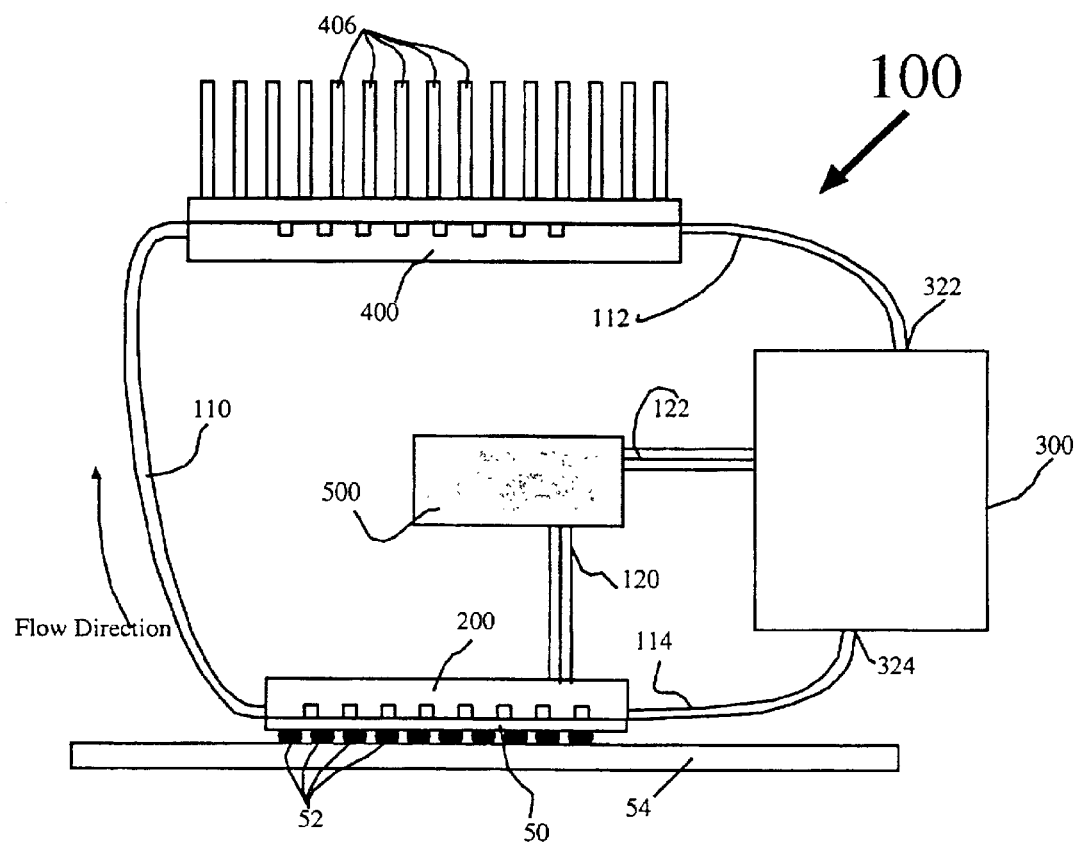
FIG. 1 illustrates an embodiment of a closed-loop cooling system.

The present invention provides, in one aspect, a compact cooling system for electronic systems based on micro heat exchangers, specifically microchannels machined in silicon or metals, and compact electroosmotic pumps. The system is hermetically-closed and may be arranged in a modular fashion, enabling efficient heat removal from a device, and transport to a convenient macro heat exchanger. The micro heat exchangers and electroosmotic pumps as described are extremely compact and power-efficient, such that the total system is far smaller and lighter than heat pipes, vapor chambers, and fin-array heat sinks usually used for removing comparable power from miniature devices. The system is interconnected by flexible tubing and therefore offers advantages in design flexibility. Certain embodiments of the system are generally referred to as the loop system since in its preferred form the various components establish a closed-loop through which the liquid that provides for thermal energy transfer travels.

Various figures show different aspects of the system, and, where appropriate, reference numerals illustrating like components in different Figures are labeled similarly. It is understood that various combinations of components other than those specifically shown are contemplated. Further, separate components, such as the microheat exchanger, macroheat exchanger, and pumps are at times described with reference to a particular system embodiment, and while such description is accurate, it is understood that these components, with the variants described, are independently significant and have patentable features that are described separate and apart from the system in which they are described.

FIG. 1 shows an embodiment of the closed-loop cooling system 100, which includes a micro heat exchanger 200 attached to the heat producing device 50 (shown as an integrated circuit attached to a circuit board 54 through electrical connections 52, but which could also be a circuit board or other heat producing device), a miniature pump 300 for the working fluid, a macro heat exchanger 400 for rejecting the heat from the electronic system to the environment, and a controller 500 for the pump input voltage based on the temperature measured at the micro heat exchanger 200. The individual system components are each described in greater detail.

Micro Heat Exchanger. Micro heat exchanger 200 achieves very low thermal resistance in a compact cross section (thickness less than 1 mm). It attaches directly to the surface of the device using thermal attach materials, such as silver-filled epoxy or solders. The design of choice uses channels with dimensions in the range 20–500 micrometers (microchannels, as described further hereinafter). Significant aspects of this micro heat exchanger 200 are separate groups of channels with integrated thermometers. The spatial distribution, dimensions, and flow directions are tailored to the varying heat fluxes occurring at different functional locations on the chip or device 50. In addition, the geometry and arrangement of these microchannels or microjets can be optimized to enable uniformity of temperature across the device 50, or to allow for independent control of temperature in different regions of the device 50, as discussed below.

The micro heat exchanger 200 can be fabricated from a variety of materials, including, for example, thin metal sheets, silicon and glass layers, ceramics, and carbon-fiber composites. Materials for this structure are to be chosen to meet requirements for thermal conduction from the device 50 to the fluid, and to achieve high reliability of the attachment to the device 50 and for long-term operation in contact with the fluids in the loop. The need for reliable attachment results in a desire to match the thermal expansion coefficient to that of the device 50. Since many of the devices 50 under consideration are fabricated from silicon, fabrication of the micro heat exchanger 200 from silicon may be advantageous. In addition, silicon fabrication methodologies allow precision control of the shape and arrangement of the microchannels, and enables integration of temperature sensors, pressure sensors, and control circuitry into the microchannel structure. Alternatively, metal fabrication methods are capable of approaching the required dimensional control, and in certain circumstances offer advantages over silicon, such as low-cost fabrication, high-reliability sealing technology, and compatibility with the thermal requirements of some applications. An advantage of this invention is that there is considerable flexibility in the selection of the materials and geometries of the microchannel structures which, in part and under certain circumstances, is based on the capabilities of the electroosmotic pumps 300.

Electroosmotic Pump 300. There are many possible kinds of pumps that may be implemented and operated in the system described herein. Preferably, however, there is used a novel electroosmotic pump 300 (also referred to as "EO pump 300" or simply "pump 300") that is capable of producing high pressure and high flow rates at its output. Electroosmotic pumps 300 use electric fields to propel charges in the vicinity of a liquid-solid interface, and are generally tailored to have a very high ratio of surface to volume in the active pumping element. Pumps 300 can be made using a very wide variety of fabrication methods, because the basic electrochemistry of the charged layer and the resulting electroosmosis is known to occur for many material surfaces when brought into contact with water or aqueous solutions. The nature of the interaction between a particular solution and a particular surface will result in variations in the amount of charged solution that is available to be pulled by the applied electric field. As a result, the performance of the EO pump 300 is dependent on this surface interaction, and it may be useful to choose surfaces and solutions that create a strong electroosmotic pumping effect.

High pressure and flow rates for pumps 300 may result from, for example, using sintered microporous media, such as borosilicate frits, polymer frits, and packed beds of glass microparticles. Aerogels, glass fiber composites, nanostructured media, porous silica, microchannel plate structures, other porous ceramic materials, and many other materials which offer high surface/volume ratios and chemically active surfaces may be used to fabricate electroosmotic pumps 300. It is also possible to use lithographic methods to directly fabricate structures with high surface/volume ratios. Silicon microfabricated pumping structures can have the advantage of being integrated with other micro heat exchanger 200 elements, including the sensors and the microchannel structures, and control electronics such as controller 500, all within a single module, as described further hereinafter.

Macro heat exchanger 400. The macro-heat exchanger 400 offers very low thermal resistance between the closed-loop system and the environment. The macro heat exchanger 400 may be comprised of many conventional heat-rejection devices that implement many different methods, and serves to provide rejection to the environment at low thermal resistance. For example, the macro-heat exchanger 400 may include a metal, fan-cooled heat sink, or a dedicated portion of the case of the device enclosure or package. It is emphasized that the cooling loop allows enormous design flexibility for the macro heat exchanger 400 because, in certain implementations, the macro heat exchanger 400 may be placed far away from the device 50, and need not be physically compatible with the requirements of the region near the device 50.

Controller 500. The controller 500 takes standard input voltages available from the electronic system of the device 50 and converts them to the operating voltages required by the electroosmotic pump 300. The controller 500 also monitors the temperature, pressure, and flow rate sensors integrated within the micro heat exchanger 200, provides appropriate driving voltages to a power supply associated with the pump 300 to establish the appropriate current between the anode 314 and the cathode 316 of each electroosmotic pump 300 to cause the environment that will propel the liquid phase of the working fluid within the pump 300. For large-area devices 50 (exceeding 2 cm$^2$), designs using multiple sensors and electroosmotic pumps 300 may provide cooling at varying rates to microchannels grouped near different regions of the device 50.

In addition to variations in the methods for fabrication of the materials and structures of the components descried above, including pumps 300, the present invention describes in another aspect unique operational methods.

One unavoidable aspect of the use of electroosmotic pumping methods is the electrochemistry of the interaction between the fluid and the electrodes. The exchange of charge at this interface causes electrolysis, and will lead to the decomposition of some of the constituents of the fluid. In the case of Water, electrolysis results in the continuous formation of H2 at one electrode and O2 at the other electrode.

One aspect of this invention, therefore, as described further hereinafter, is the incorporation of a catalytic recombiner that consists of a catalyst composed of a hydrophobic Platinum catalyst. H2 and O2 to recombined to form water at this catalyst, and the hydrophobic nature of this surface causes the water to bead up and fall from the catalyst surface and return to the fluid. Another method by which liquid is kept away from the catalyst surface is by use of the heat of reaction associated with the oxidation of hydrogen. The recombination of hydrogen and oxygen into water allows the implementation of the system 100 as described herein as a closed, hermetically sealed system. While many different catalyst materials may work, it has been found that a hydrophobic platinum catalyst, described further herein, has worked best at the present time.

Figure 2:
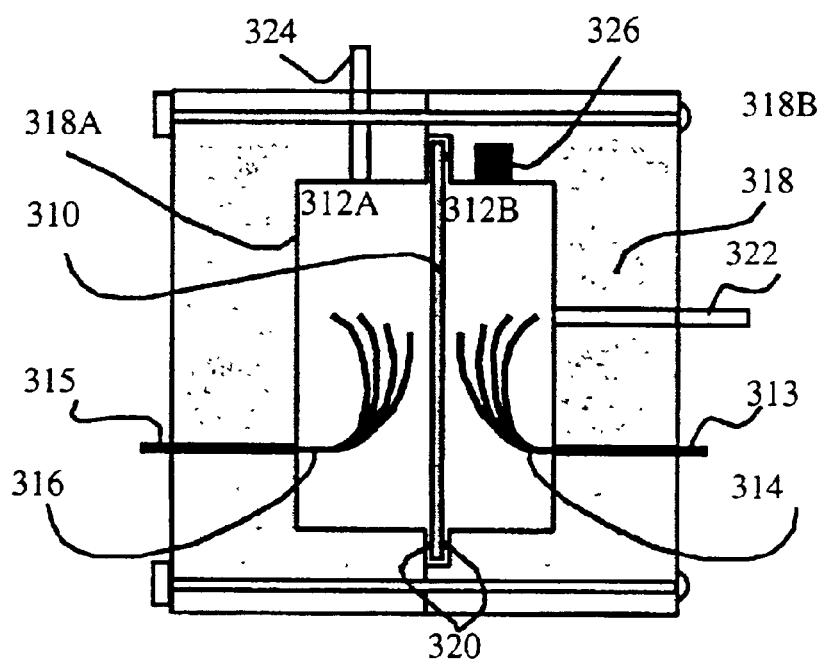
FIG. 2 illustrates an embodiment of an electroosmotic pump.

Other aspects of the invention described herein are the design of the inlet and outlet, the electrode design, and the position of the recombination chamber such that oxygen and hydrogen bubbles can be combined in a single, small volume chamber. FIG. 2 illustrates in further detail the design of the pump 300, which is formed by sealing a porous structure 310 between the cathode and anode halves 312A and 312B, respectively, of an enclosure that forms the pumping chamber 312. Anode 314 and cathode 316, via connections with respective electrodes 313 and 315 are inserted into the pumping chamber 312 through the walls 318 of the enclosure, making electrical contact with the working fluid inside the pump 300. The walls 318 can be made, for example, of an insulating material, such as glass acrylic, ceramic or SiO2-coated silicon, and formed using a two piece structure containing walls 318A and 318B, which are joined, such as shown at the boundary of the porous structure 300, and sealed using seals 320, which may be, for example, an adhesive, a gasket, or by fusing or welding of the two pieces. Fluid flows from the inlet 322, is pulled through the porous structure 300 within the pumping chamber 312 by electroosmotic forces, and exits through the outlet 324. Oxygen generated at the anode 314 is trapped within the chamber portion 312B, and hydrogen generated at the cathode 316 passes through the loop and returns to the pump 300, where it enters the catalytic recombiner 326 with the residual oxygen, and is recombined to form water and returned to the pumping chamber 312.

Oxygen bubbles generated at the upstream electrode (anode314) are driven into the recombination chamber by pressure (i.e., buoyancy) forces. Hydrogen bubbles flow through the closed-loop system (subject to pressure, surface tension, and viscous forces) and, upon entering the inlet 322 of the pump 300 are also driven up into the recombination chamber 312 by buoyancy, eventually into the mesh or pellet catalytic recombiner 326, where the hydrogen recombines to form water as mentioned above.

During operation of the cooling loop, continuous evaporation of the fluid in the evaporation region can result in the accumulation of residues within the evaporator or elsewhere in the cooling loop. These residues may include electrolytes and salts that precipitate from the solution during the evaporation, or any other dissolved solids. Some of these electrolytes may have been deliberately added because of their ability to preserve the properties of the surfaces of the electrodes and the porous structures of the pump. The long-term accumulation of deposited residues can be avoided by periodically causing the pump to operate at maximum flow for brief periods. When the flow is increased to the maximum, the liquid phase fills the entire cooling loop, allowing the deposited materials to be dissolved back into solution, thereby recapturing the accumulated residue. This process is called a wash-thru, and depends on the feature of the pump that allows rapid adjustment of flow rate by increase of the potential difference applied to the electrodes of the pump. By performing a wash-thru operation with the pump 300 for a short time (e.g. 1 sec every 1000 seconds) deposited residues in the cooling loop may be recaptured into the fluid. This facilitates long-term operation of the system 100.

The use of electrolytes allows is critical to maintain long-term performance of the pump 300 to be maintained (by stabilizing surface chemistry) and to reduce the voltage drop between the electrodes and the pump structure (i.e., the voltage drop associated with conducting ions from the electrode surface, through the intervening electrolyte, and to the inlet pores of the pumping structure).

Other unique operational aspects of the system 100 will be further described, before a further description of the system 100 is provided.

Pump Control for Transient Chip Temperature Uniformity

Integration of thermometers in the micro heat exchanger 200 and feedback through the controller 500 allows the system 100 to minimize temporal temperature variations on the device 50, even in the presence of transient surges in the heating load at the device 50. For the case of silicon heat exchangers, the thermometers are integrated into the heat exchanger using, for example, doped silicon thermistors, diodes, or patterned metal electrical-resistance bridges. The controller 500 provides a signal to control a power supply associated with each electroosmotic pump 300 to control the current that exists between the anode 314 and the cathode 316 based on the measured temperatures at the micro heat exchanger 200. In the case of a system 100 employing more than one pump 300, it is possible for the controller 500 and an appropriate pump 300 to respond separately to temperature surges on different regions of the device 50. This functionality takes advantage of an important characteristic of the elements of the system 100—the pressure and flow through the pumps 300 responds to changes in the applied voltage on timescales faster than 1 mS, and the specific heat of the micro heat exchangers 200 is very low. As a result, the response of the system 100 to changes in heat load or to demands for changes in operational temperature is fast enough to enable dynamic temperature control with bandwidth approaching 1 Hz. This feature is a significant improvement over existing miniature device temperature control technologies such as heat pipes, cooling fins (and/or fans), and phase change material approaches, which use methods that are incapable of adjustable heat removal based on electrical signal input (passive heat sinks, heat pipes, phase-change materials), or would have very slow temporal response because of large heat capacities and marginal ability to modify the heat transfer coefficients (fans).

Micro Heat Exchanger Design to Minimize Chip Temperature and Temperature Gradients The micro heat exchanger 200 enables design innovations such as in-situ temperature sensing to minimize the maximum and average chip temperature for a given flowrate, even considering large spatial variations of the heat flux from the device 50. These innovation opportunities include the integration of doped silicon thermistors, which allow the controller 500 to respond to local changes in temperature, as will be described hereinafter. Also, the micro heat exchanger 200 provides the opportunity to tailor the channel dimensions and spatial density to vary the effective thermal resistance across the area of the device 50, thereby minimizing temperature gradients resulting from differing heat fluxes. Design and optimization of microchannels in silicon can be achieved using a one-dimensional model for two-phase boiling flow in channels, also further described hereinafter. The effective channel dimensions in the regions of greatest heat flux are reduced using local high-surface area structures, such as internal fins, or regions with smaller cross sectional areas 50, to augment the local thermal conductance. Furthermore, the flow direction and location of the region of high heat flux with respect to the fluid inlet can be used to minimize the local temperature. Since the pressure decreases continuously as the fluid moves through the channels, and the temperature of the two-phase liquid-vapor mixture depends uniquely on pressure, increasing the separation between the fluid inlet and the high heat flux region can strongly reduce its temperature. Groups of channels flowing in opposite directions on the device 50 can also be advantageously used to achieve greater temperature uniformity.

The development of optimal design methodologies based on detailed thermal modeling allows the design of microchannel geometries that are customized to match the heat distribution on a particular device 50. This aspect of the invention allows the total performance of the system 100 to be optimized with respect to a specific device characteristic. This aspect of the invention is further enabled by the ability to operate multiple independent cooling loops through a single micro heat exchanger 200. The design and fabrication capabilities for silicon fabrication would allow multiple fluidic manifolds to be co-located on a single substrate and to be operated simultaneously so as to achieve independent thermal regulation of different regions of the device 50.

Working Fluid Design and Optimization for the Loop System

Targeted device 50 temperature is further reached using tailored working fluid chemistries and operating pressures. Both the chemistry and operating pressure influence the boiling temperature, which determines the device 50 temperature at which the system 100 achieves the lowest thermal resistance. These design and optimization strategies are significant in that they also affect the operation of the catalytic recombiner 326 illustrated in FIG. 2, which requires minimum partial pressures of hydrogen and oxygen in order to operate efficiently.

Fluid chemistries that can be used include, but are not limited to, deionized water (DI), aqueous buffer solutions, organic liquids (e.g., acetonitrile and methanol), and mixers of organics and buffers for the working fluid of the pump 300. Optimized mixtures of the working fluids that achieve the required heat transfer needs and yet optimize pump performance and reliability. Key issues in the optimization of the working fluid mixture include long-term pH control of working fluid (which directly affects pump surface charge density and therefore pump pressure and flow rate performance). Although pure De-Ionized water often offers the best thermodynamic efficiency for heat removal, the operation of the system may impose additional requirements. For example, high-flow rate performance of the pump may be achieved by increasing the conductivity of the fluid beyond what is available from DI water, for example by adding buffer to the water. In addition, additives in the aqueous solution can help to preserve the surface characteristics of the electrodes and the porous pumping structure. For example, increases in the conductivity of the working fluid has the negative effect of increasing the Joule heat dissipation of the pump 300, but also has the beneficial effect of decreasing the thickness of the layer of charged ions in the solution in the porous pumping structures, which increases the pressure and flow provided by the pump. In addition, increases in the conductivity of the fluid serve to reduce the potential drop from the electrodes to the surfaces of the porous pumping structure. This is important, because only the potential difference across the surfaces of the porous structure contribute to pumping action. Potential drop from the anode to one surface and from the other surface to the cathode are wasted.

Before further describing in detail the loop system 100, certain of the advantages that it provides will mentioned. These advantages allow the system 100 to compete with conventional heat dissipation systems as mentioned above, including heat pipe and vapor chamber technology in laptops and hand-held devices and traditional metal fin-array heat sinks used in desktop computers. Due to major improvements including the increased peak heat load, the minimal volume at the device 50, and the possibility for transient and spatial reductions of temperature variations, the various aspects of the loop system 100 described herein will also enable continued scaling and performance improvements of electronic systems.

Much Larger Peak Heat Loads for a Given Device Volume

A significant advantage of the system 100 according to the present invention is the ability to handle much higher heating loads than conventional devices using a much smaller volume. Because the cooling loop is pumped, the pressure drop and flowrate of a given loop system 100 design can be tailored to the targeted heating load between 5 W (hand held) and 1 kW (parallel-processor desktops). While an electroosmotic pump 300, if used, adds a small additional volume to the loop system 100, each pump 300 is extremely compact (smaller than any competing pump) and offers tremendous performance benefits. Specifically, the pumping of the liquid phase allows the system 100 to remove total heating powers far in excess of those handled by heat pipes and vapor chambers of comparable volume. The additional power required by the pump 300 is small compared to the power required by the device 50 and is therefore not a significant burden for the battery life where the application is a portable electronic system.

Minimal Volume at Chip Backside

From the perspective of system miniaturization and multi-chip integration, the micro heat exchanger 200, in particular microchannel heat sinks with thickness below 1 millimeter, has a tremendous advantage because it occupies less space specifically at the backside of the device 50 than conventional techniques. This is significant, particularly since the semiconductor industry is targeting increased integration of multiple chips into a single device 50 package, for which minimal separation between chips is critical for reducing signal delays. For single-chip systems, the minimal volume of the micro heat exchanger 200 at the chip backside is critical because it enables miniaturization of the dimensions in the case of electronic system. For a metal, fin-array heat sink, the design can accommodate an enormous volume attached directly to the device 50 backside. This large volume requirement may prevent dense packaging of circuits, especially for applications where placement of a multitude of circuits within the product is required, such as servers. In other applications, such as laptop computers, there is very limited space above the microprocessor, and fin array heat sinks suitable for power in excess of 50W are difficult to accommodate. Conventional designs cannot accommodate such volumes, which inhibits integration of multiple chips closely into a single package and impedes system miniaturization, particularly for compact desktop computers.

Design Flexibility

The preferred pump 300 enables design flexibility, particularly since it allows heat to be rejected over a relatively large area far away from the device 50, attached only using fluidic tubes, and can be disposed in a variety of locations, depending upon the system being implemented. For example, while FIG. 1 illustrates a closed-loop system in which the pump 300 pumps fluid into the micro heat exchanger 200, pump 300 could pump fluid into the macro heat exchanger 400 instead, or in addition to the location illustrated in FIG. 1.

Transient and Localized Response to On-chip Temperature Variations

In contrast to heat pipes, vapor chambers, and metal fin-array heat sinks, the loop system 100 can respond to transient surges in heating (through, for example, control of the electroosmotic pump 300) and to spatial variations of heating intensity and temperature rise on the device 50 (through, for example, microchannel design and the separate control of pumps 300 dedicated to microchannels on regions of the device 50). This allows the system 100 to provide much better temperature uniformity in time and space for the device 50.

Lack of Thermal Mismatch between Chip and Heat Sink

A major reliability concern for heat pipes and vapor chambers is the mismatch of thermal expansion coefficients between the device 50 and the heat spreader, which makes direct contact with the device 50. In certain embodiments of the closed loop system 100 as described further herein using silicon micro heat exchangers 200 along with silicon chip devices 50, there will be no thermal expansion mismatch between the chip and the heat sink. This benefit can be exploited through the use of novel attachment materials, such as thin alloy solders, rather than traditional metal-filled organic materials, thereby substantially reducing the overall system thermal resistance.

With the above overview having been provided, as well as several advantages having been discussed, a further detailed description of the system 100, and various aspects and methods is set forth hereinafter.

FIG. 1, as mentioned above, illustrates a schematic of one closed loop fluidic system 100 of the present invention, which includes a micro-heat exchanger 200, a pump 300, a macro-heat exchanger 400, and a controller 500. Before further describing these individual elements, several important features of the system 100 will be mentioned.

It may be important for the output of the pump 300 to be directed towards the inlet of the micro-heat exchanger 200. The micro-heat exchanger 200 is typically physically attached to the device 50 that heats up, and will be the highest temperature point in the loop. At the outlet of the micro-heat exchanger 200, the fluid/vapor mixture travels down a flexible tube 110 towards the macro-heat exchanger 400. One important feature is that this tubing can be centimeters in length for some applications, and as much as a meter in other applications. These long lengths are possible because of the high pressure capability of the pumps to be used in this invention. The pump 300 is capable of producing very high pressure, which can be used to force the fluid/vapor mixture down a considerable length of tubing, thereby allowing the macro heat exchanger 400 to be located based on all the other factors that govern the design of the system 100.

Within the macro-heat exchanger 400, the fluid/vapor mixture condenses completely to a fluid, and travels through the second length 112 of flexible tubing. This length 112 can also be very long, allowing placement of the pump 300 near the micro heat exchanger 200 through the use of a third length 114 of flexible tubing as shown, or even integrated with the pump 300 integrated with the micro heat exchanger 200, as described further hereinafter with respect to FIG. 18.

The controller 500 is understood to be an electronic circuit that takes input signals from thermometers in the micro heat exchanger 200, or from thermometers in the device 50 being cooled, which signals are transmitted along signal lines 120. The controller 500, based upon the input signals regulates the current through the pump 300 by applying signals to the power supply associated with the pump 300 along signal lines 122 to achieve the desired thermal performance. The pump flow rate is strictly proportional to the applied voltage, so this control algorithm can be a simple proportional controller 500, or may incorporate more sophisticated methodologies. Because the specific heat of the micro heat exchanger 200 is small, and the response time of the pump 300 is fast, the time response of the thermal control system can be very fast, and enables implementation of a robust, accurate controller 500 with fast dynamic response.

The embodiment illustrated in FIG. 1 also has the feature that the design of the elements of the system is very compartmentalized—meaning that each element 200, 300, 400 and 500 may be optimized for performance independent from the characteristics of the other elements of the system. Ultimately, it is important for the pump 300 to be able to create the flow and pressure required to capture and transport the necessary heat. However, there are very few aspects of the design of the micro-heat exchanger 200 that have any effect on the design of the macro-heat exchanger 400. This compartmentalization of the system elements enables easy independent optimization, and also allows the system 100 to be assembled from collections of independently-designed and fabricated components so as to match the performance requirements of any particular application.

Micro-heat Exchanger 200 Design and Optimization

Figures 3A, 3B:
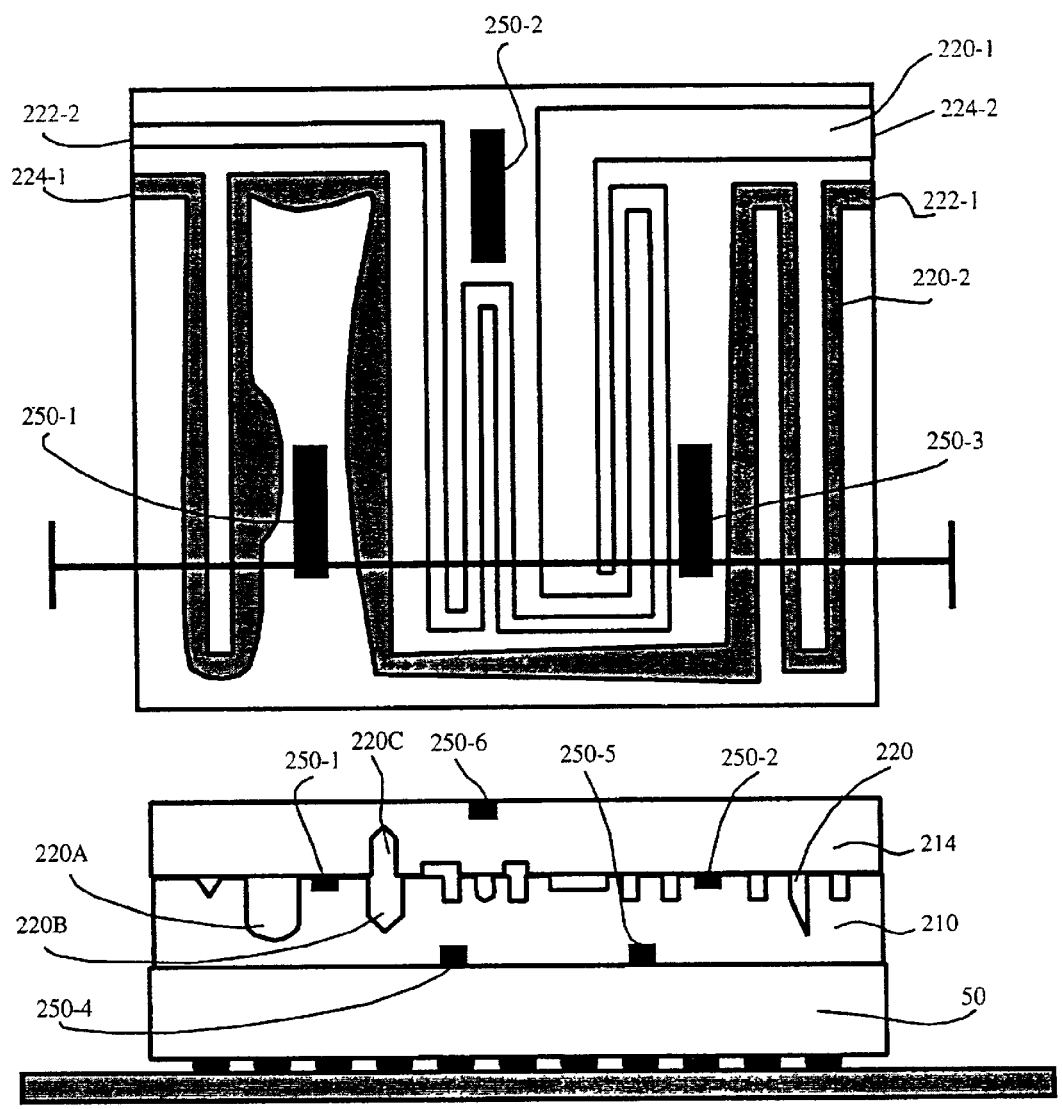
FIGS. 3A and 3B illustrate top and cross sectional views, respectively of an embodiment of a microchannel structure.

The micro-heat exchanger 200 shown in FIG. 1 may be comprised of a microfabricated silicon structure, or of a machined metal structure, or of many other possible materials. FIGS. 3A and 3B illustrate a top and cross sectional view, respectively of an exemplary microchannel structure. Layer 210 has a pattern of microchannels 220 etched into one surface 212. These channels 220 can be arranged across the surface 212 according to the needs for heat removal from particular regions of the device 50, or they can be uniformly distributed. There can be arrangements in which more than one fluidic path are produced on this surface, as shown in FIG. 3A by fluidic microchannel paths 220-1 and 220-2—these independent paths can be separately connected to independent pumps 300 and/or independent macro-heat exchangers 400, according to the needs of the application.

The arrangement of the microchannels 220 may be adapted to the distribution of the expected heat sources on the device 50, as shown in FIG. 3A. The density of the channels 220 may be increased in regions which correspond to sources of excessive heat, or the routing of the channels 220 may be adjusted to minimize temperature gradients from the inlet 222 to the outlet 224 of the micro heat exchanger 200. The widths, depths, and shapes of the channels 220 may also be adjusted to improve device temperature uniformity. A computer model of the heat sources in the device, combined with calculations of heat transfer into fluids moving in various channel shapes at various velocities, is used to simulate temperature profiles on the device 50, and minimization of these profiles results in an optimized design for the micro heat exchanger 200. This modeling process is described below.

One particular advantage of the high pressure capability of the EO pumps 300 is that channel 220 arrangements do not need to designed to minimize pressure drop and maximize temperature uniformity at the same time. The temperature uniformity can be optimized for a given device 50, and the EO pump 300 is then tailored to provide adequate pressure and flow to operate the micro heat exchanger 200 and the macro heat exchanger 400. Channels 220 can be etched into only layer 210, as shown by channel 220A of the 2-layer bonded micro heat exchanger 200, or may be present on both layers 210 and 214, as is shown in the channel portions 220B and 220C that are etched into layers 210 and 214, respectively. Alignment of layers 210 and 214 can create additional geometric cross sections for the channels 220, as appropriate for minimizing the temperature variations within the device 50.

The two layers 210 and 214 shown in FIG. 3B may be bonded by anodic or fusion bonding, or eutectic bonding, or adhesive bonding for glass and silicon structures. Metal structures may be bonded by welding, soldering, eutectic bonding, or adhesives. Similar techniques may be implemented for multi-layer microchannel structures of almost any material. The shape and arrangement of the channels should be determined based on the requirements for heat removal from the device, and this design may be assisted by the use of thermal modeling tools described elsewhere in this application.

The placement of temperature sensors, also referred to as thermometers, within the microheat exchanger 200 is another important factor, and there are unique advantages to the placement of these thermometers laterally with respect to the microchannels 220 and the heat sources of the device 50, and there are advantages to placement of the thermometers at different vertical locations as will be described.

FIG. 3A also illustrates temperature sensors 250 disposed in various locations of the micro heat exchanger 200. These temperature sensors 250 supply signals indicative of the temperature of that specific region of the micro heat exchanger 200, thus corresponding to a specific region of the device 50, to the controller 500 via signal lines 120 as illustrated in FIG. 1. These temperatures are used to maintain optimum temperature control, as described previously and further herein. The temperature sensors illustrated 250-1, 250-2, 250-3, 250-4, 250-5 and 250-6 further illustrate specific advantageous placements within the micro heat exchanger. As will be described, placing thermometers at the bonding surface, in the middle near the channels, and on the top surface of the heat exchanger allows measurement and control of temperature at these distinct locations, as well as determination of the heat flow during transients. Thus, the temperature measured is the average temperature of the surrounding region, including the influence of the cooling from the microchannels 220 and the heating from localized heat sources in the device 50. The averaging of these influences is weighted according to proximity—that is to say that the temperature at any specific location is most heavily influenced by the heating and cooling sources nearest to that location. Further, the temperature sensors respond most quickly to the heating and cooling sources nearest to that location.

As illustrated, sensors 250-1 and 250-2 are located between fluid paths corresponding to the same fluidic microchannel paths 220-1 and 220-2, respectively. Sensor 250-1, however, is disposed between portions of the microchannel 220-1 that have varying cross-sectional areas, whereas sensor 250-2 is disposed between portions of the microchannel 220-2 that have consistent cross-sectional areas. Thus, sensors 250-1 and 250-2 located near the channels will be most sensitive to heat transfer variations in the channels, and will respond most quickly to changes there.

Further, sensor 250-3 is disposed between the two different fluidic microchannel paths 220-1 and 220-2, which allows controller 500 to vary either or both of the flow rates within the fluidic microchannel paths 220-1 and 220-2 to change the temperature of the region corresponding thereto. The placement of the sensor relative to the various microchannel paths results in the ability to adjust the flow rates through several channels in order to achieve specific temperatures at any location in between the channel.

Further, by placing the sensor in proximity to a particular channel, it is possible to measure and control the temperature of the fluid moving through that channel, and therefore achieve approximate control over temperature in the region upstream or downstream along that channel. Finally, the separation between the channel and the temperature sensor has an effect on the time it takes for the sensor to respond to a change in fluid flow, and can allow fast or slow feedback control of the temperature in this location in the system. Thus, sensors 250-4 and 250-5 are shown further from the channel 220 and closer to device 50, whereas sensor 250-6 is illustrated further from both the channel 220 and the device 50. Thus, sensors 250-4 and 250-5 placed at the bonding interface to the device 50 are the most sensitive to the local heating sources, and will respond most quickly to changes in temperature due to changes in heat dissipation in the device 50, whereas sensor 250-6 will provide an indication of temperature change on a more global level over periods of time that are greater.

Since one objective of this invention is to provide active feedback-controlled cooling of the device, the use of temperature, pressure and/or flow sensors to provide input signals to the controller 500 is important. The measured parameter (for example, temperature) is compared to the desired parameter (for example, temperature), and the differences are analyzed by the feedback control algorithm to produce changes in the pump control voltages. As an example, if the temperature at a specific location in the device 50 exceeds the desired regulation temperature, the controller 500 will increase the voltage to the pump 300 that provides fluid flow to a channel near to the thermometer, thereby increasing the heat transfer to the fluid in that region, and cooling that region of the device 50. Simple feedback control applies a voltage to the pumps 300 that are proportional to the difference between desired and measured temperature. This is often referred to as proportional control. A disadvantage of simple proportional control is that large changes in the control output (pump voltage) can only be generated after large errors in temperature are produced. More advanced control strategies attempt to derive information from the temperature, the rate change in temperature, and perhaps from more than a single thermometer in order to produce a control signal that regulates temperatures more accurately. Such controllers 500 are easier to implement with temperature signals recorded at several locations, such as near the device 50, near the microchannel 220, and at the top surface of the microheat exchanger 200, as describe above. These temperature measurements from disparate locations relative to the device 50 and the microchannels 200 provide information to the controller 500 at different rates, and with different sensitivities to different local influences, leading to an overall control strategy that offers much better accuracy and stability in the face of changes in heat input. Therefore, providing input (for example, thermal) from several different locations within the microheat exchanger 200 is preferable.

The thickness of layers, such as layers 210 and 214, is also a consideration. These layers are generally no thinner than 0.1 mm, and may be as thick as several mm, depending on the material and manufacturing process. For example, if these layers are fabricated from silicon or glass wafers, the typical thickness of such wafers are near 0.5 mm, although they may be thinned to 0.1 mm to allow the total thickness of the microheat exchanger to be minimized. If the layers are fabricated from ceramics, the layer thickness is typically 1 mm or greater. If the layers are fabricated from metals, near or greater than 1 mm are typical.

Figure 25:
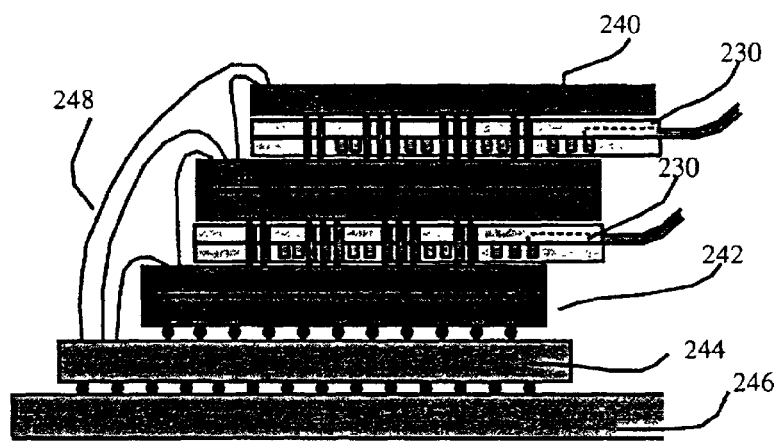
FIG. 25 illustrates an embodiment using a plurality of microchannel structures in a 3-D device stack.

In many applications, the device to be cooled is a silicon integrated circuit, so there are some important advantages to a microheat exchanger fabricated from silicon. Specifically, the thermal expansion coefficients of the device and the heat exchanger would be matched, allowing the elimination of differential thermal expansion-induced stress at the interface between the device and the heat exchanger. In the case of a silicon micro heat exchanger, microfabrication techniques can be used to achieve precise control over the paths and cross-sectional shapes and arrangements of the microchannels, and the overall dimensions of these structures can be minimized to allow very close packing of devices. Finally, an important advantage of the micro heat exchanger is that its limited thickness can allow alternate stacking of devices and cooling layers, as shown in FIG. 25 below.

Figure 4:
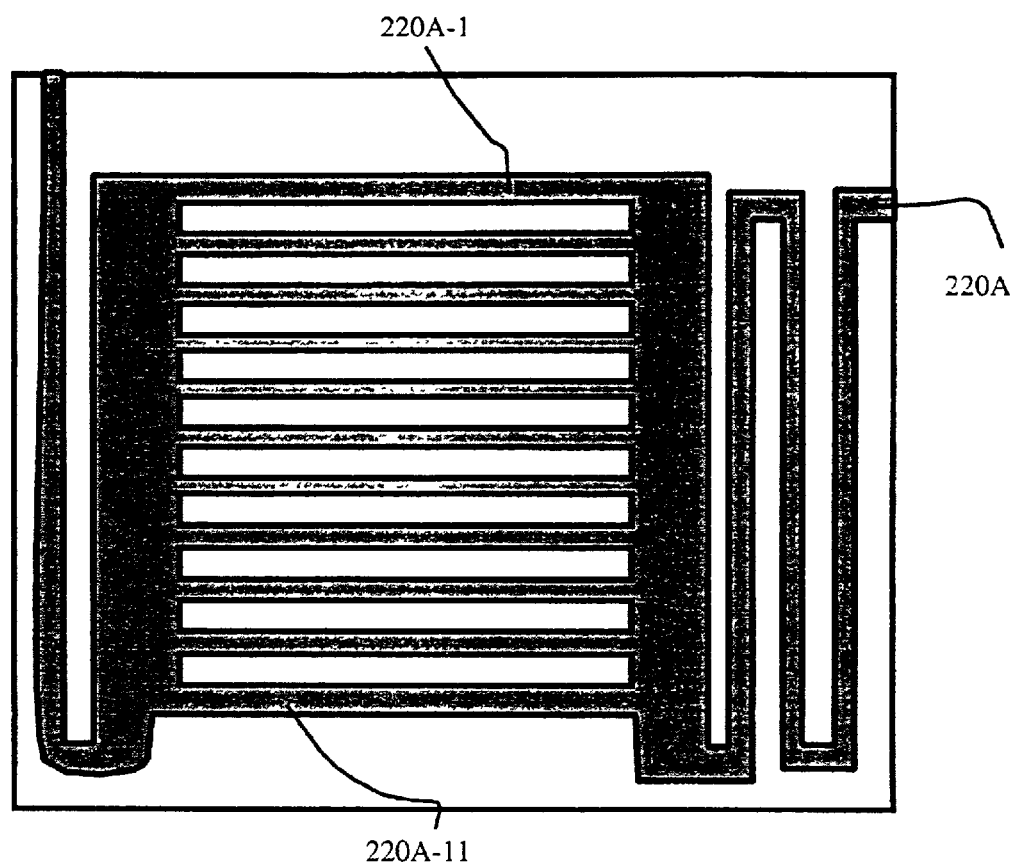
FIGS. 4 and 5 illustrate other embodiments of microchannel structures.

FIG. 4 illustrates another possible variation in the design of the micro heat exchanger 200. As shown, a single pathway, such as pathway 220A through the micro heat exchanger 200 is separated after the inlet 222A into 11 separate pathways 220A-1 through 220A-11 and recombined to a single pathway at the outlet 224A. The width of the channel in the regions 220A-1 to 220A-11 can be varied in size and shaped to insure that the fluid is distributed among each of the separate paths 220A-1 to 220A-11 according to need.

Figure 5:
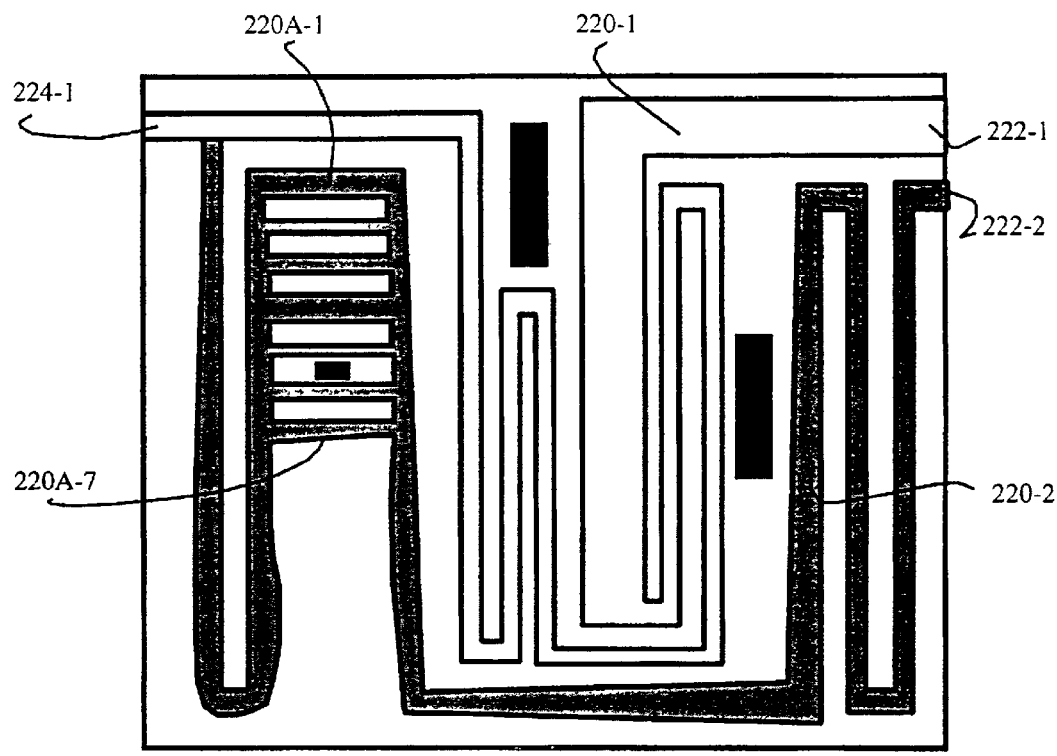

FIG. 5 illustrates another possible variation in the design of the micro heat exchanger 200. As shown, the two pathways 220-1 and 220-2 are combined just before the outlet 224-1, allowing the use of a single fluid line 110 being connected externally to the micro heat exchanger 200. In addition, near the end of the path 220-2, the channel splits into 7 parallel pathways 220-2-1 through 220-2-7, illustrating the possibility for a single path to be separated into separate paths and recombined within the micro heat exchanger 200, as described previously with respect to FIG. 4.

Macro Heat Exchanger 400 Design

The macro heat exchanger 400 can consist of any of a number of conventional macroscopic approaches for heat rejection to the ambient. For example, the fluid can be routed through a channel in the base of a metal fin heat sink. One advantage of the system 100 is that the high-pressure capabilities of the pump 300 allow the fluidic resistance of the macro heat exchanger 400 to be high if that allows for other performance or cost advantages. So, it is possible to route the fluids through a complicated path within the macro heat exchanger 400 in order to minimize the thermal resistance without concern for the implications of increased fluid flow resistance.

Figure 6:
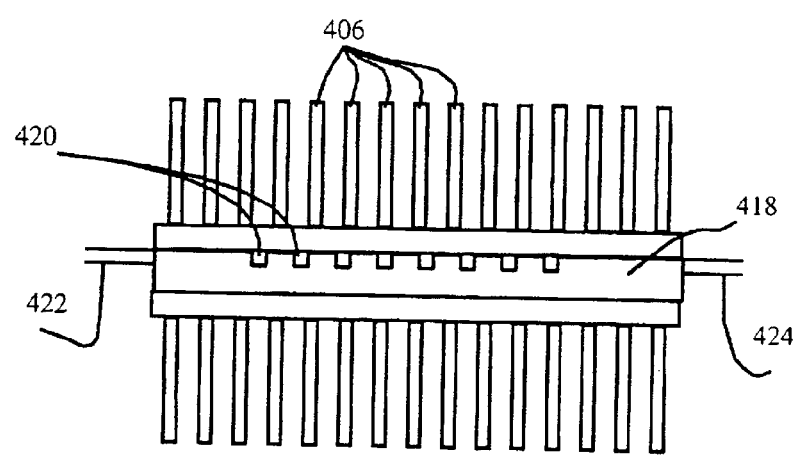
FIGS. 6 and 7 illustrate embodiments of a macro heat exchanger.

FIG. 6 shows an example of a macro heat exchanger 400A, which is based on the design of conventional macroscopic heat exchangers that contain fins 406. Flow channels 420 disposed within a core element 418 that allows fluid flow between the fluid inlet 422 and the fluid outlet 424. An important advantage is that the shape and performance of the macro heat exchanger 400 can be optimized outside of the constraints of the environment of the device 50, because the heat may be transported great lengths through the flexible fluidic connections 110, 112 and 114 between the elements of the loop.

Figure 7:
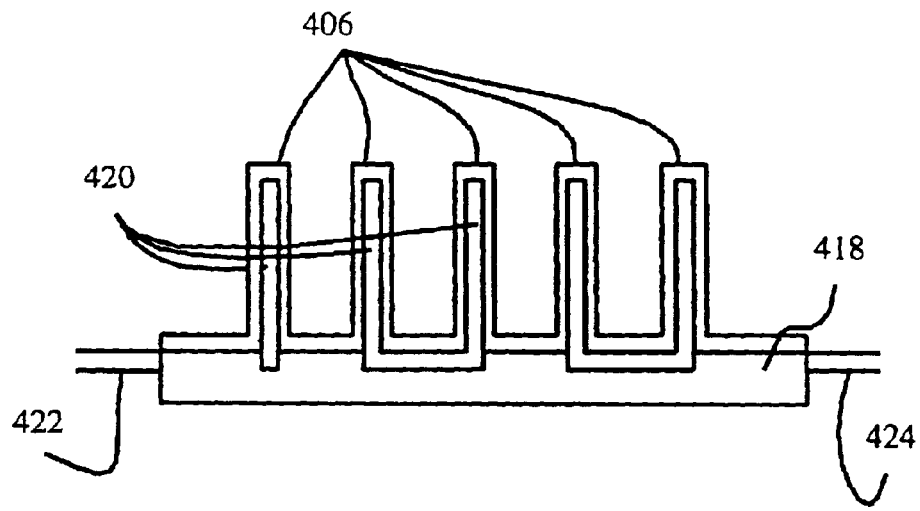

An advantage that may be realized by way of the system 100 is that it is possible to design a macro heat exchanger 400 that includes a very complicated fluid flow path or paths throughout the high-surface-area structures that provide thermal contact to the air. FIG. 7 shows an example of a possible macro heat exchanger 400 in which fluid channels 420 are routed into the fins 406 that protrude from the core element 418. This routing of fluid flow paths into the fins 406 can significantly reduce the overall thermal resistance of the macro heat exchanger 400, thereby improving the heat rejection performance of the entire system 100.

One preferred embodiment of the invention is to directly couple the macro heat exchanger to the exterior surfaces of the system. FIG. 1 above shows the macro heat exchanger connected to a fin array heat sink, but it might be advantageous to connect the macro heat exchanger directly to the outside surface of the system. If the system is a desktop-computer, Such an embodiment would involve mounting the macro heat exchanger directly on the inside surface of the side or top of the enclosure. If the system is a laptop computer, mounting the macro heat exchanger within the backside of the screen would be advantageous. In these two cases, such a configuration takes advantage of enhanced natural convection off of these vertically-oriented surfaces.

As with the micro heat exchanger 200, thermal modeling as discussed further hereinafter can be used to optimize the distribution of the fluid paths 420 within the macro heat exchanger 400, including detailed design of the diameters, cross-sectional profiles, depths, shapes, densities, and other geometric parameters so as to optimize the performance of the macro heat exchanger 400.

Typically, after the heat exchangers 200 and 400 are designed for optimum thermal performance, the performance requirements of the pump 300 may be determined, and its characteristics can then be independently optimized. One feature of the present invention is that the capabilities of the pump 300 may be tailored to allow independent optimization of the heat exchangers 200 and 400, thereby producing substantially improved overall system thermal performance.

Electro Osmotic Pump 300 Design and Fabrication

The preferred electroosmotic pump 300 in this system can be produced from a variety of materials and by a number of fabrication methods. Other pumps, however, such as electrostatically-actuated thin membrane pumps, piezoelectric pumps, electrohydrodynamic pumps, ultrasonic pumps and others may also be used and certain advantages of the present invention still would be obtained. Preferably, however, the pump is an electroosmotic pump 300, where the pump structure includes a liquid-filled chamber 213 with electrodes 314 and 316 on either side of a porous structure 310, as shown in FIG. 2 and mentioned above. When an electric potential difference between the anode 314 and the cathode 316, and thus between the opposite sides of the porous structure 310 exists, ions within the porous structure 310 are drawn from the side 312B to the side 312A, and the neighboring liquid is pulled through the structure 310 as well. The resulting flow and pressure difference causes the liquid flow through the entire closed-loop system 100. In the embodiment shown in FIG. 2, a porous structure 310 in the form of a ceramic disk is sealed between the halves 312A and 312B of the chamber 312, and provisions for the fluid inlet 322 and outlet 324, anode 314, cathode 316, and catalytic recombiner 326 are shown. This particular pump embodiment may be easily assembled from inexpensive materials, and used to generate pressure in excess of 2 Atm and flow rates as high as 10 mL/min.

Figure 10:
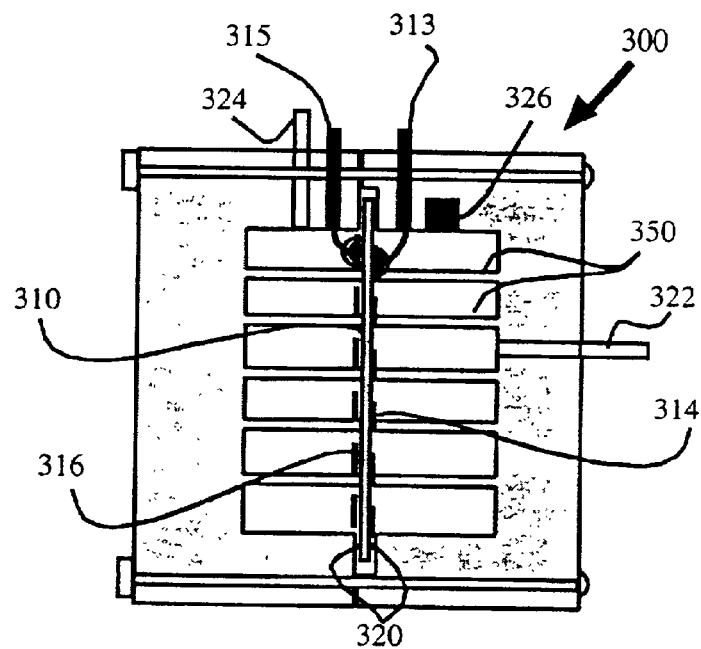
FIGS. 10 and 11 illustrate other embodiments of an electroosmotic pump.

In order for the preferred electroosmotic pump 300 to generate the pressure and flow rates desired, it is preferable that the pump 300 include the following components:

1. A porous structure 310 featuring a multitude of small-diameter pathways passing from one side to the other. The diameters of the pathways are typically smaller than 0.01 mm in diameter, and it is preferable if they are smaller than 0.0025 mm in diameter. The reason for this preference is that the smaller diameter channels result in a larger fraction of the fluid in proximity to the surfaces, and a larger charged fraction of the fluid, leading to a larger force on the total fluid for a particular potential difference. The thickness of the porous structure 310 is typically between 1 mm and 1 cm. Thinner structures result in an increased flow rate for a particular potential difference, but it is important to remember the resulting pressure exerts a force on this structure, and it can fail if it is too thin. The balance between the requirements of high flow rate and reliability leads to a preferred thickness for a ceramic structure of several mm. It is possible to improve this situation by providing support for the porous structure at several locations within the regions on opposite sides, as shown in FIG. 10.

When space is a design constraint or consideration, the dimensions of the chamber are chosen to minimize the size and mass of the pump, but to provide a robust enclosure. The enclosure must be fabricated from a material with insulating surfaces, so that there is no current from the cathode or anode into the chamber surfaces. For chambers made from acrylic, the overall dimensions are several cm, and the thickness of the walls is 1–3 mm. All of these dimensions may be reduced to allow pumps with overall dimensions of less than 1 cm, and even as small as 1–2 mm; these pumps feature chamber thicknesses near 1 mm, and down to 0.1 mm respectively.

The material of the porous structure 310 should have a high electroosmotic mobility with respect to the working fluid, and provide mechanical integrity necessary to withstand the high differential pressure that will occur.

2. A pair of electrodes, the anode 314 and the cathode 316 as shown, for applying the electric field across the porous structure 310. These electrodes 314, 316 are to be immersed into the fluid on opposite sides of the porous structure 310, and should withstand chemical interactions with the fluid, as well as the electrolysis that will occur when voltages are applied.

3. An inlet 322 and an outlet 324 for the fluid flow.

4. A means for capturing the evolved hydrogen and oxygen gases and recombining to replace the water lost to electrolysis, such as the catalytic recombiner 326 shown. An example of such a catalytic recombiner 326 is shown in FIG. 10, and consists of a small chamber filled with a platinum-coated mesh, or with ceramic pellets coated with platinum. The platinum surfaces serve as a substrate for an efficient reaction between H2 and O2 molecules generated elsewhere in the pump to recombine to form liquid water, after which this water passes back into the main chamber of the pump. This chamber can be positioned within the walls of the pump chamber 312, or be attached to the outside of this chamber. It is important for the recombiner chamber to provide a means for gas to enter from the pump chamber and for fluid to return.

5. A working fluid that features low viscosity, high resistivity, and high electroosmotic mobility with respect to the surfaces of the porous structure. This fluid should be composed of constituents that will not degrade during long term exposure to the other materials in the system 100, or during continuous electrolysis.

Embodiments that contain these elements of the pump 300 that are appropriate for closed-loop operation of a fluidic cooling system 100 will now be described. These descriptions include details as to the formation of the entire pump structure, methods for attachment of electrodes to the surfaces of the porous structures, and specific examples of selected materials to form the porous structure 310.

Sintered Silica Pump Fabrication Process

One possible method for producing such pumping elements is to use a packed bed of silica particles as the porous structure 310. Various processes for fabricating the sintered particle pumping media have been developed and are well-known to those skilled in the are.

The first process is to centrifuge a silica-water slurry and decant off the water, dry the cake, slice into ~1 mm disk sections, and sinter. This works well for particles having a dimension of at least 1-micron.

Figure 8:
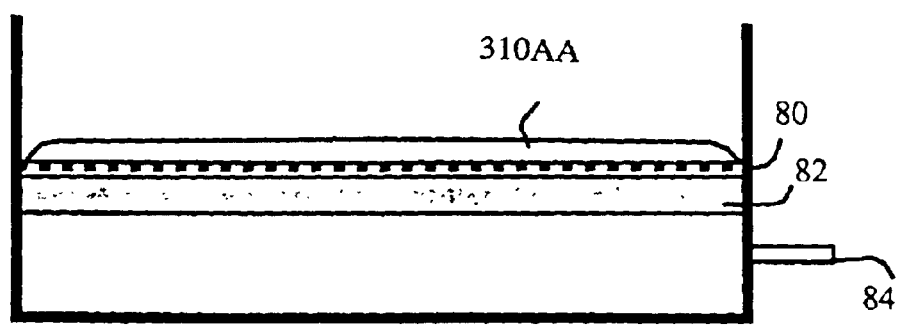
FIG. 8 illustrates an apparatus used in forming sintered disks.

The second process is to collect particles from an aqueous slurry by filtration, as shown in FIG. 8, using a filter support 82 and a membrane filter 80 in which a vacuum port 84 connects to a vacuum (not shown) to obtain a particle cake 310AA that will become the porous structure 310. The process works well for 1 micron particles, but the filter cake 310AA of 3-micron particles cannot be handled without crumbling like dry sand. Even if handled wet, the initial stages of sintering dry out the cake 310AA causing formation of cracks. This poor mechanical characteristic of the dry cake 310AA was solved by using a "binder" of silica gel. Frits were sintered at 1150C. without evidence of cracking. Three variations of the particle-gel frit disk process are described below for 3-micron silica particles:

A precursor silica gel was produced from 1 part TEOS, 2 parts ethanol, 0.2 part water, and 0.01 part 10% HCl under vigorous stirring. After gas bubbles cease, the precursor solution was stirred in a closed container for 2 hr. Filter cake samples were then obtained in a variety of ways, including:

1. A filter cake of 3-micron particles was collected as shown schematically in FIG. 8, but before thoroughly drying, two aliquots of the precursor solution were flushed through the filter cake;
2. an aliquot of precursor solution was added to an aqueous slurry of 3-micron silica particles and filtered as shown in FIG. 8; and
3. An aliquot of precursor solution was added to an ethanol slurry of 3-micron silica particles and filtered as shown in FIG. 8.

The various samples were then air dried for three days, and then air-fired at 1150C., with a ramp rate of 20C./min, and a 30 min hold at 1150C., and a cool down of 20C./min.

The processing steps are representative, though they are not optimized, and variations that produce more dense disks that can be used as porous structures 310, or disks that feature higher pumping capacity may result.

A third method of collecting silica particles in a cake by electrophoretically compacting the silica particles from an aqueous slurry can also produce a suitably structured porous element 310. This process is similar to that described above and in FIG. 8, except that an electric potential is applied across the filter and support, and the electric field exerts a large force on the ions in the solutions, leading to forces which help pack the particles into a dense disk.

Figure 9:
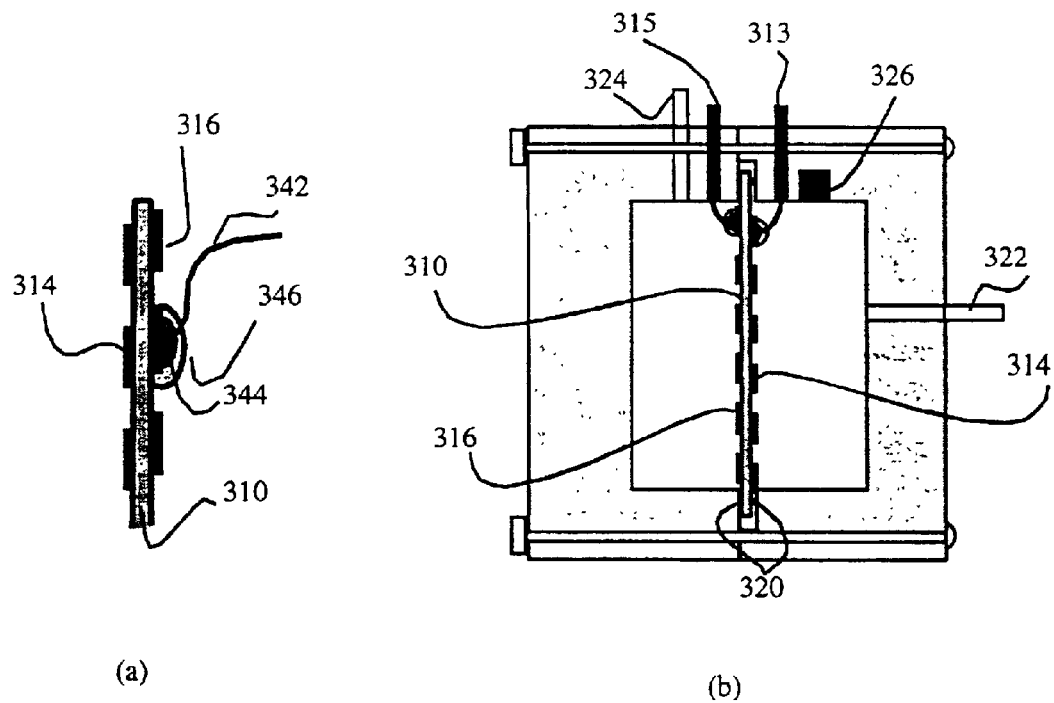
FIGS. 9A and 9B illustrate an electroosmotic pump using a sintered glass frit porous structure according to an embodiment of the present invention.

Key advantages of this general fabrication approach are controlled shape of the frit, controlled pore size, optimization of the flowrate and pressure, and simpler, more efficient surface chemistry. All of these advantages lead to more reliable operation of the EO pumps 300, and very inexpensive fabrication using inexpensive and widely-available materials Sintered Glass Frits Fabrication Process Another pump fabrication process is based on use of commercially-available ultrafine sintered glass frits, with the resulting sintered glass frit pump 300 being illustrated in FIGS. 9A and 9B. In this case, the ceramic disks are obtained in the correct size and shape. Preparation of the disks for the insertion on the pump 300 and assembly of the pumps 300 are described below:

1. 30-mm diameter, ultrafine glass frits are purchased from commercial suppliers, such as Robu, Inc. 4. Acrylic blocks are machined to produce cavities 312A and 312B and contain walls 318 that form the chamber 312. These cavities 312A and 312B are nominally cylindrically shaped, 4-mm deep and 4 mm in diameter. At least one through-hole is required in the edge of each block to serve as either the fluid inlet 322 or outlet 324. Each through-hole is currently a 3 mm hole into which a machined barbed fitting is epoxied, and to which inlet and outlet tubings are attached. A 0.5-mm hole is also provided in each acrylic block for feeding through and epoxy-sealing the Pt wire lead to each electrode. The surfaces of each block that are to be epoxy-sealed are abraded with 180-grit abrasive to promote epoxy adhesion.
2. A 2×4 mm piece of mesh catalyst is inserted into the anode compartment, typically across the compartment from the inlet.
3. The Pt wire leads 342 are inserted into their respective holes in the anode and cathode compartments as the electrode frit is assembled between the two acrylic blocks, and the assembly clamped together with a C-clamp. Water resistant epoxy is used to seal 320 the joint between the acrylic and the ceramic disk. Since the acrylic is drawn into the pores of the ceramic disk, only a light epoxy coat is applied at first, then followed within an hour by a second heavier coat of epoxy to strengthen the bond between the acrylic and the ceramic disk.
4. The pump 300 is primed for operation by vacuum filling through the inlet port 322.
5. The pump 300 is operated by attaching a DC power supply, with the positive electrode (anode 314) at the inlet 322 side, and ground (or cathode 316) at the outlet 322 side of the pump 300.
6. To facilitate gas bubble advection into the flow and the collection of gas at the recombiner 326, the pump 300 is oriented so that buoyancy of the gas bubble favors the advection and collection.

Deposition of Electrode Metal on Pump Structure Itself

This variation of the pump electrodes described above uses the deposition of electrode metal on the surface of the porous dielectric frit pump material. As-received frits are ground and polished with sequentially 120, 180, 240, 322, and 600 grit abrasive to obtain a porous ceramic structure 340. The objective is to remove gross surface irregularities from the frit manufacturing and provide as flat a surface on the interconnected grains as practical for the purpose of interconnecting "islands" of metallized glass grains.

1. Thin metal films are deposited as patterned electrodes 314 and 316 on opposite faces of the large surfaces of the ceramic disks. These films consist of e-beam evaporated layers of 40 nm Ti and 100 nm Pt. The Ti layer is a typical adhesion promoting film, and the thickness of the Pt inert electrode film is a compromise between stress, electrical conductivity, step coverage, and blockage of surface pores.
2. 10-mil Pt wires 342 are Ag-epoxied using epoxy 344 onto the Ti—Pt films to make electrical leads through the wall of the package. The Ag epoxy is protected from anodization by overcoating with clear water-resistant epoxy 346.

Anodized Alumina Pump Fabrication Process

This approach describes an alternative structural form of porous alumina, exemplified by Anopore filters. These filters are 70 microns thick and are made by anodizing aluminum sheets. This invention includes two improvements to the commercially-available anopore filters to make them suitable for EO pumps 300. The first is to use oxalic acid as the anodizing medium. The resultant mixed surface oxide-oxalate can be calcined to form only the oxide that will have a simpler surface chemical characteristic. The conversion of oxalates to oxides is a well-know ceramic technology. The second improvement is to anodize substantially thicker aluminum layers to increase the pore length to several hundred microns, thus increasing the hydraulic resistance and maximum pressure the pump 300 can generate. The thicker porous films will also be mechanically much stronger than the existing filter structures.

Key advantages of all the above-mentioned approaches over existing approaches for the formation of porous structures that could be used as porous structure 310 include formation of an optimum flow structure of parallel pores which reduces the "tortuosity", formation of pumping structures are very flat, ensuring that deposited metal film electrodes will be interconnected, and low cost since 25-mm diameter filters retail for $1 after a polypropylene supporting structure has been (thermally) bonded.

FIG. 10 shows a modification pump 300 that uses porous frits as described above. In this modification, however, pump 300 uses a set of support structures 350 that are attached to the left and right half of the enclosure provide mechanical support to the porous pumping structure. One of the important characteristics of the pump is that the force generated on the fluid is proportional to the potential across the pump and to the density of the charged layers on the surfaces within the porous structure. The flow rate through the pump is increased if the thickness of the porous medium can be reduced, but this medium is required to withstand the pressure difference. A large area, thin structure would, in general, fail under high pressure differences. To address this, as shown in FIG. 10, support structures 350 can be fabricated that extend from one half 312A of the enclosure that forms the pumping chamber 312 to the other half 312B of the enclosure. These support structures 350 can be shaped as pillars or beams extending across one dimension of the structure, and provide only points of mechanical support without substantially impeding the flow of fluid to and through the porous pumping structure 310.

The electroosmotic pump 300 described herein offers unique capabilities for the generation of large volume flow and large pressure within a compact package that consumes little power and has no moving parts. However, this pump 300 includes some complexities that must be managed. For example, the application of potential and current to the solution in the pump 300 necessarily causes electrolysis, and the gas generated in this process must be managed. One option is to simply let the gas escape from the system along with the pumped fluid, as is described with reference to FIG. 21 hereinafter. In such a system, the fluid is gradually depleted, and this can be tolerated for systems that are only used some of the time. Otherwise, the fluids must be replenished. A second complexity is the management and control of the flow of electrolysis gas bubbles and gas slugs in the liquid flow lines. To this end, we have devised the application of gas permeable membranes which can be used to separate electrolytic gases and redirect them to the recombination chamber. A third complexity is the optimization of working liquid as the pump characteristics are a function of the type of ions used, ion concentration, pH of the solution, and temperature.

In general, however, it is preferable to recapture the gas, and recombine it to recover the fluid. FIGS. 10(a–b) illustrate a system in which hydrogen gas from the cathode 314 passes through the outlet 324, through the loop and arrives at the anode 316. Oxygen generated at the anode 316 is combined with the hydrogen on the surfaces of a catalytic recombiner 326. Rather than let the hydrogen gas pass through the loop (where gas bubbles can cause pressure and flow variations), it is advantageous to capture this gas in the cathode chamber 312a, and return it directly to the anode chamber 312b.

Figure 11:
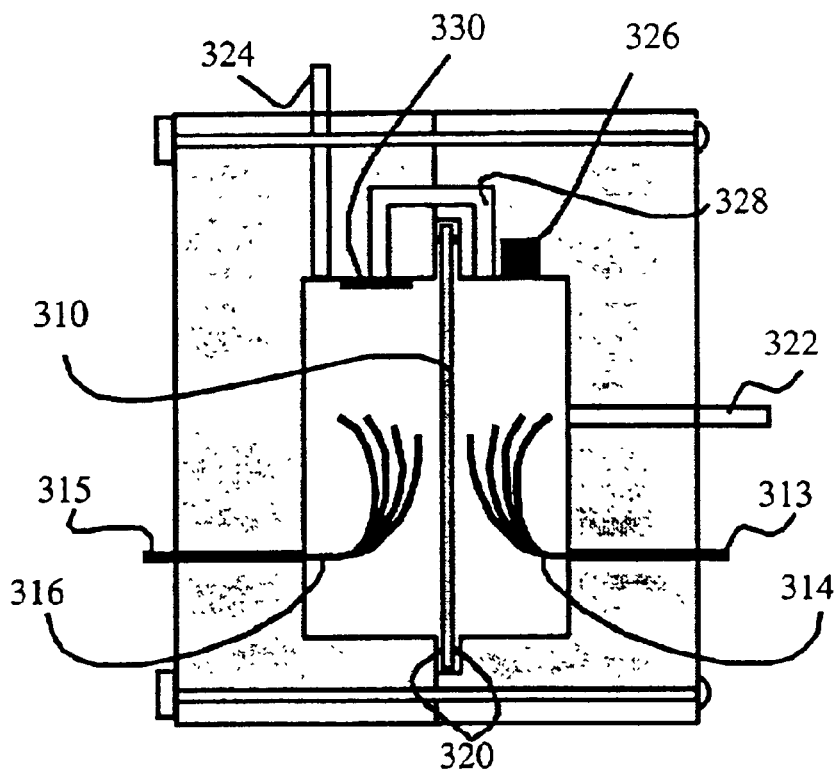

FIG. 11 illustrates an embodiment of the pump 300 that has been modified to provide for gas delivery to the anode chamber 312b. A channel 328 in the support structure is formed to allow this gas to pass, and a semi-permeable membrane 330 is positioned so as to block the flow of liquid while allowing the flow of gas. In practice, there are many possible geometric arrangements of the channel 328 and the membrane 330 that accomplish the movement of the gas and the opportunity for recombination. FIG. 11 shows a pathway up and around the porous pumping structure with a single porous membrane 330 at the cathode chamber 312a. It is possible to position this membrane 328 at the anode chamber 312b, in the channel 328, such as at the joint between the two halves of the enclosure, or elsewhere.

Figure 12:
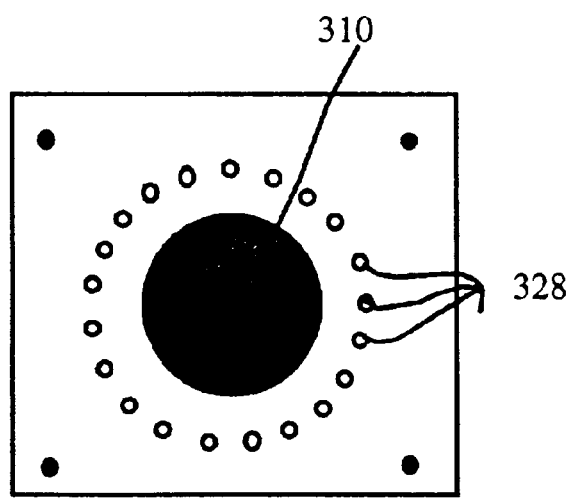
FIG. 12 illustrates a side view of an electroosmotic pump according to the present invention and positioning of thru-channels on all sides of the porous structure.

FIG. 12 illustrates a preferred embodiment in which a number of such channels 328 are positioned circumferentially around the pumping structure to allow the gas access regardless of the orientation of the pump 300 relative to gravity. For example, FIG. 12 shows such a possible arrangement.

Figure 13:
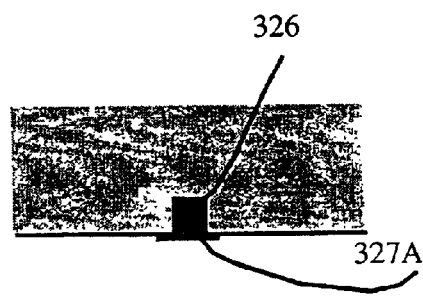
FIGS. 13 and 14 illustrate embodiments of membranes used to cover a catalytic recombiner.
Figure 14:
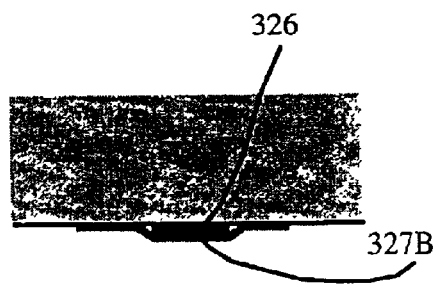
Figure 16:
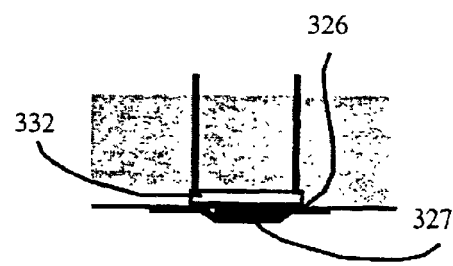
FIG. 16 illustrates the usage of a heater with a catalytic recombiner.

In some cases, the material used for the recombiner 326 catalyst suffers from reduced efficiency if it comes into contact with the fluid. In these cases, a semi-permeable membrane may be used to isolate the recombiner 326 from the liquid in the pumping chamber 312. FIGS. 13 and 14 shows two possible arrangements for the recombiner 326 that use semipermeable membranes 327A and 327B, respectively, and perform this isolation function. In addition to using such a membrane 327, alleviating this problem or allowing for a fast recovery of the performance of the recombiner catalyst can also use a heater 332 to provide heating of the catalyst, as shown in FIG. 16. This heater 332 can be used to keep the recombiner 326 warm at all times, or to pulse-heat the recombiner 326 if necessary to achieve drying or performance enhancements. As discussed hereinafter, it is also possible to employ a combination of pressure sensors and thermometers to diagnose the condition of the cooling loop and of the pump 300. If, for example, pressure increases are detected, this may indicate that the recombiner 326 has become wet or needs to be rejuvenated. Application of steady heat or a brief heat pulse using the heater 332 may be used to restore the performance of the catalyst in the recombiner 326.

There are several possible material choices for the membranes 330 and 327. What is needed is a film with a dense fiber structure that allows the passage of gas while blocking the passage of water. An example material is the Gore-Tex material used in outdoor garments—these materials are known to block the passage of water while allowing the passage of vapor.

Figure 15:
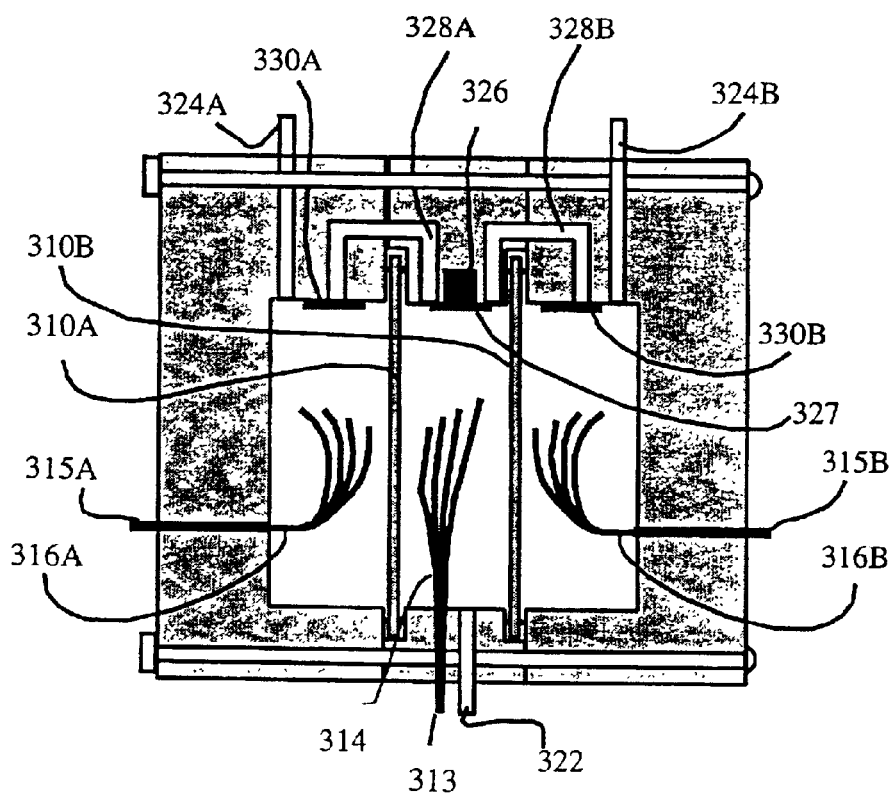
FIG. 15 illustrates an embodiment of a dual electroosmotic pump.

Another significant embodiment of the EO pump 300 is the use of more than a single porous structure 310 to generate flow to the micro heat exchanger 200. FIG. 15 shows one specific embodiment that includes a pair of porous structures 310, and pumps fluids from a single inlet 322 to a pair of outlets 324A and 324B. The flow from these two outlets 324A and 324B can be recombined to pass through a single fluidic loop, or they may be kept separate. The potentials applied to the two cathodes 316A and 316B, via electrodes 315A and 315B are not required to be the same, so this design is capable of independent control of fluid flow through a pair of cooling loops using a common anode 314 with electrode 313 and shared pumping region. This double pump architecture can also serve as a high-displacement version of the basic pump described previously. By combining the flow from the two outlets 324A and 324B, this embodiment of the pump 300 is capable of twice the volume flow of any single pump, while generating the same high voltage and operating at the same voltage. Alternatively, this arrangement can be considered as a primary pump and a back-up pump, in which one half of the pumping structure is only activated after indications of failure are recorded in the performance of the other half of the pump.

Combinations that include more than a pair of pumping structures are also possible. The use of a pair is a preferred embodiment because it is possible to position a single pair of pumping structures in close proximity to one another, allowing a 2× flowrate pump with little additional total pump volume or mass or cost. The inclusion of a second pump enables additional scenarios in which the two halves of the pump are used independently to achieve complicated flow control.

Microfabricated Slit Pump

Figure 17:
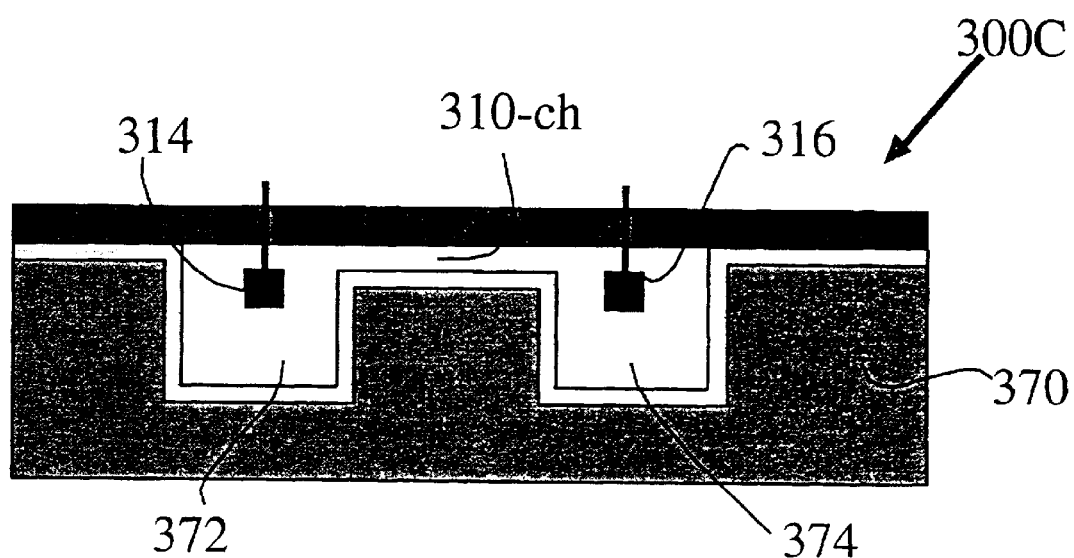
FIG. 17 illustrates an embodiment of a microfabricated electroosmotic pump.

The micromachined slit pump 300C illustrated in FIG. 17 consists of a layered-version of the EO pump 300 in which very thin planar channels 310-CH (which correspond to the channels that naturally exist within the porous structure of the above-described embodiments) are formed by etching a shallow channel 310-CH in one substrate 370, which is then coated with an insulating layer, such as an $Si_3N_4$ layer, and then bonding a second glass layer 380 having a planar surface wafer to seal the narrow channels 310-CH. Alternatively, very thin planar channels oriented perpendicular to the surface of the substrate 370 may be etched into the substrate 370 to connect the inlet 372 and outlet 374 chambers. Deeper recesses are formed to provide inlet 372 and outlet 374 chambers, and to allow placement of electrodes 314 and 316 therein. Microfabricated electroosmotic pumps 300C typically generate fluid flows of less than 1 mL/min because the total cross-sectional area of the fluid pathways is substantially less than that of other versions of the EO pump 300. The missing flow can be recovered by providing a number of pumps 300C operating in parallel on the same substrate.

Aerojel Pumping Element

This approach relies on an alternative structural form of porous silica, called an aerogel. The key advantages of this material for formation of EO pumps 300 is the very high porosity, so it has a much higher electroosmotic flowrate and much lower mass (weight). Also, there is potential for casting of the aerogels into desired shapes; possibly onto electrode structures. These materials can also withstand high temperature processing.

Optimization of the Working Fluid of the Pump

Water, preferably De-Ionized Water ("DI") water, is the current working fluid for electroosmotic pumps 300. In addition to the excellent thermal properties such as a high latent heat of vaporization, water also supports electroosmosis and its electrolysis products, hydrogen and oxygen gas, can be conveniently recombined with a catalyst.

Figure 50:
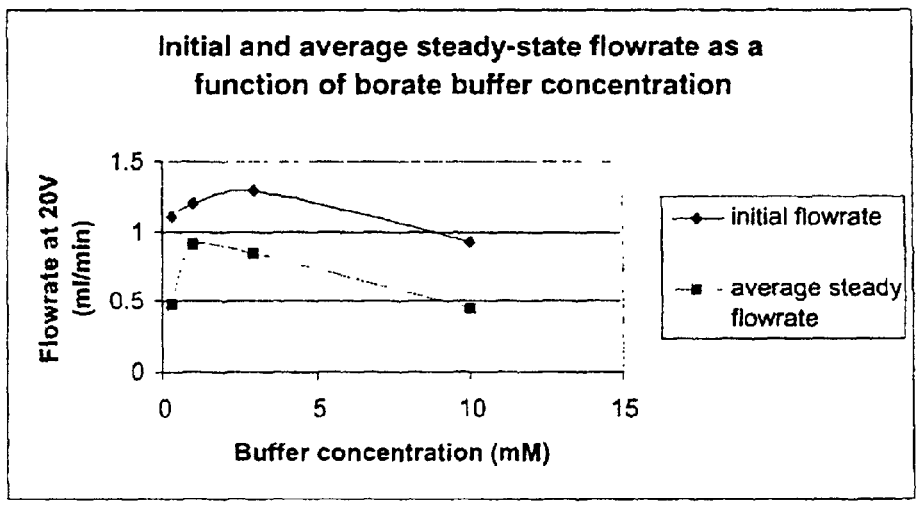
FIG. 50 illustrates a table illustrating flowrates as a function of the fluid being used.

The performance of pump 300 has been optimized by varying the composition of the aqueous working fluid. An example of such optimization is shown in FIG. 50, where the initial and average steady-state flowrates are plotted vs. concentration of sodium borate disposed therein. The peak performance is near 3 mM of this electrolyte. It is possible that the optimum performance of another electrolyte may occur at a somewhat different concentration, since the chemical reason why the flowrate can be affected by electrolyte composition and/or concentration is not completely understood.

It may be important, however, that the electrolyte either be electroinactive, or completely reversible, so that an electrolysis by product does not build up over time. For example, chloride ion electrolysis will produce chlorine gas in place of oxygen at the anode, and our catalyst probably does not recombine chlorine with hydrogen. Furthermore, the dissolved chlorine is a much more corrosive working fluid than one containing dissolved oxygen gas.

Another reason why sodium borate was chosen is that it represents two of the three main constituents of the glass material from which the porous polymer frits have been fabricated. Thus, the electrolyte also tends to suppress dissolution or transient chemical modification of the porous medium. Another similar electrolyte might be better at providing a stable, electroosmotically-active, surface to the porous medium.

Figure 51:
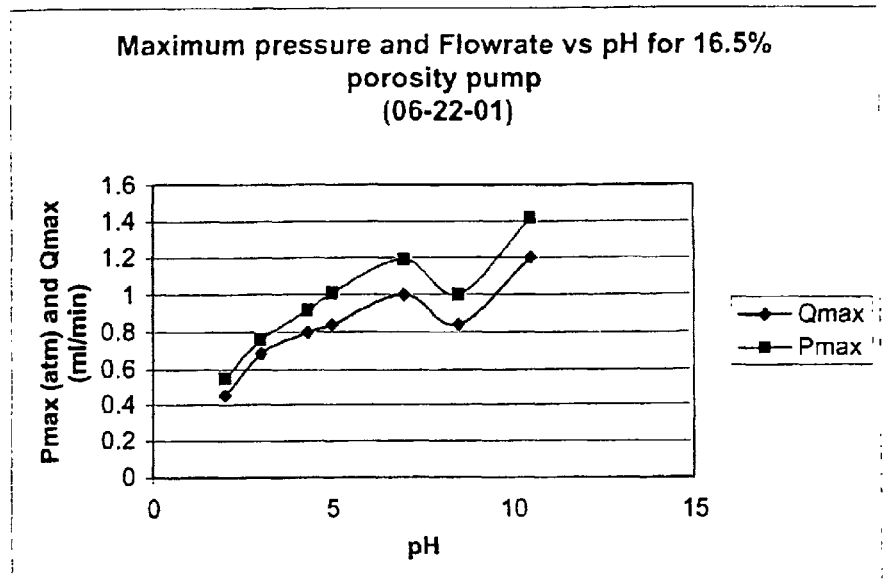
FIG. 51 illustrates a table illustrating flowrates as a function of the pH of the fluid being used.

Another feature of an optimized working fluid is control over pH, especially to suppress the acid-generating property of the anode compartment. The reason the suppression of low pH is important is that the electroosmotic flow dramatically decreases with lowering pH, as shown in FIG. 51.

Integrated Systems

Figure 18:
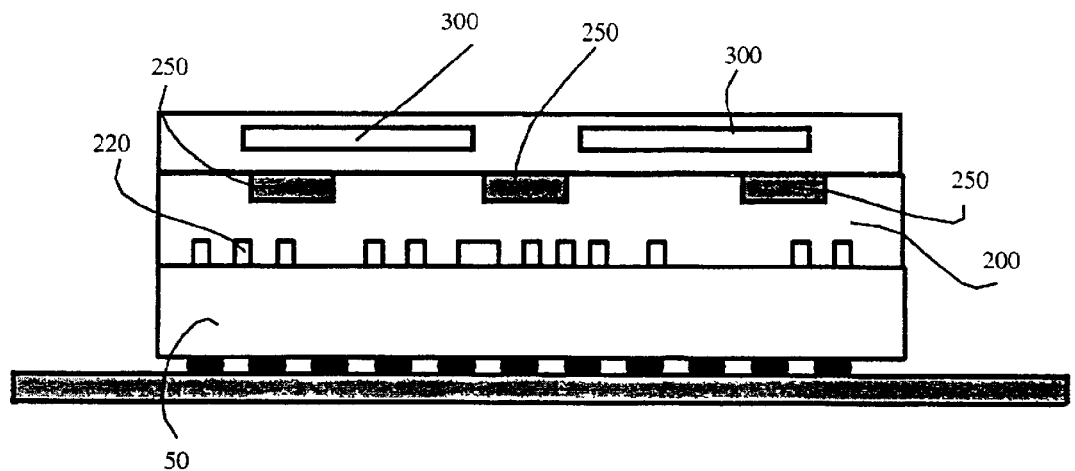
FIG. 18 illustrates an embodiment of an integrated microchannel structure and electroosmotic pump.

The development of the individual components 200, 300, 400 and 500 of this invention has been discussed above. The present invention, in another aspect, integrates elements, particularly the micro-heat exchanger 200 and the electroosmotic pump 300, and also preferably the controller 500, into compact modules that can provide integrated thermal control. One embodiment of this invention is the development of an integrated microheat exchanger 600 as shown in FIG. 18 above. This module contains the microheat exchanger channels 220 as discussed above, and includes temperature sensors or thermometers 250 to measure the temperature distribution, and includes a microfabricated EO pump 300, all within a compact package. It may also include other types of sensors, such as pressure and flow type sensors.

The microchannels 220 within this arrangement can be fabricated as described above. Thermometers 250 can be easily integrated either by attaching discrete miniature resistance thermometers, or by integrating thermometers within the structure by light doping of regions of the silicon structure. Lightly-doped silicon can be used to detect temperature accurately by measurement of the resistance, or by formation of a current-biased diode, and measurement of the forward voltage drop. In either case, these thermometer elements 250 can be fabricated using the same lithography, deposition and etching tools used for formation of the microchannels 220 within any standard MEMS foundry. These thermometers 250 enable local, accurate measurements of the temperature near the device 50, and allow the pump pressure and fluid flow rate to be adjusted to regulate the device temperature within specified limits.

Furthermore, an EO pump 300 with a microfabricated structure-can also be integrated, typically a smaller EO pump due to size limitations. The micromachined "slit-pump" 300 C described above in FIG. 17 is intended as one version of the EO pump 300 that can be fabricated entirely from microfabricated silicon structures, and would be compatible with the fabrication of the other thermometers 250 and microchannels 220 described herein. A preferred embodiment of an integrated cooling module that would include a micro heat exchanger 200, a set of integrated thermometers 250 and integrated EO slit pumps 300 is shown in FIG. 18. In some cases, this degree of integration will reduce the overall complexity of the installation, and might result in reduced manufacturing cost. Integration of the controller 500 with this structure is also possible.

Other designs of the closed-loop cooling system 100 are also contemplated.

Figure 19:
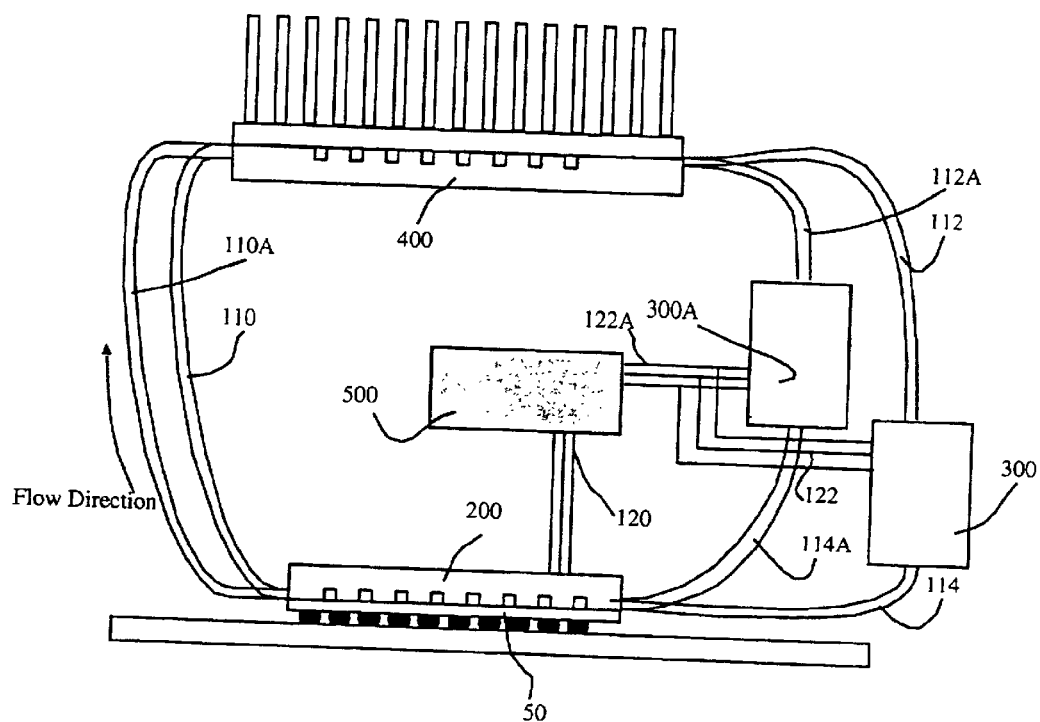
FIGS. 19 and 20 illustrate other embodiments of a closed-loop cooling system.

FIG. 19 shows a modified schematic for a closed-loop cooling system 100. In this embodiment, there are 2 separate fluid paths through the system, as shown by the fluid lines 110, 112, and 114 being one path, and the fluid lines 110A, 112A, and 114A being another fluid path. The flow through these paths can be independently controlled by different potentials to the different electrodes within the two pumps 300 and 300A, and thereby regulating the current through each pump 300 and 300A using the signals supplied by controller 500 via signal lines 122 and 122A. An advantage of such a system 100 is that it becomes possible to independently regulate the temperatures of multiple regions of the device 50 in response to varying distributions of heat generation. For example, the device 50 may be a microprocessor with some regions generating heat at a steady rate, and other regions generating heat at a rapidly-varying rate. This configuration allows independent control of the coolant through separate regions of the device 50, and can maintain overall thermal uniformity in the presence of these spatial variations in heat generation.

Figure 20:
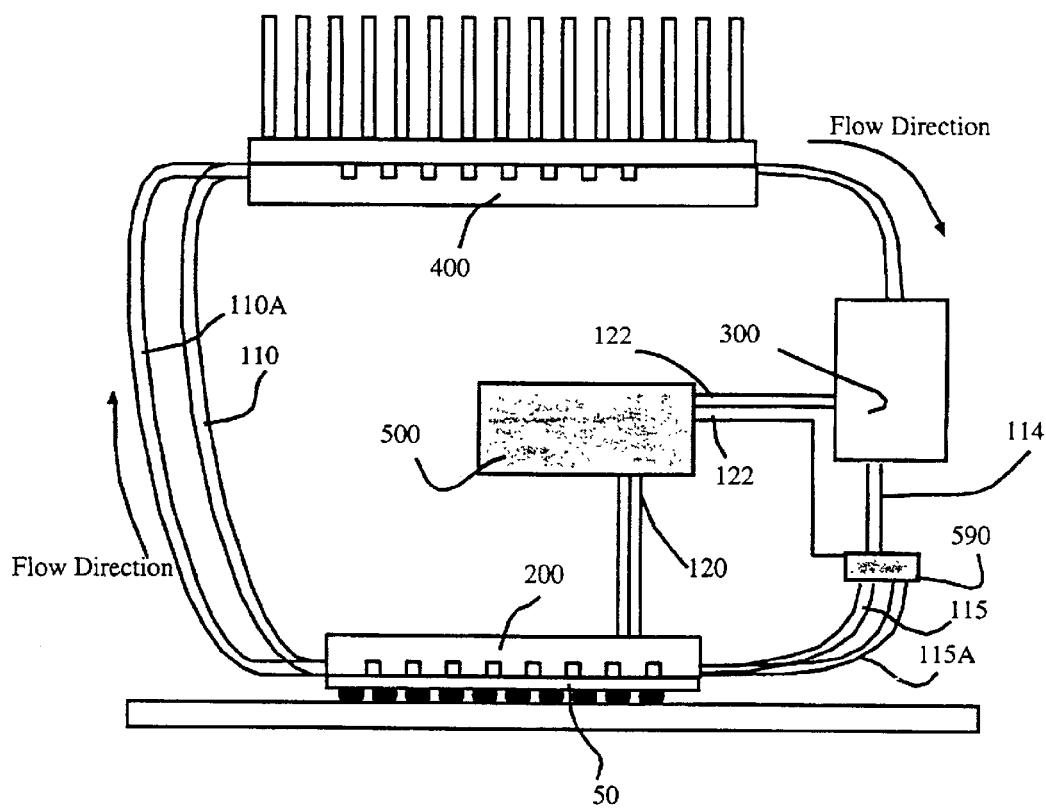

In another variation, which can also be extended to use more than the single pump illustrated, the fluid from any single pump 300 may be divided into more than one flow path before entering the device 50, or after entering the device 50, and that the fraction of the flow into these separate pathways might be altered by valves or other methods of dividing flow. FIG. 20 shows an embodiment of this system 100 in which a single pump 300 causes fluid flow through two separate pathways, one using fluid lines 110 and 115 and the other using fluid lines 110A and 115A through the loop, and a flow divider 590 is used to determine how the output of the pump 300 is divided between the two paths. In this drawing, the fluid paths are separate at the entrance and exit of the micro heat exchanger and combined within the macro heat exchanger. Obviously, it is possible for the fluid paths to be separated at any location before or within the micro heat exchanger 200, and for them to be recombined at any location within either the micro heat exchanger 200, the macro heat exchanger 400 (as shown), or at the inlet to the pump 300.

Figure 21:
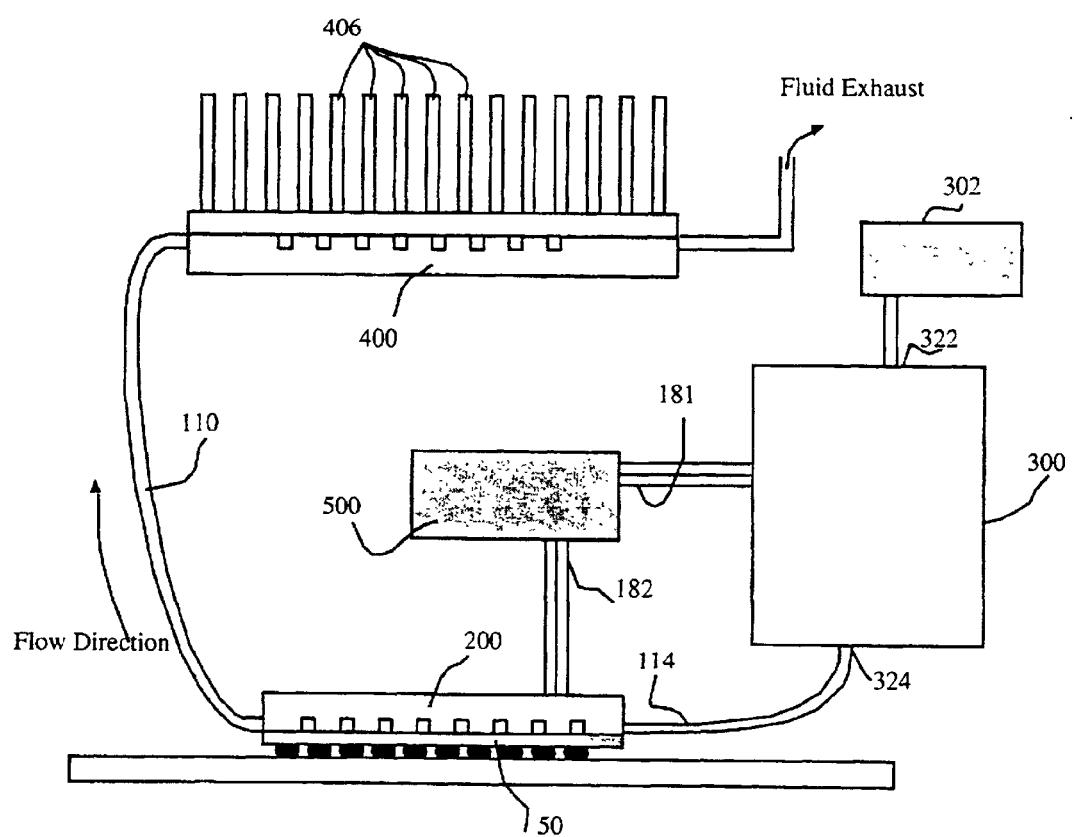
FIGS. 21 and 22 illustrate other embodiments of an open-loop cooling system.

In addition to the closed loop cooling architectures described previously, an embodiment of the invention uses an open loop configuration in which the cooling fluid is drawn from a reservoir and exhausted away from the system after a single pass through the loop. FIG. 21 shows such a system in which fluid is taken from a reservoir 302, draws it into the loop through the pump 300, then through the microheat exchanger 200 and then through a macroheat exchanger 400 before the fluid leaves the system to some waste receptacle. While such a system is not ideal for many self-contained applications, there are many other applications that have routinely tolerated the use and rejection of cooling water from external sources. The pumps and heat exchangers described herein can be combined with such an architecture to achieve specific advantages, such as increased pressure, and control of fluid flow.

Figure 22:
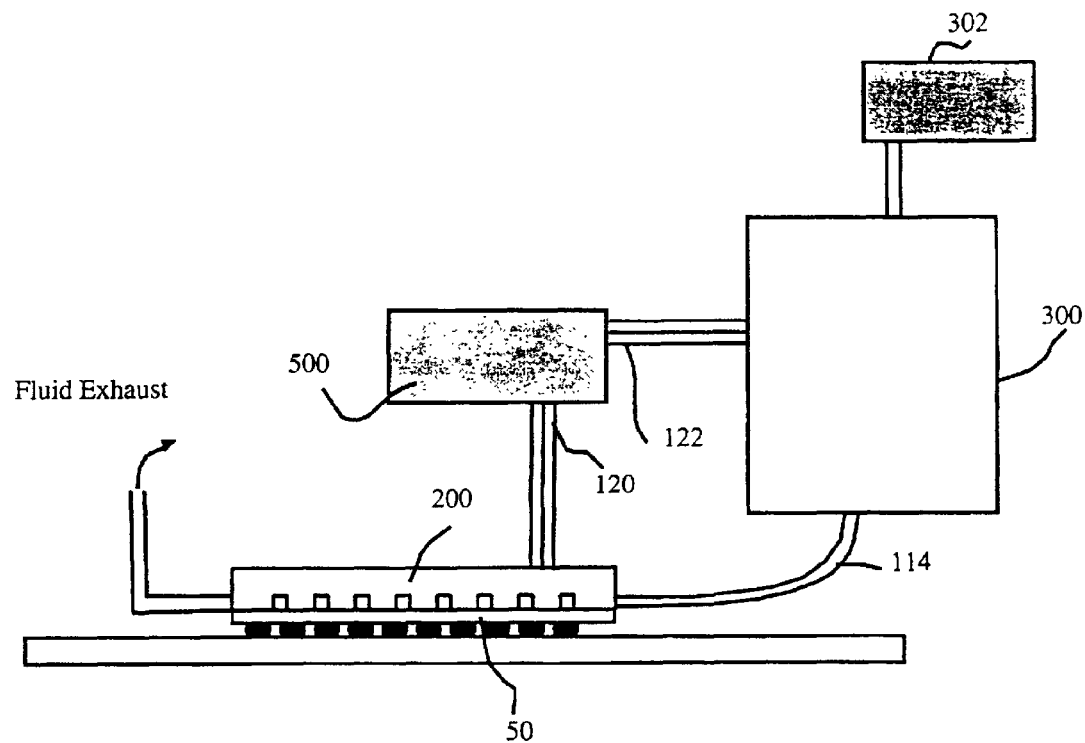

FIG. 22 shows a variation of this system in which the macroheat exchanger 400 is not included, and the exhaust from the microheat exchanger 200 is heated fluid and vapor. This heated fluid is delivered to a waste receptacle, including the heat that is carried with it. The elimination of the macroheat exchanger 400 will be seen as an advantage in some applications.

Figure 23:
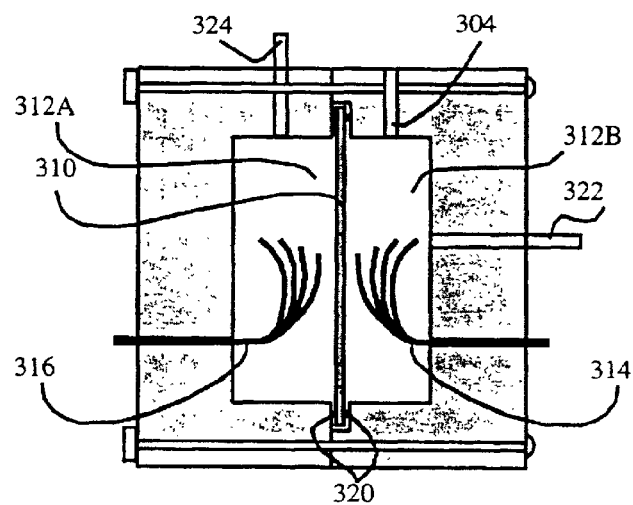
FIG. 23 illustrates another embodiment of an electroosmotic pump.

In a specific open-loop embodiment as shown in FIG. 23, an electroosmotic pump 300 is shown in which the gas generated by electrolysis on the anode side of the pump is allowed to escape to the surroundings. In some cases, it is necessary to recapture this gas and recombine it to form fluid and retain all the fluid in the system. However, there will be other applications in which there is no need to recover the gas. It is necessary, in this case, to provide a vent of some type for the gas to escape the pump 300. On the anode side 312$a$ of the pump 300, the gas generated cannot pass through the porous structure 310, so it is necessary to provide a vent 304. On the cathode side 312$a$, the gas can escape with the fluid through the outlet 324 as shown, or it can be vented as well. If the gas generated on the cathode side 312$a$ passes through the rest of the cooling system, it will eventually arrive at the anode side 312$b$ of the pump 300, where it might recombine or it might escape through the vent 304.

Figure 24:
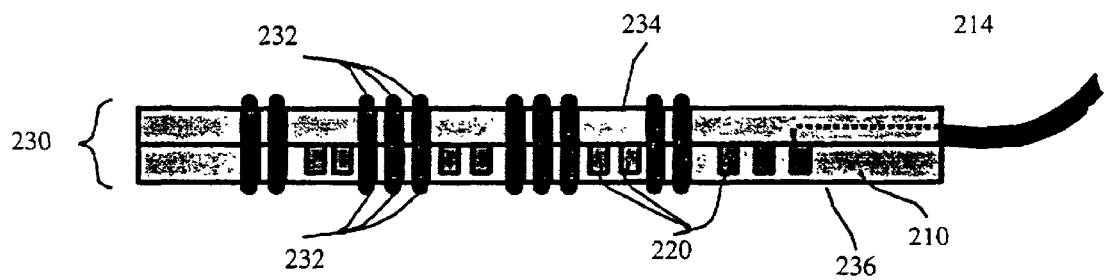
FIG. 24 illustrates another embodiment of a microchannel structure.

FIG. 24 illustrates another embodiment for a micro heat exchanger 200, in which each cooling layer 230, previously illustrate and discussed above with respect to FIG. 3B as being formed by layers 210 and 214, is interwoven with electrical interconnects 232, most of which are preferably vertical. These vertical interconnects 232 can be used to allow electrical contact to the upper surface of a device 50, and also provide thermal cooling at that surface. This structure is useful, since in many applications it is important to make electrical contact to the device 50 with electrical contacts using the same surface that is being used to establish cooling. Examples of such devices 50 that can benefit from optoelectronic devices, integrated circuits that are patterned on both sides of the silicon wafer, or multi-layer, mixed-signal systems, such as those being contemplated in proposals for single-chip radio. As shown in FIG. 24, the vertical electrical interconnects 232 transfer electrical signals from the top surface 234 of layer 214 to the bottom surface of the layer 210, and includes lateral fluidic channels 220 for efficient removal of heat from one or both surfaces.

FIG. 25 illustrates an exemplary integration of such a heat exchanger 200 within a multi-layer electronics stack that contains an interface board 244, a motherboard 246 and wirebonds 248, as might be envisioned for a 3-D mixed-signal system. The integration of cooling layers 230 within 3-D integrated systems can significantly assist in dissipating heat as the density and power consumption of these devices increases. Placement of the cooling layers 230 within the 3-D structure much more efficiently allows for thermal conduction, since ordinary thermal conduction through all the layers to the surfaces is inefficient, and the outside surfaces, such as 240 and 242 shown, will become increasingly important for electrical, optical and RF access to the system.

Figures 26A, 26B:
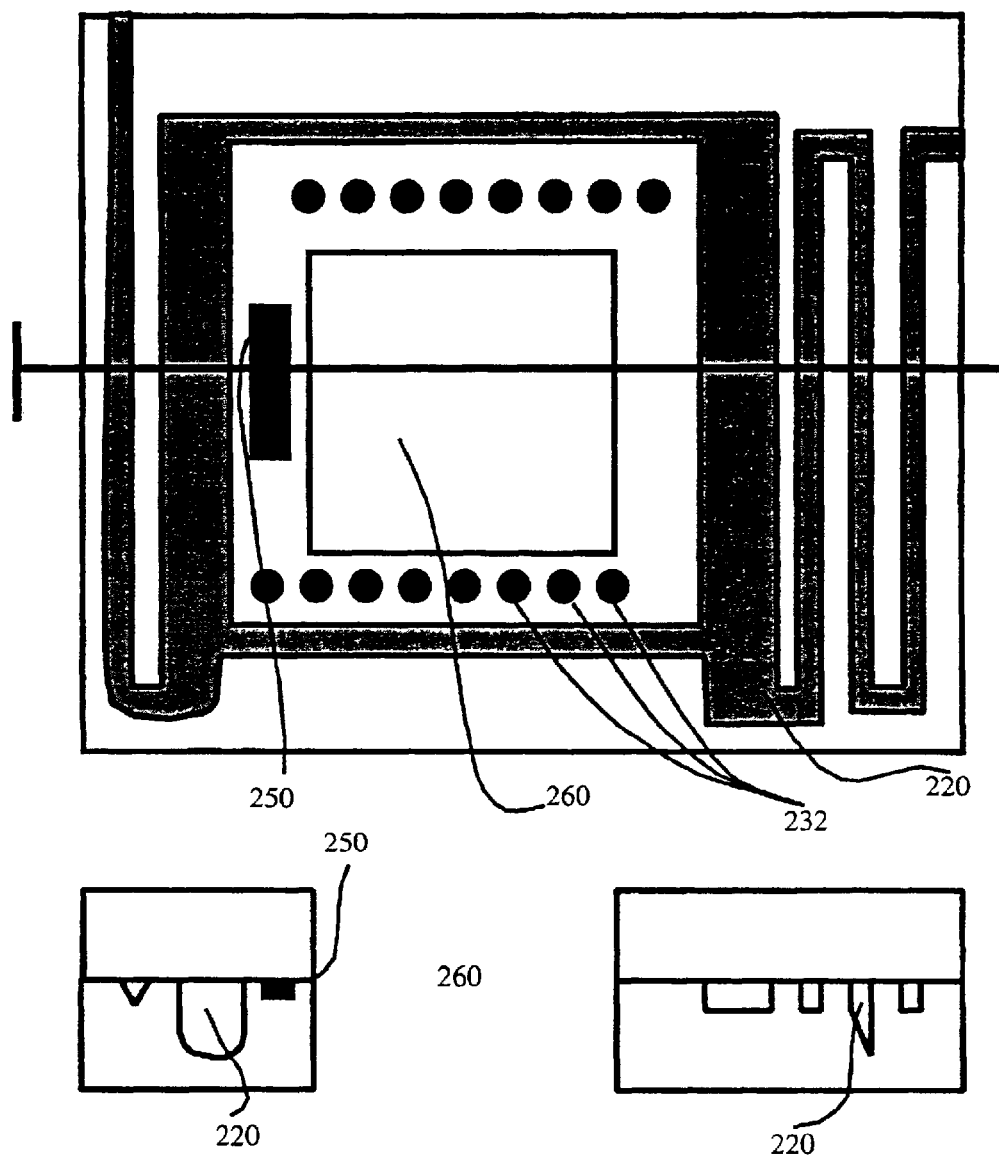
FIGS. 26 and 27 illustrate other embodiments of a microchannel structure that contains openings for other access to an attached heat generating device.

FIGS. 26A and 26B show another microheat exchanger 200 with another arrangement for cooling layer 230 that contains electrical interconnects 232 as described above. In this embodiment, the cooling layer 230 contains an opening 260 through the microheat exchanger 200 provides a space for the device 50 to be accessible to optical, electrical, or other interactions with the open region above the opening 260 of the micro heat exchanger 200. Such other interactions include pressure, sound, chemical, mechanical force, or electromagnetic field interactions. The annular-shaped microheat exchanger still provides for thermal and electrical connection to the device 50, as well as provides for other types of connection to the device 50. Having such an opening 260 can be important, since the cooled surface of the device 50 may work better if it is accessible to external stimuli. For example, a diode laser might require cooling off of the optically active surface as well as optical access to the emitting region of that surface.

Figure 27:
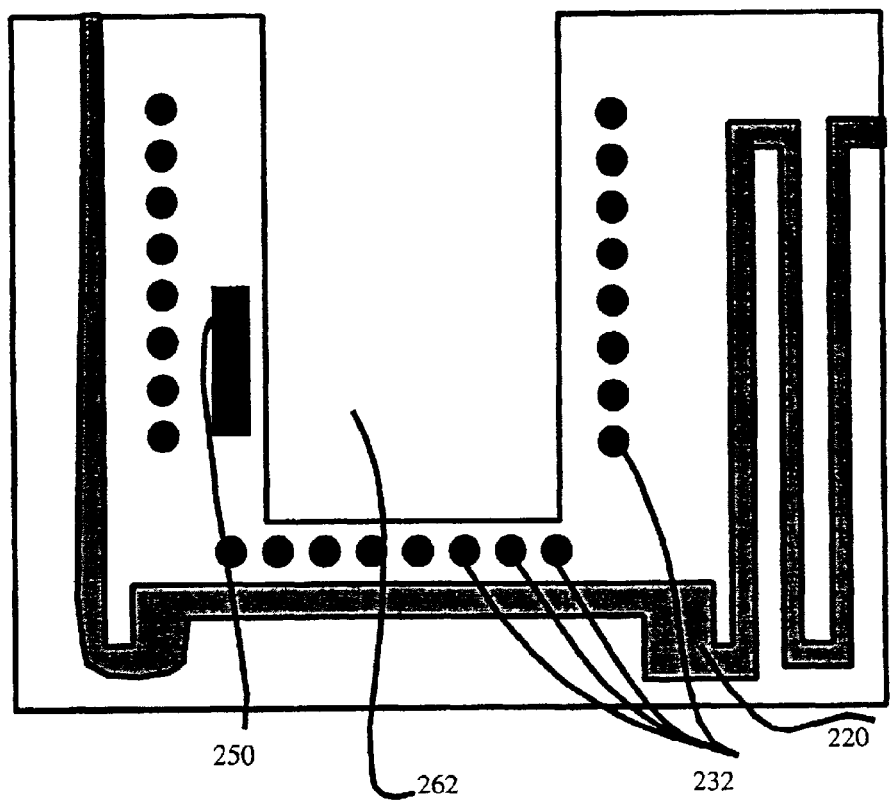

FIG. 27 shows another possible embodiment to the microchannel heat exchanger, in which the access to a region on the top surface of the device 50 is provided by a "C-shaped" opening 262, which performs the same function as the opening 260 described above.

Figure 28:
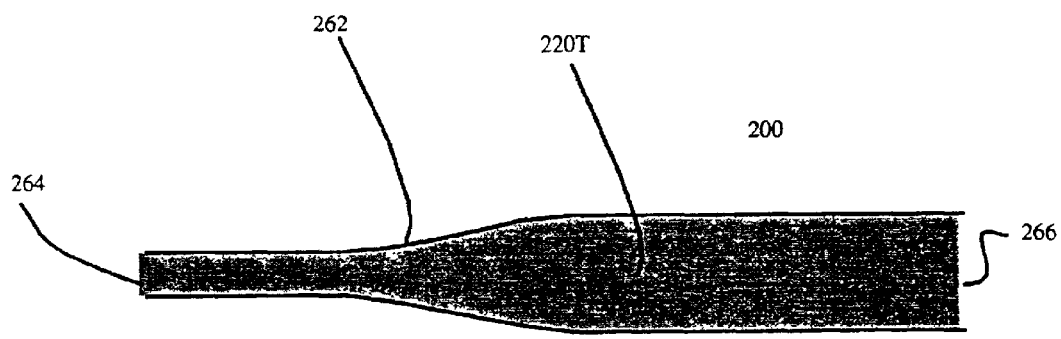
FIG. 28 illustrates an embodiment of a portion of a microchannel structure.

FIG. 28 illustrates a tapered channel portion 220T that can be use in the microheat exchanger 200, which allows advantages that will now be described. Such a tapered channel portion 220T is also illustrated in FIG. 3A discussed previously.

Another advantageous feature of this invention is tailoring the geometries of the microchannels 220, such as illustrated in FIG. 3A, in the micro heat exchanger 200 to optimize the thermal characteristics. As an example of this feature, it is possible to predict the inlet fluid temperature, and the spatial distribution of heat generation on the device 50. In order to achieve a uniform temperature across the device 50, it is necessary to match the spatial distribution of the heat transfer to the fluid to the spatial distribution of the heat generation. As the fluid flows through the microchannel 220, its temperature increases, and as it begins to transform to vapor, the fluid undergoes a significant expansion, resulting in a large increase in velocity. Generally, the efficiency of the heat transfer from the walls 262 of the microchannels 220 to the fluid is improved for high velocity flow. Therefore, it is possible to tailor the efficiency of the heat transfer to the fluid by adjusting the cross-sectional dimensions of the microchannels in the micro heat exchanger. FIG. 28 shows a microchannel 220 that starts out with a small cross sectional area at the inlet 264 (to cause high velocity flow near the inlet 264), and then expands to a larger cross-section at downstream outlet 266 (to cause lower velocity flow). This specific design might represent a design in which there is higher heat generation near the inlet.

In addition, it may be advantageous to design for a larger cross section for the regions of the microchannel 220 where a mixture of fluid and vapor is expected, because the volume increase associated with the transformation from liquid to vapor causes great acceleration and a resulting increased velocity. In this case, a design similar to that shown in FIG. 28 would be appropriate to accommodate a partial transition from fluid to a mixed fluid/vapor state as the fluid moves from inlet 264 to the outlet 266. In addition, it can be advantageous to have channels widen and then narrow again, thereby achieving reduction and then increase in the velocity of the fluid at different places in the microheat exchanger. As shown in 3A, it may be appropriate to vary the channel dimensions from large to small and back again many times over in order to tailor the heat transfer efficiency to the expected heat dissipation distribution across the device. In general, narrower cross-sections will lead to higher fluid velocities, and more efficient heat transfer.

Figure 29:
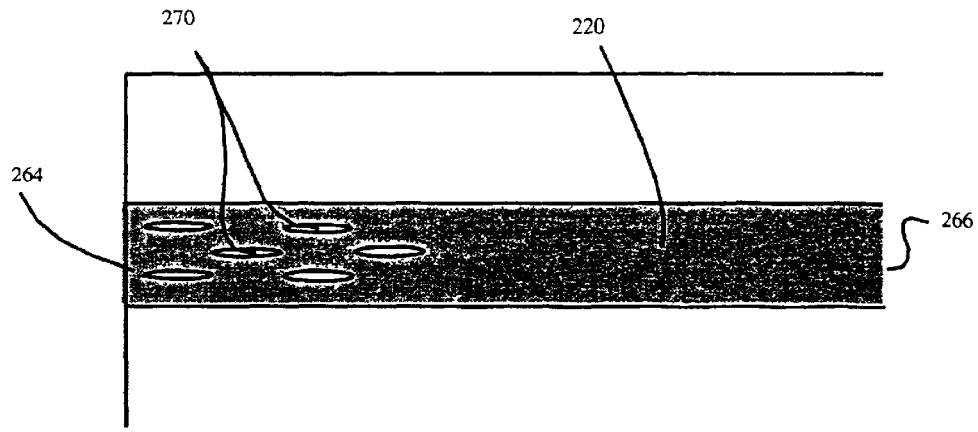
FIG. 29 illustrates an embodiment of a portion of a microchannel structure containing a partial blocking structure.

Velocity and efficiency of the heat transfer can be increased in other ways, including introduction of extra structures 270 in the channel 220 in the region where increased velocity is desired. FIG. 29 shows such a design, in which a number of structures 270 are left within the channel 220 to partially block the flow. These structures 270 cause the fluid velocity to increase in this region because the remaining cross-sectional area of the channel 220 is reduced, thereby increasing the efficiency of the heat transfer in this region. In addition, the increased effective surface area of the channel 220 is increased because the surfaces of these structures increase the total surface area in contact with the fluid, thereby further increasing the efficiency of the heat transfer from the device 50 to the fluid.

A specific advantage of microfabrication methods for fabrication of channels 220 in the micro heat exchanger is that the introduction of small design features such as a tapered channel 220T having variable width or using structures 270 inside of a channel 220 is possible. Minimum feature sizes near 1 micrometer are possible, enabling very precise control of the shapes of the channels 220 and the partial blocking structures 270. Aside from adjusting the width of the channel 220 or inserting partial blocking structures 270, it is also possible to design channels with variable depth, thereby adjusting the channel cross-sectional area continuously without changing the relative density of microchannels 220.

Figures 30A, 30B:
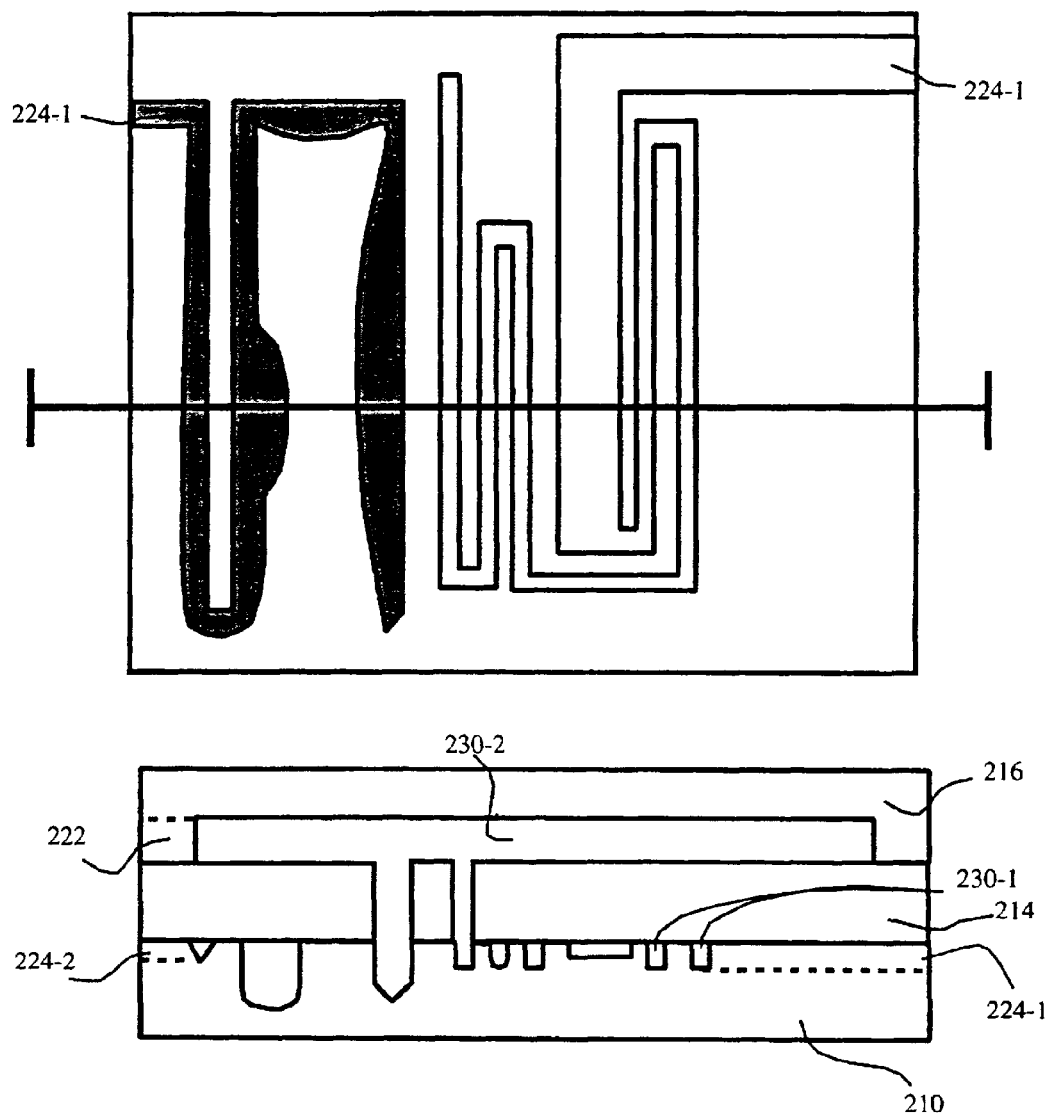
FIGS. 30A and 30B illustrates top and cross sectional views of another embodiment of a microchannel structure containing multiple cooling layers.

In addition to geometries for microheat exchangers 220 based on substantially planar microchannels as previously discussed, fluid distribution that assists in heat transfer from the device 50 can occur from further cooling layers 230-$n$ such as shown in FIGS. 30A and 30B that exists along with the cooling layer 230 such as previously described in FIG. 3B. FIGS. 30A and 30B show a possible microheat exchanger geometry that includes two cooling layers 230 and 230-2 of fluid, with the top view of FIG. 30A taken along the upper portion of the layer 210. An upper layer 216 is formed over the layers 210 and 214 previously described in order to form the second cooling layer 230-2 (although any number of layers 210, 214 and 216 can be used to obtain a varied number of cooling layers 230). In this embodiment, the upper cooling layer 230-2 is for distribution of cool fluid to a number of locations throughout the micro heat exchanger 200 from the fluid inlet 222, and the lower cooling layer 230 is for spreading the fluid and passing the fluid to the fluid outlets, shown as 224-1 and 224-2. An advantage of this embodiment is that cool cooling fluid can be inserted into any location on the bottom cooling layer 230, and the flowrates of the fluid through each channel 220 can be determined by the cross-sectional dimensions of the lateral and vertical channels.

Figure 31:
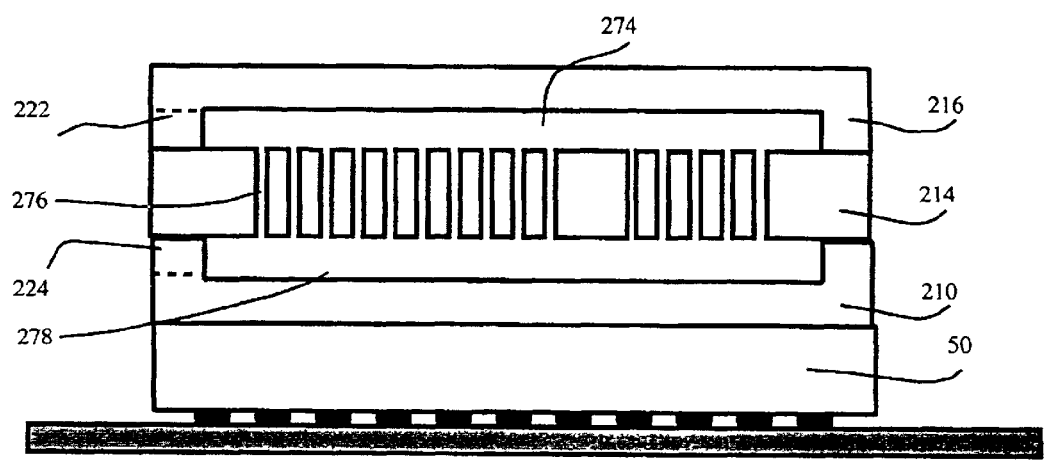
FIGS. 31 and 32 illustrate embodiments of microchannels using multiple fluid injection points between two chambers.

One particularly interesting embodiment for distribution of cooling fluid is illustrated in FIG. 31, in which fluid enters at a fluid inlet 222 in the upper layer 216 of the microheat exchanger 200, and spreads evenly through a planar reservoir 274. A multitude of small holes 276 in the second layer 214 cause the formation of a distribution of fluid injection points, or jets, into a chamber 278 in the first layer 210 of the micro heat exchanger 200. The distribution of the cool fluid is determined by the size of the openings and the density of the openings in each region. The fluid then exits at a fluid outlet 224 in the first layer 210. In this embodiment, as with embodiments described above, the various layers 210, 214 and 216 are formed, attached together in some manner, and then attached to the device 50 with glue, conductive compound, solder, or direct bonding.

Figure 32:
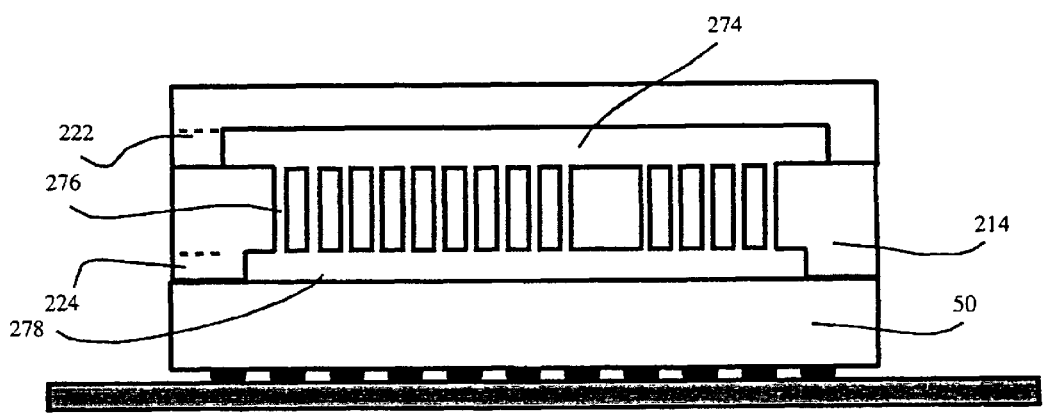
Figure 33:
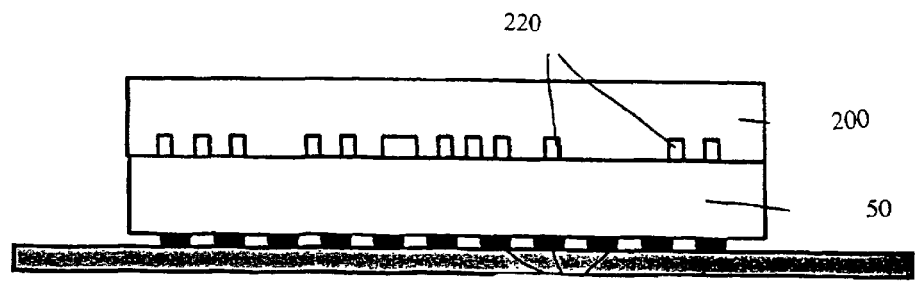
FIGS. 33–35 illustrate formation of microchannels in various layers.

FIG. 32 shows another embodiment of the micro heat exchanger 200 that is similar to the embodiment shown in FIG. 31, which eliminates the layer 210 and provides for direct fluid contact with the surface of the device 50. In this configuration, the layers 216 and 214 are formed and then bonded directly to the device 50, and the lower chamber 278 is formed at the interface between the device 50 and the microheat exchanger 200. FIG. 33 illustrates another embodiment of a micro heat exchanger 200 with a single cooling layer 230 that also provides for direct fluid contact with the surface of the device 50. FIG. 33 further illustrates an embodiment in which the device 50 is depicted as an electrical circuit with bump-bonds forming the electrical connection to a circuit board, as might be the case for a microprocessor. By allowing the fluids to come into direct contact with the device 50, this improves the thermal transport from the device 50 to the fluid because several barriers are removed, and can lead to optimal system performance. This approach is made complicated, however, because the physical attachment between the device 40 and the microheat exchanger 200 must now withstand fluids and pressure, and needs to leak-proof over the life of the device 50.

Depending on the pressure difference across the openings 276 in the layer 214, and the size of those openings 276, the fluid passing to the chamber 278 may form miniature jets, which would have several important advantages. Generally, the formation of the jets is governed by the Reynolds number of the flow. For jet orifices that are too large, the mass flow produced by the electroosmotic pump will result in too small of a velocity so that the orifice flow Reynolds number is too small to achieve a jet (characterized by separated flow at the orifice exit). For jet orifices that are too small, viscous stresses dissipate the pressure energy generated by the pump and again result in Reynolds numbers that are too small. There should therefore be an optimum jet orifice diameter to achieve relatively high Reynolds number (even if only laminar) jet flow. The formation of jets, or more preferably an array of jets, enhances the efficiency of the heat transfer of the fluid in the chamber 278 because of the increased velocity and presence of inertial flow instabilities in this chamber 278. In addition, the jets cause the fluid in this chamber 278 to be well-mixed, thereby helping even out any temperature gradients.

Figure 34:
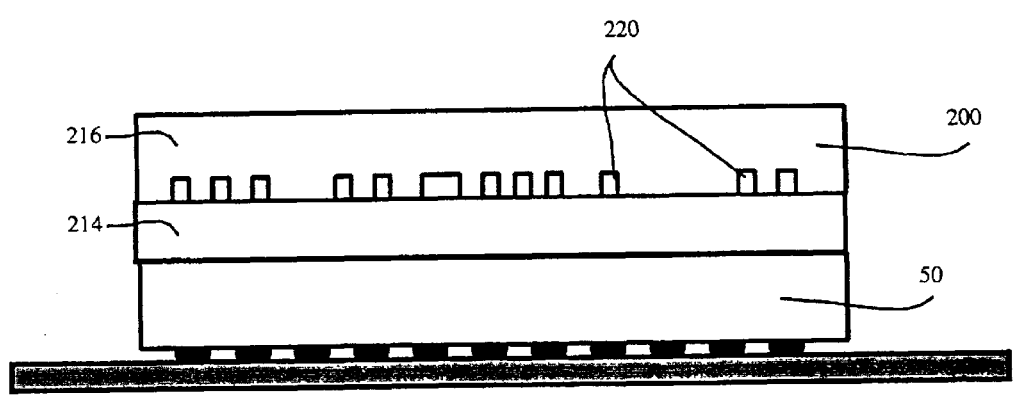
Figure 35:
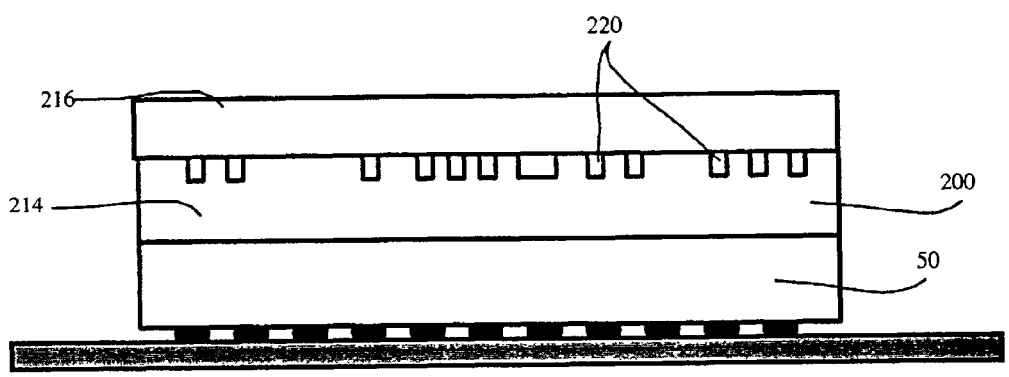

FIG. 3B illustrated previously, as well as FIGS. 34 and 35, illustrate various embodiments of a micro heat exchanger 200 in which the microchannel 220 is prepared as a sealed structure, which sealed structure is then attached to the device 50 with a thermally-conductive compound. A particular advantage of this approach is that the microheat exchanger 200 can be prepared using high-temperature processes and chemicals that might destroy the device 50. After the fabrication of the heat exchanger 200 is complete, it is attached to the backside of the device 50 using processes and materials that do not damage the device 50. Of the various embodiments illustrated, those in FIGS. 3B and 35 are preferred to the embodiment in FIG. 34 since fluid is transferred directly to the layer of the heat exchanger 200 that is bonded to the device 50, and thus the heat from the device 50 has a shorter path to travel before being removed by fluid in the microchannels 220.

Figure 36:
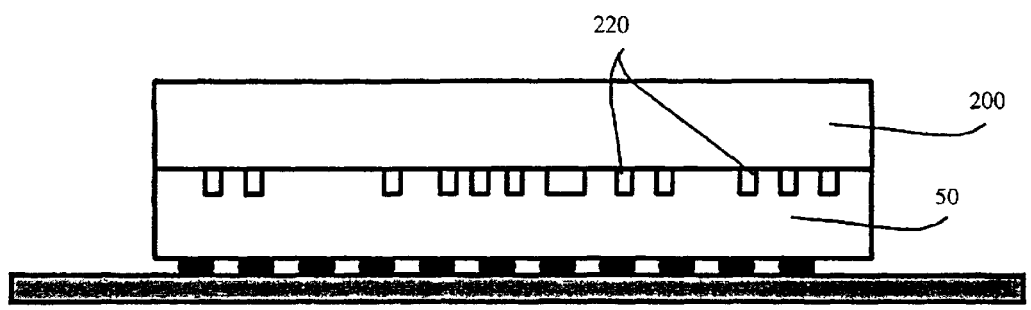
FIGS. 36–37 illustrate formation of microchannels at least partially in the device being cooled.
Figure 37:
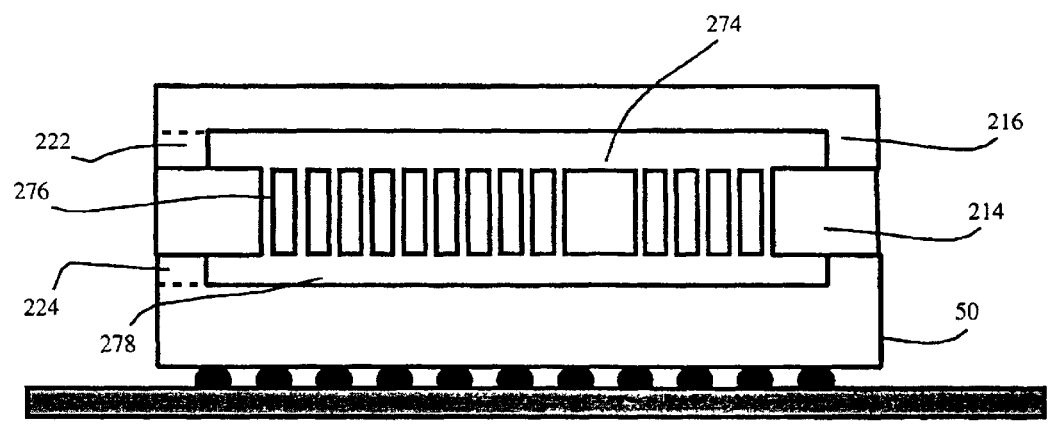

In addition to the embodiments described above that bring the fluids into contact with the device 50 surface, other embodiments of the micro heat exchanger 200 can use a geometric modification to the surface of the device 50 to obtain more surface area contact. FIG. 36 shows a microchannel design in which the channels 220 are formed in the backside of the device 50, and the remainder of the attached structure guides and distributed the fluids to these channels 220. FIG. 37 shows a jet array as described above with respect to FIG. 32 that is bonded to a device 50 in which the chamber 278 for the delivery of the jets is formed by etching into the backside of the device 50.

During operation of the cooling loop, it is possible that certain elements of the loop may begin to malfunction. For example, the pressure across the microheat exchanger 200 or macroheat exchanger 400 might begin to increase, indicating a build-up of deposited materials. The appropriate response to this condition is a wash-through, achieved by increasing the flow through the pump 300 for a brief period. The buildup of pressure throughout the loop might also indicate an accumulation of gas from electrolysis at the anode 314 or cathode 316 within the pump 300, and a possible brief failure of the gas recombination elements of the pump 300. One appropriate response to this condition is to reduce the pump operating current for some period of time, typically in the range of a few tens of seconds, or even to reverse the potential to the pump 300, for roughly the same period of time, to reverse the flow of gases. Another appropriate response to this condition is to heat the recombiner 326. In order to detect the above and other conditions indicating a malfunction or a potential malfunction, sensors of pressure, temperature, or current can be used to diagnose certain aspects of the condition of the cooling loop, or of specific elements of the cooling loop. These sensors may be implemented within the system in the manner described above with respect to the temperature sensors. Similarly, the controller 500 may be employed to detect these conditions.

Figure 38:
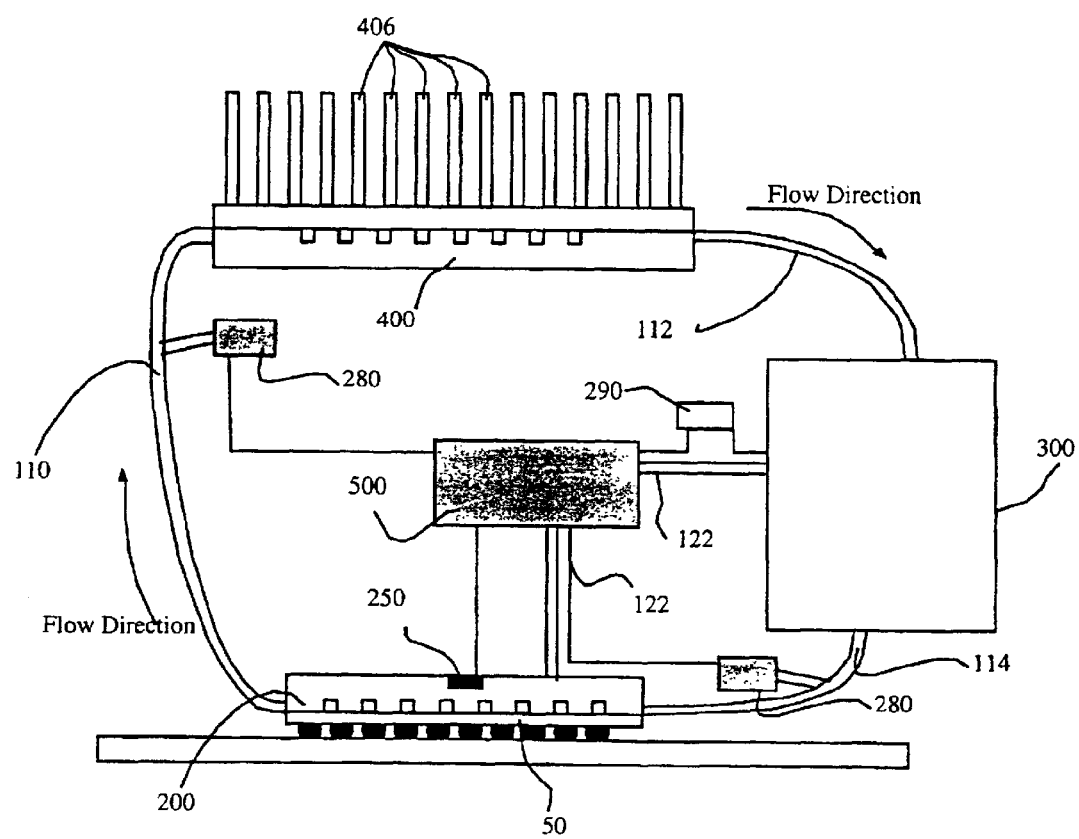
FIG. 38 illustrates an embodiment of a cooling system that uses pressure, current and temperature sensors.

FIG. 38 shows a drawing of the cooling loop wherein pressure sensors 280 that measure pressure and current sensors 290 that measure current, in addition to temperature sensors 250 as previously described, are placed in locations in the loop, and signals from these sensors are returned to the controller 500. The controller 500 will utilize these signals to diagnose the condition of the loop, and to apply corrective control signals as is appropriate.

It should also be noted that in the above descriptions, the controller 500 is illustrated for purposes of convenience as a distinct device in the system. There are also other possibilities where the functions of the controller 500 can take place, including the following.

Figure 39:
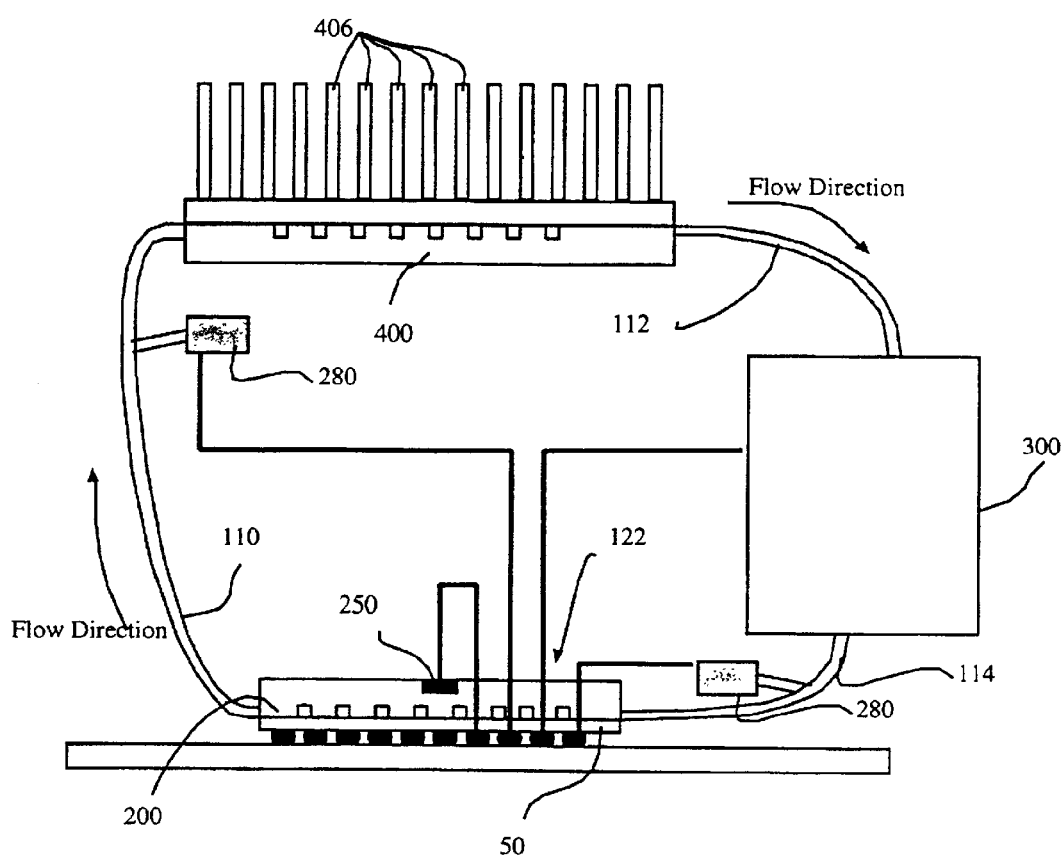
FIG. 39 illustrates an embodiment in which the temperature control system is part of the device being cooled.

As shown in FIG. 39, the present invention can utilize the capabilities of the device 50 to achieve this function. For example, if the device 50 is a microprocessor, the microprocessor can obtain signals from the temperature sensors 250 on the microheat exchanger, and other sensors 280 and 290 in the loop as input signals. The microprocessor can interpret these signals, and compute output signals necessary to regulate the temperature, execute the "wash-through" process, or respond to changes in pressure or current.

Figure 40:
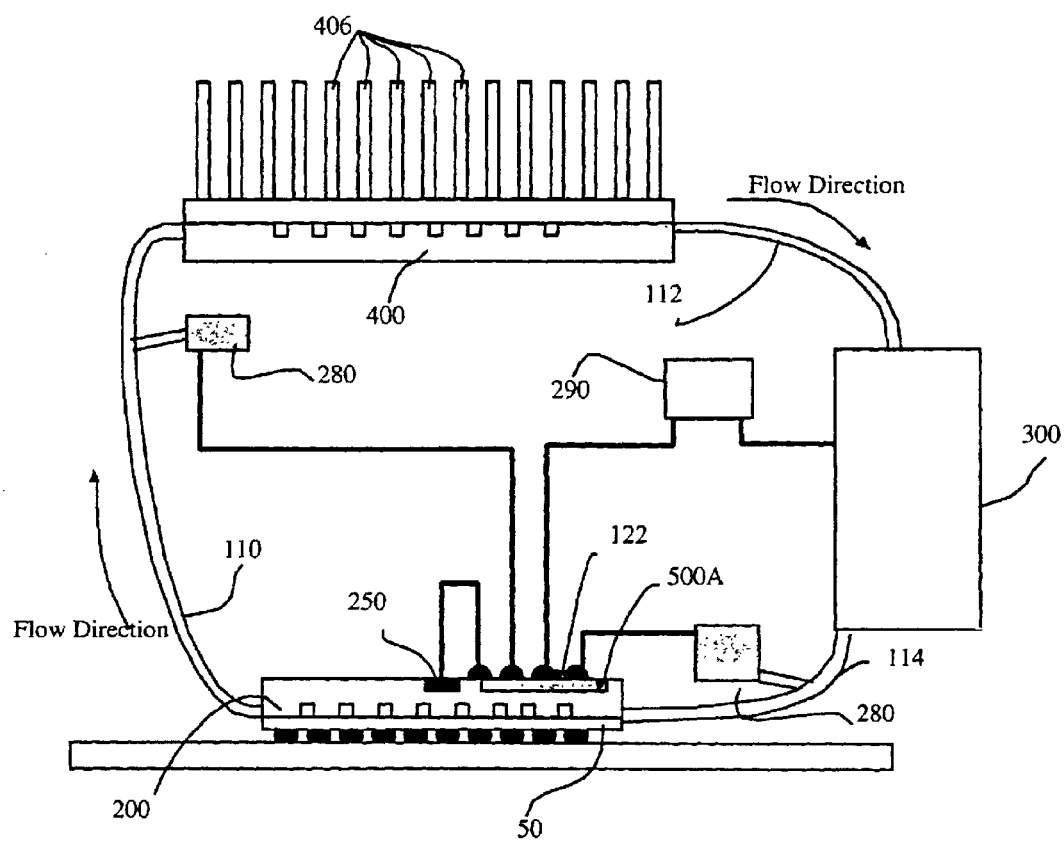
FIG. 40 illustrates an embodiment in which the microchannel structure and temperature control system are integrated.
Figure 41:
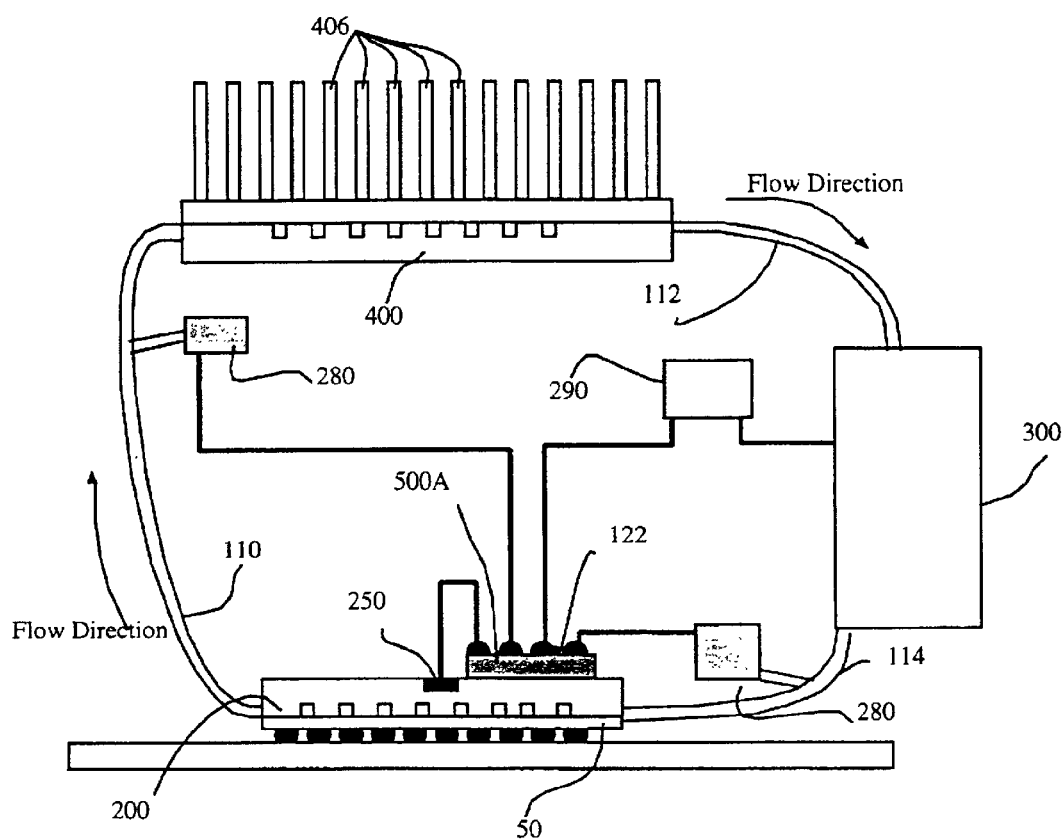
FIG. 41 illustrates an embodiment in which the temperature control system is attached to the microchannel structure.

As shown in FIG. 40, the present invention can integrate a microcontroller 500A, or other circuit device, into the microheat exchanger 200. Alternatively, the microcontroller 500A can be can be attached to the outside microheat exchanger 200 as shown in FIG. 41. In either case, the control function is handled by an integrated circuit that is considered a part of the microheat exchanger 200, which is constructed as a single unit.

Figure 42:
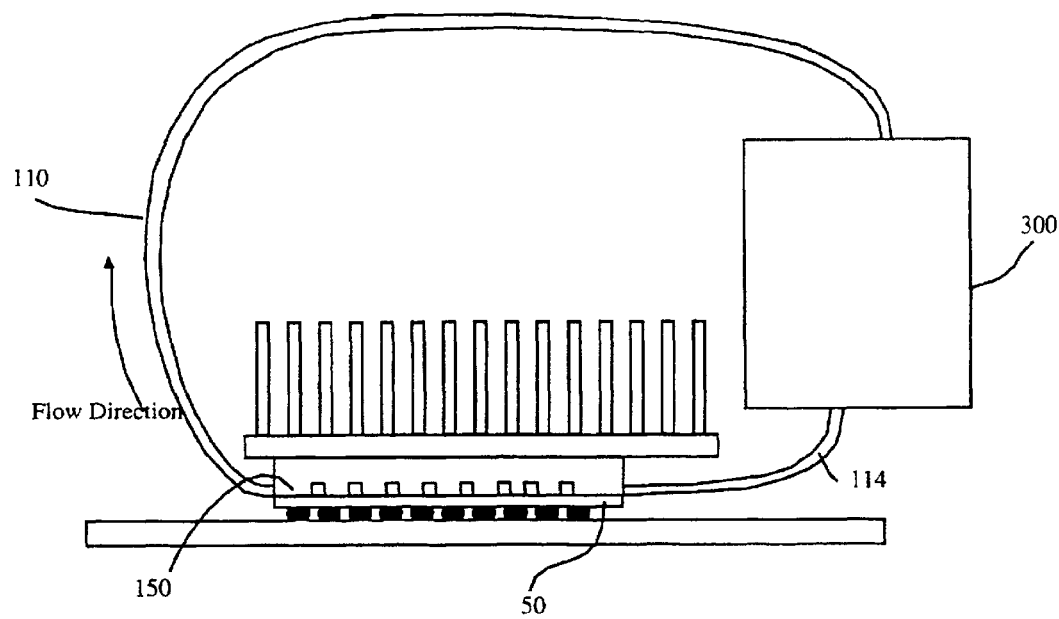
FIGS. 42 and 43 illustrate embodiments using a heat spreader.

Another embodiment of the invention uses the various components described above in what is conventionally known as a heat spreader. Rather than moving heat from one location to a distinctly separate location, the present invention can be used to pump fluid to efficiently spread heat from a localized source to a larger surface area, with an advantage being to overcome the finite thermal conductivity of a solid structure. In practical terms, rather than using both a microheat exchanger 200 and a macroheat exchanger 400 as described in previous embodiments, a single heat spreader 150, as illustrated in FIG. 42, is used to distribute heat generated by the device 50 over the larger area within the heat spreader 150. The heat spreader 150 contains components therein that perform the functions previously described as being performed by microheat exchanger 200 and a macroheat exchanger 400. The spreader 150 transmits this heat and efficiently distributes it to the surrounding air efficiently because of its very large surface area. As before, heat is carried from the localized heat generation on the device 50 by the moving fluid and efficiently spread over the entire volume of the heat spreader 150.

Figure 43:
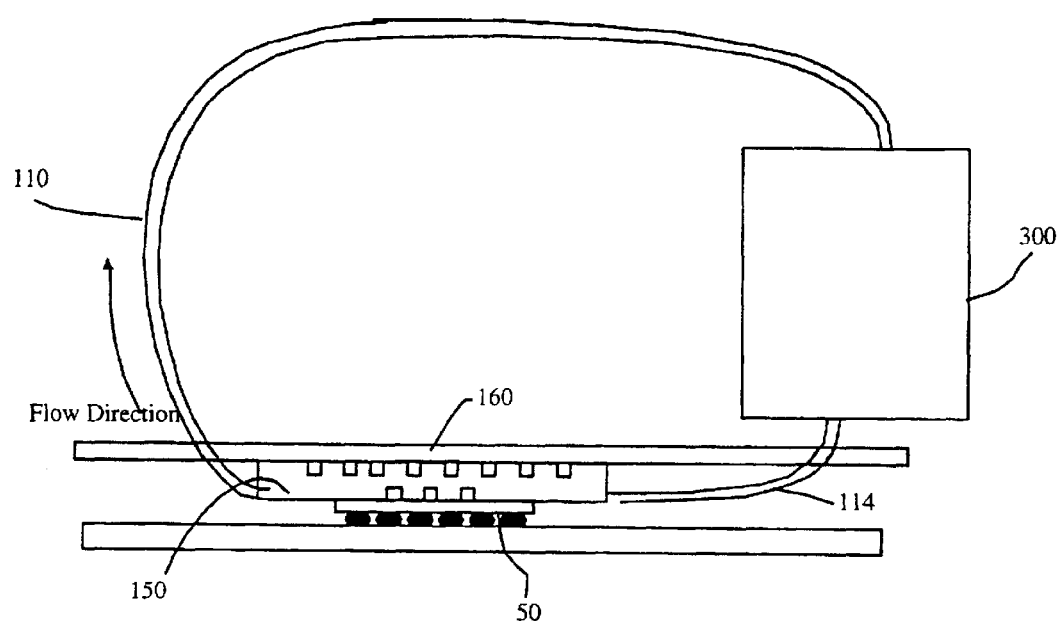

In addition to embodiments in which heat is transferred via a heat spreader 150 directly to a mounting structure. As shown in FIG. 43, the device 50 generates a small heat-volume, and is attached to a larger heat spreader 150. Fluids traverse the small surface area between the device 50 and the heat spreader 150, capturing the heat generated by the device 50. Then, the fluids traverse the interface 162 between the heat spreader 150 and the much larger mounting chassis 160. In this arrangement, the heat spreader 150 efficiently spreads heat for low thermal resistance connection to the chassis 160. This offers better thermal performance (lower thermal resistance) than can be achieved by attaching the device 50 directly to the chassis 160 because of the finite thermal conductance of the chassis material. The spreader 150 serves as a low thermal resistance structure that delivers the heat generated over a small surface area (on the device 50) to a larger surface area on the chassis 160. Variations of this embodiment might be used in any application where the chassis has enough surface area to spread the heat or access to other heat transfer mechanisms (such as wind, flowing water). Examples might include power electronic devices on vehicles, or concentrated heat sources distributed across large area devices.

System Heat Transfer Modeling and Optimization

Another useful aspect of this invention is the use of detailed computer modeling of heat transfer to simulate the heat rejection capabilities of a specific system design at a detailed level, and the use of this simulation capability to iterate the design details so as to maximize overall system performance. For example, it is possible to simulate the behavior of a real heat-generating device 50, including the spatial and temporal distribution of the heat generation within the device 50.

Thermal Design CAD

Overview of Thermal Design CAD Objectives

The present invention involves usage of a thermal design CAD tool that enables users to complete the layout of a microheat exchanger 200 that will achieve optimal thermal uniformity for the particular heat-generating device 50 of that user. This CAD tool includes modules for calculating pressure, velocity, heat transfer rates, and temperature variations for a given device heat generation profile and a give microchannel geometry. The building blocks of this system are described, and the functional description is then provided. The CAD tool plays a central role in optimizing microchannel geometries to improve the figures of merit of the resulting heat sink, specifically, to reduce temperature variations and reduce the average thermal resistance.

Heat Transfer Model

Detailed modeling of the heat transfer within the device 50 to the surface, through the interface to the heat rejection structure (micro heat exchanger 200), from this structure to the fluids passing through it, and then from these same fluids to the macro heat exchanger 400 and to the environment can all be carried out. These heat transfer characteristics are specific to the shape and arrangements of the channels within each structure, and depend on the pressure and flow generated by the EO pump 300. This complete system model allows the designer to introduce variations in the details of the system design, such as changes in the channel geometry (for example, arrangement, spacing, diameter, shape) and to compute the effect of these change on the system performance. Specifically, the calculations determine the overall thermal resistance from the device to ambient, spatial variations in the temperature of the device, and temporal variations in the temperature of the device.

The modeling is based on a computationally-simple, 1D approach. This 1D approach is highly advantageous because of its computational efficiency, in particular compared to more detailed multi-phase simulation approaches. The 1D approximate approach is therefore efficient for channel optimization, which requires many sequential computations of the performance of channels of multiple shapes and configurations. The simulation approach invented here numerically solves the energy equations for heat conduction in the micro heat exchanger solid wall (Silicon or metal) and for fluid advection, with boundary conditions dictated by heat loss to the environment surrounding the heat exchanger. Inlet and outlet conditions for the fluid are linked to the outlet state of fluid leaving the EO pump and the inlet of the heat rejector, respectively. The simulation uses the finite volume method and considers the temperature and pressure dependence of the liquid and vapor properties based on correlations to tabulated data for the working fluid.

Heat transfer into the fluid and pressure drop along the channel are determined using heat transfer coefficients and wall skin friction coefficients. These coefficients are either obtained from empirical fits to data or from exact solutions for two phase flow in channels. The simulation considers the spatially varying heat generation along the length of a given channel, and, when performed for multiple channels in parallel, considers lateral variations in heat flux as well. For any given channel, the simulation determines the device 50 temperature distribution as a function of the heat generation rate, channel shape, and fluid input flowrate and temperature. The simulation can model the effects of various cross-sectional shapes and paths. The simulation can be based either on the homogeneous or the separated flow assumptions The simulation numerically solves energy equations for heat conduction in the silicon wall and convection by the fluid, with boundary conditions dictated by the heat loss to the environment. The simulation uses the finite volume method and considers the temperature and pressure dependence of the liquid and vapor properties based on correlations to tabulated data. The simulation is one-dimensional in the direction along the channel and uses average local temperatures for the solid wall and the fluid, $T_w$ and $T_f$, respectively. The energy equations are:

$$\frac{d}{dz}\left(k_w A_w \frac{dT_w}{dz}\right) - \eta h_{conv} p(T_w - T_f) - \frac{w(T_w - T_\infty)}{R_{env}} + q''w = 0 \quad (1)$$

$$m^v \frac{di_f}{dz} - \eta h_{conv} p(T_w - T_f) = 0 \quad (2)$$

where where z is the coordinate along the channel, $A_w$ is the channel wall cross-sectional area, p is the perimeter of the channel cross section, and w is the pitch of one channel. The fin effectiveness, $\eta$, accounts for the temperature variation normal to the heat sink within the local channel walls. The thermal conductivity of silicon is $k_{w-1}$, $m^v$ is the mass flow rate, and $h_{conv}$ is the convection coefficient for heat transfer between the channel wall and the fluid. The fluid enthalpy per unit mass, $i_f$, for two-phase flow is expressed in terms of local fluid quality x, which is the mass fraction of the vapor phase, using:

$$i_f = (1-x)i_l + xi_v \quad (3)$$

where subscripts l and v represent for liquid and vapor phase in two-phase flow, respectively.

Equation (1) accounts for heat conduction along silicon wall in the first term, convection heat transfer rate in the second term, and the natural convection heat loss to the environment using the resistance $R_{env}$, in the third term. Radiation heat loss is neglected due to its very small magnitude. The fluid flow equation (2) relates the change of the average enthalpy density of the fluid against the heat transfer rate into the fluid from the channel walls.

Uniformity of temperature on the device 50 is critical for reliable performance of ICs. Regions of larger heat generation on a microprocessor chip device, for example, lead to higher local temperatures and lead to the onset of failure when the remainder of the chip is well below the threshold temperature for failure. Thus, the ability to achieve uniform chip temperature is an important qualification of any cooling solutions. Moreover, an advanced cooling solution should demonstrate its potential to solve temperature uniformity problems associated with hotspots within an actual chip, where local heat generation rates far exceed the average on the chip, possibly resulting in dramatic increases in local chip temperature.

Building Block: Flow/PressureModel

Two flow models are developed for the two-phase regime. A homogeneous flow model assumes that the liquid and vapor have the same velocity at every position z. The other approach is annular two-phase flow model, which assumes that a thin, slow-moving liquid film surrounds a rapidly moving core of vapor. The data of Stanley et al (R. S. Stanley, R. F. Barron, and T. A. Ameel, "Two-Phase Flow In Microchannels",DSC-Vol.62/HTD-Vol.3e MEMS, ASME (1997), pp. 143–152.). for heat flux and friction coefficient for two-phase flow along channels of comparable dimensions lend more support to the homogeneous flow model. The pressure distribution is governed by $$-\left(\frac{dP}{dz}\right) = \frac{fm''^2}{2\rho D} + \frac{d}{dz}\left(\frac{m''^2}{\rho}\right) \qquad (4)$$

for the homogeneous model and by $$-\left(\frac{dP}{dz}\right) = \frac{2\tau_i}{D/2-\delta} + \frac{m''^2}{\alpha}\frac{d}{dz}\left(\frac{x^2}{\alpha\rho_v}\right) \qquad (5)$$

for the annular model, respectively. The density of the liquid-vapor mixture is $\rho$, $\rho_v$ is the density of vapor phase, f is the globally averaged friction factor, and D is the channel hydraulic diameter. The mass flux m" is related to the mass flow rate m$^v$ by m"=m$^v$/A$_c$, where A$_c$ is the cross sectional area of the flow passage. The liquid film thickness is $\delta$, $\tau_l$ is the shear stress at liquid-vapor interface in annular flow model, and $\alpha$ void fraction, which is the ratio of the vapor flow cross-sectional area to the total flow cross-sectional area.

This detailed numerical modeling as described can be used to predict temperature distributions within microchannel heat exchange structures, and can be used within an iterative design process to optimize the performance of these microchannel designs to achieve particular system performance objectives.

Building Block: Coupling the Heat Transfer and the Flow/Pressure Models

Modeling enables optimization of channel positions, relative flowrates, local-cross-sectional shapes, and the controlled placement of extended surfaces within channels, all to achieve temperature uniformity. These modeling steps include:

1. Derivation of the discretization equations for the 1D heat conduction and convection problems in the longitudinal channel direction based on the fluid mixed mean temperature and the local wall temperature. The inputs to the set of discretization equations are the inlet flowrate and temperature, the channel shape and shape variation along the longitudinal coordinate through the substrate, and the local values of the heat flux applied to the channel wall along the substrate.
2. Determination of the mixed-mean fluidic (two phase) properties (viscosity, thermal conductivity, specific heat) based on the thermodynamic state (temperature, pressure, quality) and a library program referencing existing data.
3. Calculation of the heat transfer coefficient and the friction coefficient using one of two methods, 3.1 Separated flow model, in which the coefficients are determined analytically by solving the Navier-Stokes and energy equations, 3.2 Homogeneous flow model, in which the coefficients are determined using empirical fits provided in our research and in the literature.
4. Solution of the discretization equations using a strongly under-relaxed Gauss-Seidel technique. The calculation yields the wall temperature resulting from the inputs mentioned above.

Figure 52:
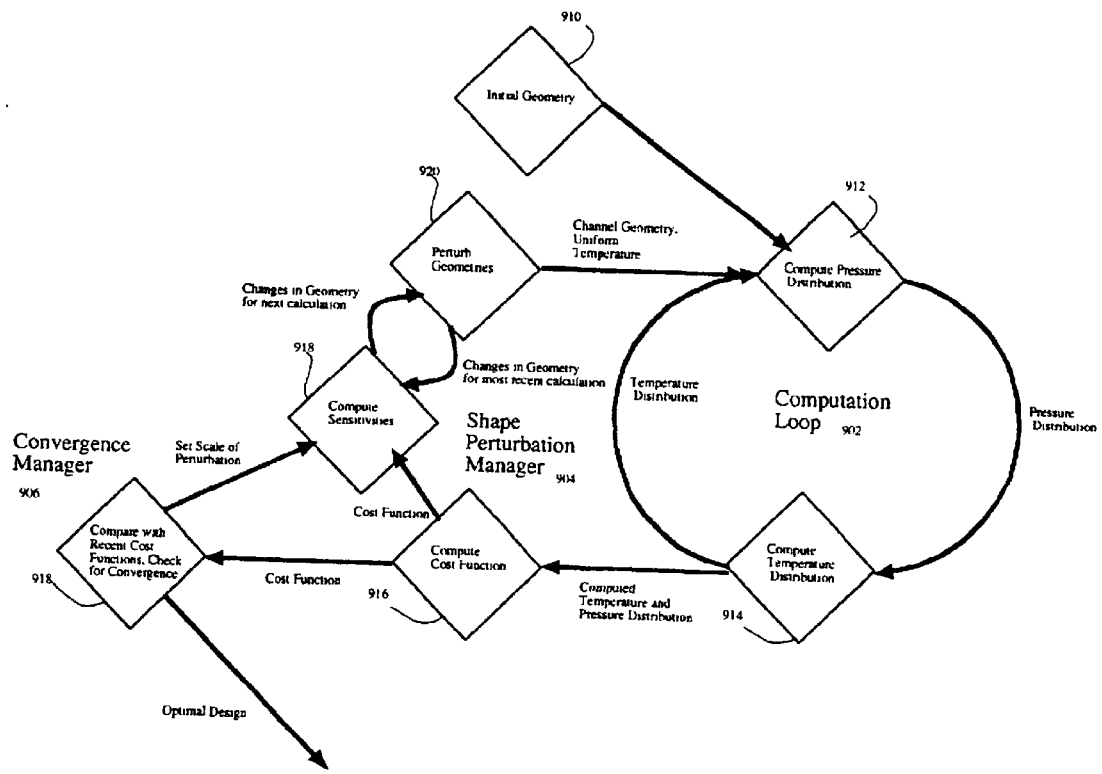
FIG. 52 illustrates a functional flowchart illustrating a modeling process for microchannels according to the present invention.

This modeling approach is illustrated schematically in FIG. 52. As shown in FIG. 52, the modeling process begins with a starting geometry, and a quantitative description of the spatial distribution of the heat input in block 910. According to steps 1–2 above, we determine the state of the fluid at each location in the microchannels, and compute the pressure distribution and flow velocities in block 912. According to steps 3–4 above, we compute the heat transfer coefficients, and determine the resulting wall temperature distribution, which is then related to the device temperature distribution in Block 914. Optimization involving the variation of the channel shape and its evolution along the length of the channel, the flowrate, and the inlet temperature, to minimize temperature variations considering variations in the applied heat flux is then carried out iteratively by successive perturbations to the geometry of the channels (Shape Perturbation Manager 904), tending towards an optimal design (Convergence Manager 906). The details and methods for achieving optimal performance are described in the following.

In particular, the pressure distribution within the heat exchanger governs the distribution of the saturation temperature of the two-phase mixture, which is then used to control the wall temperature considering a given heat flux. For example, the wall at the downstream end of the channel could be maintained at a lower temperature than the wall of the upstream end, even considering a dramatic increase in the heat flux at the downstream end. The variation of the saturation temperature would govern the wall temperature distribution in this case, rather than the local heat flux.

Two-phase microchannel cooling has demonstrated more efficiency and better chip temperature uniformity than single-phase liquid cooling, benefiting from the latent heat of the working fluid. However, both experimental data and simulations have shown that a peak in the temperature of the microheat exchanger appears spatially along the channel at a location immediately upstream from the onset of boiling. This temperature peak is associated in part with superheating of the microchannel wall and can result in a chip temperature difference of more than 200° C. Superheating can arise whenever ordinary nucleate boiling is prevented. The wall temperature peak is also associated with a reduction of the heat transfer coefficient in the vicinity of boiling onset, owing to the transition from purely liquid to two-phase flow.

In microchannels, nucleate boiling can be inhibited because of the absence of bubble nucleation sites, or because the microchannels are too small for detached bubbles to propagate along with liquid. For example, if the detached bubble sizes are as large as the channel diameter, the liquid flow can be blocked by a bubble, and the conversion from liquid to vapor can all take place at this interface. One unfortunate result of such a situation is a reduction of the heat transfer coefficient downstream in the channel, and a possibility for a very large temperature rise at the microchannel wall.

In the course of developing this invention, measurements to map the boiling regimes for microchannels have been made, and it has been determined what boiling regime is to be expected for water passing through a channel of a given diameter at a given velocity. For fluids moving through channels of diameters larger than 100 microns at velocities less than 1 m/s, it has been found that the boiling and heat transfer are completely described using a homogeneous flow assumption (liquid and vapor travel at the same velocity). Within this constraint, the heat transfer is described with reasonable accuracy by finite volume models utilizing Kandlikar's correlation to determine heat transfer from the microchannel walls to the fluid. Therefore, this may be used to provide accurate computations of the heat transfer from the walls to the fluid at any location in a microchannel.

The simulation by finite volume models utilizing Kandlikar's correlation addresses, as an example, the design of a microchannel heat exchanger targeting a heat removal of 200 W from a 20 mm×20 mm area. The water flowrate is 10–20 ml/min, which yields 0.5–0.25 mass quality at the exit of the heat sink (this is the fraction of the exiting fluid that is in the liquid state). For a given chip dimensions, the number of channels is determined by the requirement for constant channel wall thickness of 100 $\mu$m and by the microchannel width. In an optimal design, the width may vary from inlet to outlet so as to obtain advantageous performance. In the design now being described, water is used as the working fluid with an inlet temperature of 69° C., although it is understood that many variations on working fluids and their inlet temperatures exist.

Building Block: Exit Pressure Optimization

One parameter that can be adjusted is the exit pressure of the microheat exchanger, with the specific purpose of tailoring the chip temperature to the specifications required for reliability. If this pressure is the same as atmospheric pressure, the liquid-vapor transition in the absence of superheating is 100° C. However, this transition temperature may be reduced by causing, for example, the exit pressure of the microheat exchanger to be below atmospheric pressure. This approach may be practical in a closed loop, which is isolated from atmospheric conditions at every point. For many applications, there are advantages to reducing the transition temperature below 100° C.—for example, integrated circuits generally require peak operating temperature at the transistor to be below 125° C. Since there is some thermal resistance between the transistors and the heat exchanger, there will be a temperature rise from the heat exchanger to the transistor. The ratio between the temperature rise and the power being dissipated is called the thermal resistance. For a given thermal resistance, there will be a maximum power associated with transistor operation below 125° C. and microheat exchanger operation at 100° C. However, if the microheat exchanger can be operated at 75° C., twice as much power can be dissipated while keeping the transistors below 125° C. Therefore, the operation of fluid loops with sub-atmospheric pressure at the outlet of the microheat exchanger is a very useful method.

For example, we consider a cooling loop as shown in FIG. 1 with the pressure at the exit of the microheat exchanger set to be 0.3 bar; for this case, a liquid-vapor transition temperature within the microheat sink of about 70° C. will occur, leading to device operating temperatures as low or lower than 100° C., or to higher power dissipation for devices operating at higher temperatures.

Figures 44A, 44B:
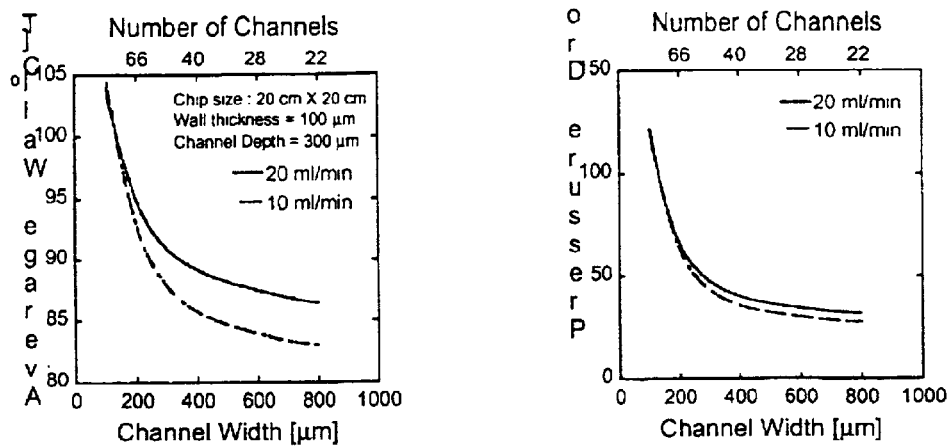
FIGS. 44A and 44B are charts illustrating the dependence of average device temperature and pressure drop on microchannel dimensions.

In order to achieve low exit pressure, it may be important to tailor the shape of the microchannels so as to avoid flow resistance that would lead to large pressure increases for fluid flow through the microheat exchanger. FIGS. 44A and 44B illustrate the dependence of average chip temperature and the pressure drop on channel dimensions for 2 different flow rates. The microchannels have constant cross-section through the entire channel length and a uniform heat generation of total 200 W is applied. As shown in FIGS. 44A and 44B, the wider channel has a lower average wall temperature due to the reduced pressure drop. These quantitative results may serve as design guidelines for microchannel system design.

Figure 45:
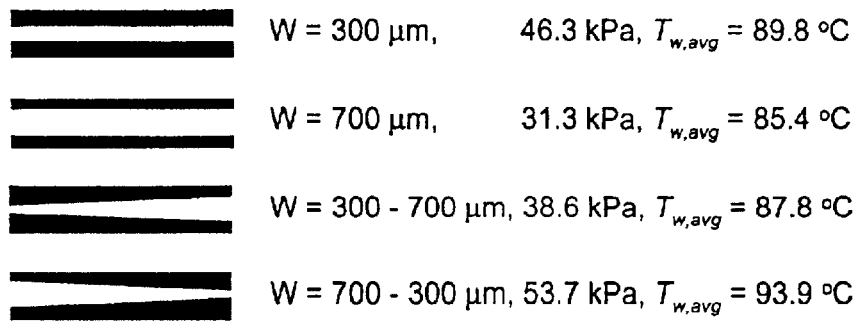
FIG. 45 illustrates the effect of various channel geometries on average wall temperature and pressure drop.

FIG. 45 shows comparison of the average chip temperature and the pressure drop for various channel cross-sectional geometry. It appears that neither diverging nor converging channel geometry provide better performance than the wider channel with constant cross-section. Channel geometries that minimize the flow resistance will result in reduced pressure drop along the channel and preserve the opportunity for operation at sub-atmospheric exit pressure.

These calculations of average temperature and pressure do not take into account the variation of heat transfer efficiency with channel geometry. It is generally expected that the heat transfer will be improved by designs which cause higher fluid velocity (such as narrow channel diameters), or by designs that increase the surface area of the channel that comes into contact with the fluid (such as by introducing fins or changing to longer, narrower channels). In general, these changes result in increased flow resistance, so there may be a conflict between the designs that achieve reduced exit pressure (and reduced operating temperature), and those that achieve improved heat transfer efficiency. Of course, an optimal design achieves a balance between the objectives of reducing the operating temperature of the microheat exchanger and reducing the thermal resistance between the fluid and the microheat exchanger. Optimization is typically achieved iteratively.

Building Block: Heat Distribution

Figure 46:
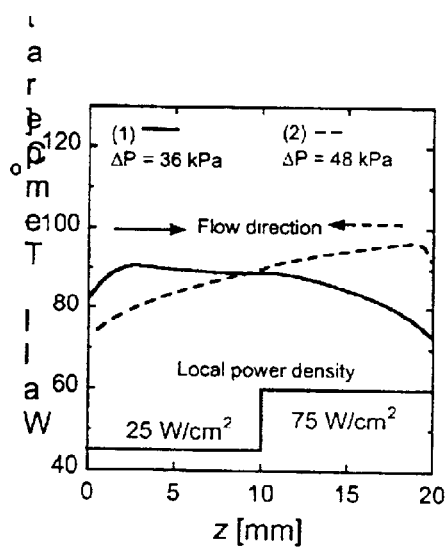
FIG. 46 illustrates the effect of nonuniform heat generation on temperature and pressure drop.

In addition to the issues raised by the effects of pressure and channel geometries, there are complications that arise if the heat generated by the device is not distributed uniformly. For example, microprocessors exhibit "hot-spots", where the power dissipation is concentrated. FIG. 46 shows the effect of a particular example of spatially-varying heating on the pressure drop and temperature field of the chip. For this example, the channel dimension is 300 $\mu$m×300 $\mu$m and the number of channels is 50. Water flowrate is 10 ml/min.

For case 1, 25% of total power is applied at upstream half of the channels and 75% is concentrated at upstream half for case 2. The highest wall temperature occurs near the inlet in each case due to the small convective heat transfer coefficient in the slowly-moving liquid phase region. For left-to-right flow, the increased fluid velocity (due to conversion of some fluid to vapor) leads to increased heat transfer efficiency just as the fluid is approaching the hot spot on the right half of the chip. For right-to-left flow, the low heat transfer coefficient at the inlet results in increased device temperature at the inlet, and more non-uniform temperature profile. Also, case (1) has a lower pressure drop, lower average chip temperature, and more uniform temperature field than case (2). An interesting result for case (1) is that the highest temperature is not located at higher heat flux region but near inlet, which is one of the powerful merits of the two-phase microchannel heat sinks. Accordingly, it may be important to control the locations of the single-phase region and the 2-phase region relative to the hot spots of the device, and the opportunity for increased uniformity that can be obtained with certain designs.

Using the CAD tool, iterations involving adjustment to the placement of the microchannels and the direction of the flow are typically carried out to move the design iteratively towards an optimal arrangement. From the above discussion, it is apparent that the shape and diameter of the microchannels, and the direction of the flow in the microchannels may have a dramatic effect on the temperature distribution in the device.

Figure 47:
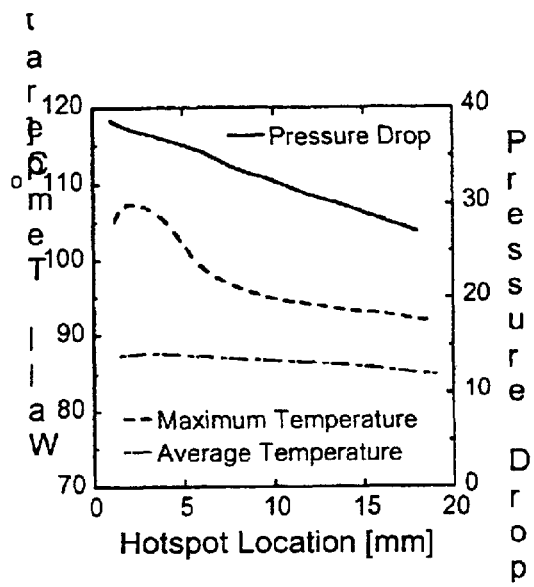
FIG. 47 illustrates the effect of hotspot location on temperature and pressure drop.

In FIG. 47, the effect of hotspot location is examined with the same geometric and flow configuration as FIG. 3 to show as an example the effect of hotspot location on temperature and pressure drop of a 200 W heat sink. The channel dimension is 700 $\mu$m (W)×300 $\mu$m (H) and the number of channels is 25. The liquid flow rate is 20 ml/min. The hotspot is 2 mm long and 40% of total heat is concentrated on this hotspot. In this simulation, the hotspot location is gradually moved from one end of the chip to the other end of the chip (relative to the microchannel). When the hotspot is located near inlet region, boiling is initiated earlier in the channel and the subsequent pressure drop along the channel causes the temperature to be substantially lower downstream from the hotspot. Moreover, liquid phase region near inlet has lower heat transfer coefficient than the two-phase region, which yields larger temperature difference between the wall and fluid. Thus, the maximum wall temperature has its peak and the heat sink has high temperature gradient near this region when the hotspot is almost overlapped with the onset of boiling point. As the hotspot moves further downstream, the maximum temperature decreases more rapidly than the average temperature. When the hotspot is located near inlet, the wall temperature has two peaks at the onset of boiling point and at the hotspot while the first peak has higher temperature.

Building Block: Fins

Figures 48A, 48B:
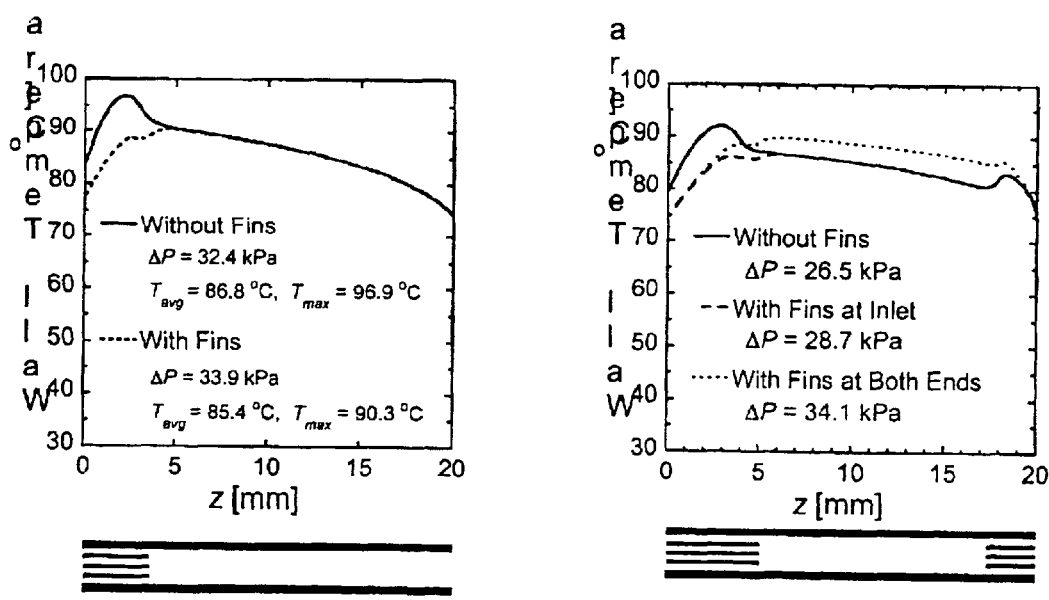
FIGS. 48A and 48B illustrate the effect of fins on wall temperature uniformity and pressure drop.

It is possible to further alter the distribution of the heat transfer in microchannels by increasing the surface area of the walls. Rather than reduce the channel diameter to achieve this effect, it may be possible to introduce additional "fins" into the channel, achieve higher thermal conductance into the fluid without dramatically increasing the pressure drop for a give flowrate. These additional fins increase the thermal contact with the fluid, and can significantly enhance the heat transfer efficiency in regions of the microchannel expected to be in the single-phase condition. For example, the microchannel inlet will almost always exhibit single-phase flow, and the previous discussion makes it clear that positioning of inlets near hotspots is undesirable because of the limited heat transfer efficiency in single-phase flow. However, this effect can be partially alleviated through the introduction of fins, which may improve the thermal conductance to the fluid in the vicinity of the hotspot. Furthermore, the temperature increase that occurs at the wall at the onset of boiling, associated with the reduction in the heat transfer coefficient, may be suppressed through the use of fins. This effect is shown in FIGS. 48A and 48B. These fins have low cross-sectional area, and therefore do not significantly increase flow resistance, particularly in the two-phase regime where the fluid is well mixed.

FIGS. 48A and 48B show the effect of an array of vertical fins located inside the channel on the chip temperature distribution. The results suggest making fins at the liquid phase region of the microchannel, i.e. channel inlet, reduces the peak temperature on chip and thus improves the temperature uniformity. The effort to have fins in two-phase regimes to increase the heat transfer rate gains little benefit because of the increased pressure drop associated with the placement of fins in the high-velocity flow region.

Building Block: Enhanced Nucleation Surfaces

Figure 49:
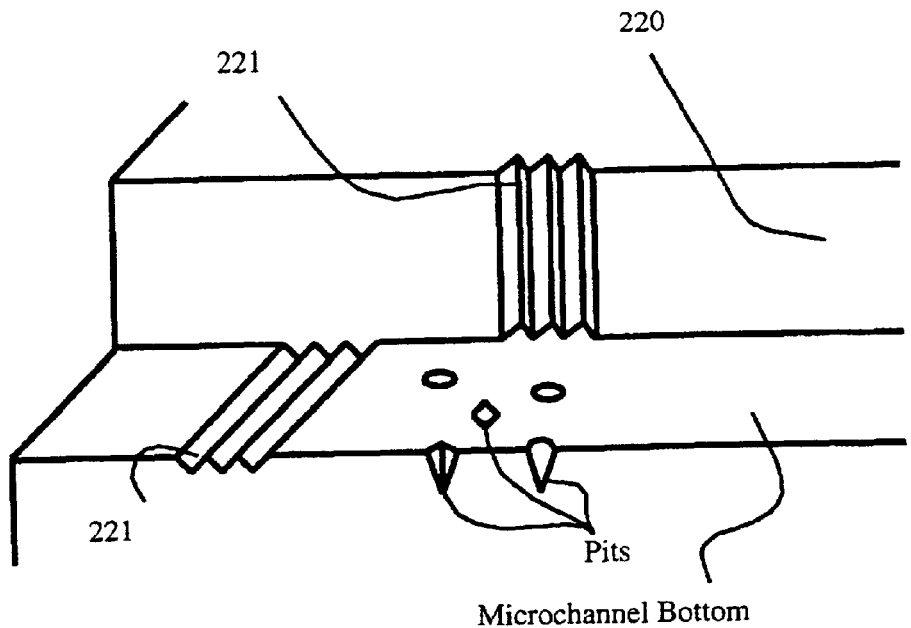
FIG. 49 illustrates an embodiment of a portion of a microchannel structure containing bubble nucleation sites.

Boiling is known to take place at solid-liquid interfaces, and may be enhanced by the presence of a defect at those surfaces that allows formation of bubbles. Generally these are cavity-shaped defects, as the bubble is easier to form if it is not required to generate a full spherical surface of liquid-vapor interface film. Very smooth surfaces exhibit superheating—meaning a suppression of boiling until temperatured well above the nominal transition temperature because of the energetic pemalty associated with bubble formation. It is known that roughened surfaces which include a high density of cavity defects generally allow boiling without superheating. In experiments, microchannels 220 have been deliberately roughened in specific locations 221 as shown in FIG. 49, and observed that bubble formation is localized to these regions. Therefore, local regions 221 in the channel with increased surface area, achieved using plasma etching or other roughening methods, can enhance and stabilize the boiling in the channel and reduce the superheating that occurs and degrades the heat exchanger performance. These regions with enhanced surface area 221 can be used to tailor the onset of boiling, such that it occurs at a specificed position and within a specified level of superheating in the channel 220, and can be designed to reduce the temperature maxima in the vicinity of hotspots. This allows adding of roughness at specific locations to cause the bubble nucleation to occur at these specific locations, thereby providing a method for controlling the spatial distribution of boiling within the microchannel.

Implementation of the CAD Tool

Based on the above, an integrated thermal design methodology used by the CAD tool will be described, which will consider the distribution of the power dissipation on the device, and adjust the position, shapes, and densities of the microchannels so as to achieve more optimal thermal uniformity for the device. Within this tool, various modules will compute pressure drops and phase transition temperatures, and compute heat transfer coefficients from the fluid to the microchannel walls, and compute the resulting temperature distribution across the device. The tool preferably uses a cost function based, for example, on the standard deviation of the temperature at specified points along the length of the channel and the absolute magnitude of the thermal resistance. The tool optimizes the free parameters, including fin placement, channel width and height, and the location of regions with increased nucleation surface, to maximize the quality function. The quality function may be calculated considering a nonuniform applied heat load, and thereby provide a more optimum design considering the nonuniformity.

FIG. 52 illustrates a flow chart of the operation of the optimal thermal design CAD tool 900. The FIG. 52 flow chart shows the sequence of computations and design modifications that are carried out in an iterative manner until a more optimal design is achieved. It should be noted that not all of the blocks need to be employed in the design process—certain processes may be eliminated and others added based on design criteria and considerations. The primary elements are the computation loop 902, the shape perturbation manager 904, and the overall convergence manager 906.

The computation loop 902 considers the heat distribution of the device as input information, and begins with a user-input channel geometry, shown at 910. The computation loop 902 determines the flow pattern through the device in the absence of heat input, computing the pressure along the channel and the heat-transfer coefficient at every location, shown at step 912. The heat input is then added to the simulation, and a computation of the temperature distribution is carried out using the starting values of the heat transfer coefficient throughout the system, shown at step 914. Then, the temperature distribution is used to compute changes in the pressure distribution due to thermally-induced changes in viscosity, and the locations of the beginning of liquid-vapor phase transitions, and other phenomena that will have an effect on the flow-induced pressure drop, illustrated as repeating of step 912. This improved pressure distribution is then used to recompute the heat transfer coefficients, the locations of phase transitions (because the transition temperature is a function of pressure), and the overall temperature distribution of the system. This loop iterates between temperature and pressure computation until the complete solution is stable. The output of this computation loop is a final prediction of the pressure and temperature distribution for a given heat profile and microchannel geometry.

The shape perturbation manager 904 computes a "Cost Function" associated with the result of the computed thermal distribution, as shown at step 916. This cost function is preferably a scalar parameter that will reach a minimum value when the thermal uniformity of the system is optimized. The shape perturbation manager also parameterizes the microchannel geometry, shown at step 918 as "compute sensitivities" and introduces small perturbations in the dimensions and locations of the channels, shown at step 920, and re-inserts the new design into the computation loop. After completion of the computation loop with the new geometry, the cost function is recomputed at step 916, and the relationships between the cost function and the shape perturbations is determined. As a simple example, consider the case where a channel geometry is modified by increasing the channel width in one section of the system. The dependence of the cost function on this parameter will be taken as the difference between the two values of the cost function divided by the fractional change in channel width. In reality, a more sophisticated shape optimization algorithm is preferably implemented—one that is capable of simultaneously determining the sensitivity of the cost function to several parameter changes. Shape optimization algorithms are widely used for many applications, and existing approaches can easily be adapted for this application.

The convergence manager 906 monitors the variation in the cost function with changes in the parameters of the design, and formally guarantees that the design is updated in a way that provides convergence on a "local optimum" and also makes large enough changes in the design to provide assurance that the design has a high chance of being a global optimum. As the iterative design being altered by the perturbation loop converges on a global optimum, the convergence manager tests for global optimum (by testing the result of large perturbations in the design parameters), and by monitoring the convergence of the cost function by tracking the reduced sensitivity of the cost function to perturbations, as shown at step 922. At the optimal design, slight perturbations in all parameters in all directions generally result in slightly increased values of the cost function. When the convergence manager determines that the design has converged to within some margin of the optimal design, the iteration is halted, and the final design is presented as output.

Although various preferred embodiments have been described in detail above, those skilled in the art will readily appreciate that many modifications of the exemplary embodiment are possible without materially departing from the novel teachings and advantages of this invention.

What is claimed is:

1. A cooling system for a heal emitting device, the cooling system operating using a fluid having a liquid phase, the cooling system comprising:
   a substrate including at least a portion of a microchannel disposed therein, the substrate adapted to physically connect to the heat emitting device, thereby providing for the transfer of thermal energy from the beat emitting device to the substrate, and the further transfer of thermal energy from the substrate to the fluid disposed within the microchannel, the microchannel configured to provide flow of the fluid therethrough;
   a heat exchanger configured to provide flow of the fluid therethrough and the transfer of thermal energy out of the fluid;
   a high flow rate electroosmotic pump, the electroosmotic pump creating the flow of the fluid; and
   wherein the substrate, the heat exchanger, and the electroosmotic pump are configured to operate together to create a closed loop fluid flow.

2. The cooling system according to claim 1 wherein the high flow rate electroosmotic pump is disposed between the heat exchanger and the substrate such that the fluid is pumped into the microchannel of the substrate from the electroosmotic pump.

3. The cooling system according to claim 1 wherein the high flow rate electroosmotic pump is disposed between the heat exchanger and the substrate such that the fluid is pumped into the heat exchanger from the electroosmotic pump.

4. The cooling system according to claim 1 wherein the microchannel includes a plurality of parallel subchannels, each of the parallel subchannels sharing a common inlet portion and a common outlet portion.

5. The cooling system according to claim 4 further including a temperature sensor disposed in proximity to the plurality of parallel subchannels.

6. The cooling system according to claim 5 further including a temperature control circuit that receives as inputs signals from the temperature sensor.

7. The cooling system according to claim 1 wherein the substrate is comprised of first and second layers, and wherein at least a portion of the microchannel is formed within both the first and second layers.

8. The cooling system according to claim 1 wherein the substrate is comprised of a first layer and a second layer, the first layer being physically connected to the heat emitting device, and wherein at least a portion of the microchannel is formed within only the first layer.

9. The cooling system according to claim 1 wherein heat emitting device is comprised of a plurality of integrated circuits and the substrate is disposed between the plurality of integrated circuits.

10. The cooling system according to claim 9 wherein there is included at least three integrated circuits in the plurality of integrated circuits, and a second substrate is also disposed between the plurality of integrated circuits, such that each integrated circuit contains at least one surface to which one of the first and second substrates is physically connected.

11. The cooling system according to claim 1 wherein the electroosmotic is comprised of a plurality of layers.

12. The cooling system according to claim 1 wherein the substrate further includes a plurality of vertical electrical interconnects.

13. The cooling system according to claim 12 wherein the microchannel further includes vertical and horizontal fluid channels.

14. The cooling system according to claim 12 wherein the plurality of vertical interconnects provide a portion of an electrical connection that electrically connects a plurality of temperature sensors to a temperature control circuit.

15. The cooling system according to claim 1 wherein the substrate includes an opening through which another interaction is capable of impinging upon a portion of the heat emitting device.

16. The cooling system according to claim 15 wherein the another interaction is light.

17. The cooling system according to claim 15 wherein the another interaction is an electrical interaction.

18. The cooling system according to claim 17 wherein the another electrical interaction is an electrical connection to a surface of the device to which the substrate is physically connected, and which electrical connection does not pass through any portion of the substrate.

19. The cooling system according to claim 15 wherein the another interaction is one of pressure, sound, chemical, mechanical force, and an electromagnetic field.

20. The cooling system according to claim 15 wherein the opening is vertical column having enclosed sidewalls.

21. The cooling system according to claim 15 wherein the opening is created by a surface area of the substrate that contacts a corresponding surface area of the device being smaller than the corresponding surface area of the device.

22. The cooling system according to claim 1 wherein a portion of the microchannel includes:
an upper chamber;
a lower chamber; and
a plurality of subchannels disposed between the upper chamber and the lower chamber.

23. The cooling system according to claim 1 further including a pressure sensor.

24. The cooling system according to claim 23 wherein the pressure sensor is: disposed within the substrate.

25. The cooling system according to claim 23 wherein the pressure sensor is disposed in a fluid path between the substrate and the heat exchanger.

26. The cooling system according to claim 25 further including another pressure sensor disposed in the fluid path between the high flow rate electroosmotic pump and the substrate.

27. The cooling system according to claim 26 further including a temperature sensor disposed within the substrate.

28. The cooling system according to claim 27 further including a temperature control circuit that receives as inputs signals from the pressure sensor, the another pressure sensor and the temperature sensor.

29. The cooling system according to claim 28 wherein the temperature control circuit uses the signal from the pressure sensor, the another pressure sensor and the temperature sensor to control the high flow rate electroosmotic pump.

30. The cooling system according to claim 1 further including a temperature sensor disposed within the substrate.

31. The cooling system according to claim 30 further including a temperature control circuit that receives as inputs signals from the temperature sensor.

32. The cooling system according to claim 1 further including a temperature sensor disposed in the loop at a location other than within the substrate.

33. The cooling system according to claim 1 wherein the microchannel includes a portion containing a partial blocking structure to increase surface area contacting the fluid.

34. The cooling system according to claim 33 wherein the partial blocking structure is comprised of a roughened portion of a microchannel wall.

35. The cooling system according to claim 33 wherein the partial blocking structure is disposed within the microchannel.

36. A thermal transfer apparatus connected to a semiconductor heat emitting device, the thermal transfer apparatus operating using a fluid having a liquid phase comprising:
a substrate adapted to physically connect to the semiconductor heat emitting device;
first and second microchannel fluid inlets disposed in the substrate;
first and second microchannel fluid outlets disposed in the substrate; and
first and second microchannels connected between the respective first and second fluid inlets and the first and second fluid outlets, the first and second microchannels thereby providing independent fluid flow paths wherein each of the independent fluid flow paths are arranged to provide a different cooling capability to each region of the substrate in response to a requirement for cooling each region of the heat emitting device.

37. The apparatus according to claim 36, further including:
a heat exchanger configured to provide flow of the fluid therethrough and the transfer of thermal energy from the heat exchanger;
a high flow rate electroosmotic pump, the electroosmotic pump creating the flow of the fluid; and
at least one fluid connector configured so that the substrate, the heat exchanger and the electroosmotic pump operate together using one of an open-loop and a closed loop fluid flow.

38. The apparatus according to claim 37 further including a second a high flow rate electroosmotic pump, such that the first electroosmotic pump pumps the fluid through the first microchannel and the second electroosmotic pump pumps the fluid through the second microchannel.

39. The apparatus according to claim 37 further including first and second temperature sensors respectively located in proximity to the first and second microchannels, such that the first temperature sensor detects thermal energy generated by the heat emitting device in proximity to the first temperature sensor and the second temperature sensor detects thermal energy generated by the heat emitting device in proximity to the second temperature sensor.

40. The apparatus according to claim 39 further including a third temperature sensor.

41. The apparatus according to claim 40 wherein the third temperature sensor is disposed in a location that it detects thermal energy generated by the heat emitting device in proximity to the first and second temperature sensors.

42. The apparatus according to claim 40 wherein the third temperature sensor is disposed between the first and second microchannels.

43. The apparatus according to claim 40 wherein the third temperature sensor is disposed such that the first and second microchannels are disposed between the heat emitting device and the third temperature sensor.

44. The apparatus according to claim 39 further including a control circuit electrically connected to the first and second temperature sensors, the control circuit inputting signals from the first and second temperature sensors and providing a control signal for controlling the high flow rate electroosmotic pump.

45. The apparatus according to claim 44 further including a second high flow rate electroosmotic pump, such that the first electroosmotic pump pumps the fluid through the first microchannel and the second electroosmotic pump pumps the fluid through the second microchannel and wherein the control circuit controls the first and second electroosmotic pumps, the control circuit being capable of independently controlling the pumping of fluid through each of the first and second electroosmotic pumps.

46. The apparatus according to claim 37 further including:
first and second temperature sensors disposed within the substrate, such that the first temperature sensor detects thermal energy generated by the heat emitting device in proximity to the first temperature sensor and the second temperature sensor detects thermal energy generated by the heat emitting device in proximity to the second temperature sensor; and
a control circuit electrically connected to the first and second temperature sensors, the control circuit inputting signals from the first and second temperature sensors and providing a control signal for controlling the high flow rate electroosmotic pump.

47. The apparatus according to claim 46 wherein the control circuit operates to sense a predetermined condition.

48. The apparatus according to claim 47 wherein upon sensing the condition, the control circuit causes more fluid to be pumped through the high flow rate electroosmotic pump per unit time for a period of time.

49. The apparatus according to claim 47 wherein upon sensing the condition, the control circuit causes a reversal of the fluid flow for a period of time.

50. The apparatus according to claim 47 wherein the control circuit detects a change in temperature over a period of time and correspondingly adjusts the fluid flow within the high flow rate electroosmotic pump to compensate for the change in temperature.

51. The apparatus according to claim 36 further including first and second temperature sensors respectively located in proximity to the first and second microchannels, such that the first temperature sensor detects thermal energy generated by the heat emitting device in proximity to the first temperature sensor and the second temperature sensor detects thermal energy generated by the heat emitting device in proximity to the second temperature sensor.

52. The apparatus according to claim 51 further including a third temperature sensor.

53. The apparatus according to claim 52 wherein the third temperature sensor is disposed in a location that it detects thermal energy generated by the heat emitting device in proximity to the first and second temperature sensors.

54. The apparatus according to claim 52 wherein the third temperature sensor is disposed between the first and second microchannels.

55. The apparatus according to claim 52 wherein the third temperature sensor is disposed such that the first and second microchannels are disposed between the heat emitting device and the third temperature sensor.

56. The apparatus according to claim 51 further including a control circuit electrically connected to the first and second temperature sensors, the control circuit inputting signals from the first and second temperature sensors and located within substrate.

57. The apparatus according to claim 36, wherein the first and second microchannels each contain first and second microchannel portions that are disposed parallel and adjacent to one another such that fluid flow in the first microchannel occurs in a direction opposite the fluid flow in the second microchannel.

58. The apparatus according to claim 36 wherein the first microchannel is at least partially disposed over a high thermal energy location of the heat emitting device and the second microchannel is disposed over another portion of the heat emitting device different from the high thermal energy location.

59. The cooling system according to claim 36 wherein the substrate further includes a plurality of vertical electrical interconnects.

60. The cooling system according to claim 59 wherein the plurality of vertical interconnects provide a portion of an electrical connection that electrically connects a plurality of temperature sensors to a temperature control circuit.

61. The cooling system according to claim 36 wherein the substrate includes an opening through which another interaction is capable of impinging upon a portion of the heat emitting device.

62. The cooling system according to claim 61 wherein the another interaction is light.

63. The cooling system according to claim 61 wherein the another interaction is an electrical interaction.

64. The cooling system according to claim 63 wherein the another electrical interaction is an electrical connection to a surface of the device to which the substrate is physically connected, and which electrical connection does not pass through any portion of the substrate.

65. The cooling system according to claim to claim 61 wherein the another interaction is one of pressure, sound, chemical, mechanical force, and an electromagnetic field.

66. The cooling system according to claim 61 wherein the opening is a vertical column having enclosed sidewalls.

67. The cooling system according to claim 36 wherein a portion of at least one of the first and second microchannels includes:

an upper chamber;

a lower chamber; and a plurality of subchannels disposed between the upper chamber and the lower chamber.

68. A thermal transfer apparatus that operates using a fluid having a liquid phase comprising:

a semiconductor heat emitting device, the semiconductor heat emitting device including a thermal control circuit;

a substrate adapted to physically connect to the semiconductor heat emitting device;

first and second microchannel fluid inlets disposed in either the substrate or the semiconductor heat emitting device;

first and second microchannel fluid outlets disposed in either the substrate or the semiconductor heat emitting device;

first and second microchannels disposed in either the substrate or the semiconductor heat emitting device connected between the respective first and second microchannel fluid inlets and the first and second fluid microchannel outlets, the first and second microchannels thereby providing independent fluid flow paths; and first and second temperature sensors disposed within the substrate and electrically connected to the thermal control circuit so that the signals from the first and second temperature sensors are input to the control circuit.

69. A method of placing a microchannel in a substrate so that the microchannel can transfer fluid having a liquid phase therethrough and dissipate thermal energy in a particular integrated circuit chip comprising the steps of:

selecting the particular integrated circuit chip;

using a computer, predicting locations and cross sectional shapes of the microchannel in the substrate that will sufficiently dissipate thermal energy with the fluid flowing therethrough, the step of predicting locations and cross sectional shapes of the microchannel including the step of iteratively computing fluid and solid temperature and pressure distributions for iteratively determined potential locations and potential cross sectional shapes of the microchannel in the substrate; and creating the microchannel at the predicted microchannel locations with the predicted cross sectional shapes in the substrate.

70. The method according to claim 69 wherein the step of iteratively computing fluid and solid temperature distributions uses empirical convection and fluid drag coefficients.

71. The method according to claim 69 wherein the step of iteratively computing fluid and solid temperature distributions uses non-empirical solutions to energy and momentum equations in the microchannel.

72. The method according to claim 69 wherein the step of iteratively computing fluid and solid temperature distributions uses empirical correlations for temperature and pressure that are dependent upon liquid and vapor properties of the fluid in the microchannel.

73. The method according to claim 69 wherein the step of predicting considers:
   conduction in walls at potential locations and for potential cross sectional shapes of the microchannel; and
   convection in the fluid;
   when computing the temperature and pressure distribution.

74. An apparatus for use with a cooling system operating using a fluid having a liquid phase, the apparatus comprising:
   a heat emitting device, the heat emitting device including a heat emitting element, a high flow rate electroosmotic pump, the electroosmotic pump creating the flow of the fluid; and
   a substrate physically connected to the heat emitting device, with the heat emitting device and the substrate each containing at least a portion of a microchannel, thereby providing for the transfer of thermal energy from the heat emitting device to the substrate, and the further transfer of thermal energy to the fluid disposed within the microchannel, the microchannel configured to provide flow of the fluid therethrough.

75. The apparatus according to claim 74, further including:
   a heat exchanger configured to provide flow of the fluid therethrough and the transfer of thermal energy out of the fluid; and
   wherein the substrate, the heat exchanger, and the electroosmotic pump are configured to operate together to create one of a closed loop fluid flow and an open loop fluid flow.

76. The cooling system according to claim 74 wherein the substrate further includes a plurality of vertical electrical interconnects.

77. The cooling system according to claim 76 wherein the plurality of vertical interconnects provide a portion of an electrical connection that electrically connects a plurality of temperature sensors to a temperature control circuit.

78. The apparatus according to claim 77 wherein the temperature control circuit is part of the heat emitting device.

79. The cooling system according to claim 74 wherein the substrate includes an opening through which another interaction is capable of impinging upon a portion of the heat emitting device.

80. The cooling system according to claim 79 wherein the another interaction is light.

81. The cooling system according to claim 79 wherein the another interaction is an electrical interaction.

82. The cooling system according to claim 81 wherein the another electrical interaction is an electrical connection to a surface of the device to which the substrate is physically connected, and which electrical connection does not pass though any portion of the substrate.

83. The cooling system according to claim 79 wherein the another interaction is one of pressure, sound, chemical, mechanical force, and an electromagnetic field.

84. The system according to claim 79 wherein the opening is a vertical column having enclosed sidewalls.

85. The cooling system according to claim 74 wherein a portion of the microchannel includes:
   an upper chamber;
   a lower chamber; and
   a plurality of subchannels disposed between the upper chamber and the lower chamber.

86. A cooling system for a heat emitting device, the cooling system operating using a fluid having a liquid phase, the cooling system comprising:
   a substrate including at least a portion of a microchannel disposed therein, the substrate adapted to physically connect to the heat emitting device, thereby providing for the transfer of thermal energy from the heat emitting device to the substrate, and the further transfer of thermal energy from the substrate to the fluid disposed within the microchannel, the microchannel configured to provide flow of the fluid therethrough;
   a heat exchanger configured to provide flow of the fluid therethrough and the transfer of thermal energy from the heat exchanger;
   a high flow rate electroosmotic pump, the electroosmotic pump creating the flow of the fluid; and
   wherein the substrate, the heat exchanger, and the electroosmotic pump are configured to operate together using an open loop fluid flow.

87. A method for providing for heat transfer away from a heat emitting device comprising:
   wing en a high flow rate electroosmotic pump to create a flow of a fluid having a liquid phase;
   directing the fluid flow to puss through a microchannel in a substrate with the substrate physically connected to the heat emitting device to thereby create a heated fluid; and
   further directing the heated fluid to pass through a heat exchanger to thereby create a cooled fluid; and
   causing the steps of using, directing and further directing to operate to create a closed loop fluid flow.

88. The method according to claim 87 wherein the step of directing directs the flow of fluid from the high flow rate electroosmotic pump into the microchannel of the substrate.

89. The method according to claim 87 wherein the step of directing directs the flow of fluid from the high flow rate electroosmotic pump into the heat exchanger.

* * * * *